United States Patent
Shukuri et al.

(10) Patent No.: US 6,628,549 B2
(45) Date of Patent: Sep. 30, 2003

(54) SEMICONDUCTOR DEVICE

(75) Inventors: Shoji Shukuri, Koganei (JP); Kazumasa Yanagisawa, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/230,314

(22) Filed: Aug. 29, 2002

(65) Prior Publication Data

US 2002/0191445 A1 Dec. 19, 2002

Related U.S. Application Data

(62) Division of application No. 09/801,769, filed on Mar. 9, 2001, now Pat. No. 6,466,482.

(30) Foreign Application Priority Data

Mar. 9, 2000 (JP) .................................. 2000-071079

(51) Int. Cl.$^7$ .................................................. G11C 7/00
(52) U.S. Cl. ........................... 365/185.24; 365/185.26; 365/185.14; 365/185.05
(58) Field of Search ................... 365/185.24, 185.26, 365/185.01, 185.14, 185.05

(56) References Cited

U.S. PATENT DOCUMENTS

| | | | | |
|---|---|---|---|---|
| 5,101,378 A | * | 3/1992 | Radjy et al. | 365/185.02 |
| 5,764,569 A | | 6/1998 | Wright | 365/185.09 |
| 5,765,569 A | * | 6/1998 | Kemanjian | 131/248 |
| 5,905,675 A | * | 5/1999 | Madurawe et al. | 365/185.18 |
| 6,166,954 A | * | 12/2000 | Chern | 365/185.14 |
| 6,187,634 B1 | * | 2/2001 | McElheny et al. | 438/263 |
| 6,268,623 B1 | * | 7/2001 | Madurawe et al. | 257/318 |
| 6,314,017 B1 | * | 11/2001 | Emori et al. | 365/149 |

FOREIGN PATENT DOCUMENTS

| | | |
|---|---|---|
| JP | 1-263999 | 10/1989 |
| JP | 2-127478 | 5/1990 |
| JP | 4-129091 | 4/1992 |
| JP | 4-163797 | 6/1992 |
| JP | 4-74392 | 9/1992 |
| JP | 6-268180 | 9/1994 |
| JP | 02001257324 A | 9/2001 |

OTHER PUBLICATIONS

"A Single Poly Eeprom Cell Structure For Use in Standard CMOS Processes" by Ohsaki, et al. pp. 1994 vol. 29.

* cited by examiner

*Primary Examiner*—Viet Q. Nguyen
(74) *Attorney, Agent, or Firm*—Antonelli, Terry, Stout & Kraus, LLP

(57) ABSTRACT

A semiconductor integrated circuit includes non-volatile memory elements (PM1, PM2), each of which has a first source electrode, a first drain electrode, a floating gate electrode and a control gate electrode and is capable of having different threshold voltages, and read transistor elements (DM1, DM2), each of which has a second source electrode and a second drain electrode and is capable of having different mutual conductances according to the threshold voltage of the non-volatile memory element. The read transistor element has a switching state according to the electron injection state or the electron emission state, in other words, the writing state or the erasing state of the floating gate electrode. In a read operation, it is not necessary to cause a channel current to flow according to the threshold voltage of the non-volatile memory element.

15 Claims, 46 Drawing Sheets

CROSS SECTION TAKEN ON LINE A-A' IN FIG. 3

FIG. 5 CROSS SECTION TAKEN ON LINE B-B' IN FIG. 3

|  | PDL | PWL | RDL | RWL | Vss |
|---|---|---|---|---|---|
| WRITE | 5V | 5V | 0V | 0V | 0V |
| ERASE | 0V | 0V | 0V | 0V | 6V |
| READ | 0V | 0V | 1.8V | 1.8V | 0V |
| HOLD | 0V | 0V | 0V | 0V | 0V |

FIG. 10

|  | PDL | PWL | RDL | RWL | Vs | Vss |
|---|---|---|---|---|---|---|
| WRITE | 5V | 5V | 0V | 0V | 0V | 0V |
| ERASE | 0V | 0V | 0V | 0V | 6V | 0V |
| READ | 0V | 0V | 1.8V | 1.8V | 0V | 0V |
| HOLD | 0V | 0V | 0V | 0V | 0V | 0V |

35 BIT FUSE MODULE BLOCK DIAGRAM

FIG. 43

| | | rd | prg | set | d | cg | sl | pu | wl | n | rl | q |
|---|---|---|---|---|---|---|---|---|---|---|---|---|
| inh | "0" | x | 1.5 | 1.5 | ▨ | ▨ | ▨ | ▨ | ▨ | ▨ | ▨ | 0 |
| | "1" | 1.5 | x | | ▨ | ▨ | ▨ | ▨ | ▨ | ▨ | ▨ | 1.5 |
| data set | "0" | 0 | 0 | 0 | 0 | 0 | 0 | 0 | 0 | x | 0 | 0 |
| | "1" | | | | 1.5 | | | | | | | 1.5 |
| erase | "0" | 2 | 2 | 0 | x | 0 | 5 | 0 | 2 | 0 | 0 | 0 |
| | "1" | | | | | | | | 2 | −5→0 | | 0 |
| prog | "0" | 0 | 2 | 0 | x | 5 | 5 | 0 | 2 | 5 | 0 | 0 |
| | "1" | 2 | | | | | | | 0 | 5→0 | | 2 |
| read | "0" | 0 | 0 | 0 | x | 1.5 | 0 | 1.5 | 0 | 1.5 | 0 | 0 |
| | "1" | 1.5 | | | | | | | | | | 1.5 |
| (test) | "x" | 1.5 | 0 | 0 | x | ext | 0 | 1.5 | 0 | −3 | 1.5 | 1/0 |
| hold | "0" | 0 | 0 | 0 | x | 0 | 0 | 0 | 0 | x | 0 | 0 |
| | "1" | | | | | | | | | x | | 1.5 |

READ TIMING CHART IN ACTUAL USE

FUSE CONTROL WAVEFORM

FIG. 53 CROSS-SECTIONAL VIEW OF DRAM CELL

SEMICONDUCTOR DEVICE

This is a divisional of application Ser. No. 09/801,769, filed Mar. 9, 2001, now U.S. Pat. No. 6,466,482B2 the entire disclosure of which is hereby incorporated by reference.

BACKGROUND OF THE INVENTION

The present invention relates to a semiconductor integrated circuit (semiconductor device) including electrically erasable and programmable non-volatile memory elements; and, more particularly, the invention relates to a technology which can be effectively applied to, for example, a microcomputer or a memory LSI in which non-volatile memory elements, which are capable of being mounted without adding a new process to an existing CMOS process and are formed using a single layer poly flash technology, are used for a fault recovery and the like.

A single layer poly flash technology constituting the memory cell of a non-volatile memory by a single layer poly silicon gate is disclosed in Japanese Patent Laid-Open No. 334190/1994 (which corresponds to U.S. Pat. No. 5,465,231), U.S. Pat. No. 5,440,159, U.S. Pat. No. 5,504,706, Japanese Patent Laid-Open No. 212-471/1992 (which corresponds to U.S. Pat. Nos. 5,457,335, 5,767,544 and 6,064,606), and "A Single Poly EEPROM Cell Structure for Use in Standard CMOS Processes", IEEE Journal of Solid State Circuits, VOL. 29, NO., 3, March 1994, pp. 311–316. For example, in a non-volatile memory cell formed by a single layer poly flash technology disclosed in Japanese Patent Laid-Open No. 334190/1994, a first conductivity type MOS transistor is formed on a semiconductor substrate and a plate electrode is formed in a second conductivity type well via an insulating layer, wherein the gate electrode of the MOS transistor and the plate electrode are connected to each other and function as a floating gate, and wherein the second conductivity type well functions as a control gate.

In Japanese Patent Laid-Open No. 212471/1992, there is also disclosed a technology for utilizing an electrically programmable non-volatile memory (EPROM) as a recovery circuit of a read only memory (ROM). Further, it is described in this publication that a non-volatile memory element having a first layer gate structure can also be used as an electrically programmable and erasable non-volatile memory element, in which a write operation is performed by hot carriers and an erase operation is performed by a tunnel current produced by applying a high voltage to a source or a drain, or the write and erase operations are performed by the tunnel current.

On the other hand, a technology for differentially utilizing two non-volatile memory elements from the viewpoint of preventing a malfunction is disclosed in Japanese Patent Laid-Open No. 163797/1992, Japanese Patent Laid-Open No. 263999/1989, Japanese Patent Laid-open No. 74392/1992, Japanese Patent Laid-Open No. 127478/1990, Japanese Patent Laid-Open No. 129091/1992, Japanese Patent Laid-Open No. 268180/1994, and U.S. Pat. No. 5,029,131. In a differential type memory cell structure, one non-volatile memory element is set in a writing state and the other non-volatile memory element is set in an erasing state, and signals read out in parallel from both the non-volatile memory elements are differentially amplified and the logic value of memory information is judged according to which output of the non-volatile memory elements in the writing state or in the erasing state becomes either an input to an inversion side or a non-inversion side.

SUMMARY OF THE INVENTION

The present inventor has studied a differential type non-volatile memory cell structure and found the following points. That is, the present inventor has found that, even in the differential type non-volatile memory cell structure, there a problem in that the rate of occurrence of faulty reading caused by degradation in a charge holding characteristic is largely affected by a threshold voltage at the initial state where a floating gate has no charge, a threshold voltage in a writing state or in an erasing state, and the state of a word line electric potential when a read operation is performed. FIG. 49 and FIG. 50, which will be hereinafter described, are not drawings showing publicly known technologies, but are drawings made by the present inventor for the purpose of facilitating an understanding of the present invention.

FIG. 49 illustrates the threshold voltage distribution of a memory cell in the case where an initial threshold voltage (Vthi) is set at a relatively high value. For example, the initial threshold voltage (Vthi) is set at a value higher than the mean value of a low threshold voltage (VthL) in an erasing state and a high threshold voltage (VthH) in a writing state. The initial threshold voltage (Vthi) is a threshold voltage in a state of thermal equilibrium. A read word line electric potential (Vread) is set in the middle region between the low threshold voltage (VthL) and the initial threshold voltage (Vthi). In this case, the voltage difference between the high threshold voltage (VthH) and the initial threshold voltage (Vthi) is small, that is, the amount of accumulated charges is small, and the self-electric field intensity applied to a gate oxide film is also small. As a result, a decrease in the threshold voltage caused by the leak of charges from the floating gate, that is, data retention, resists occurring. On the other hand, an electric field in the direction in which electrons are injected into the floating gate is applied to the tunnel oxide film of the memory cell at the low threshold voltage (VthL) by the word line voltage, when the read operation is performed, to also generate weak hot electrons near a drain to thereby generate a charge gain, which increases the threshold voltage. Since this undesirable increase in the limit of the threshold voltage reaches the initial threshold voltage (Vthi), when the threshold voltage is higher than the read word electric potential (Vread), the data is inverted and can not be read out. Therefore, the fact that the characteristic shown in FIG. 49 is comparatively strong for the data retention, but is weak for the charge gain has been made clear by the present inventor.

In contrast to this, FIG. 50 illustrates the threshold voltage distribution of the memory cell in the case where the initial threshold voltage (Vthi) is set at a relatively low value. For example, the initial threshold voltage (Vthi) is set at a value lower than the mean value of the low threshold voltage (VthL) and the high threshold voltage (VthH). The read word line electric potential (Vread) is set in the middle region between the high threshold voltage (VthH) and the initial threshold voltage (Vthi). In this case, the voltage difference between the low threshold voltage (VthL) and the initial threshold voltage (Vthi) is small, and, hence, the charge gain caused by the word line voltage when the read operation is performed resists occurring on the other hand, since a memory cell having the high threshold voltage (VthH) has a large voltage difference with respect to the initial threshold voltage (Vthi), it has a large amount of accumulated charges and high self-electric field intensity applied to the gate oxide film. As a result, an undesirable decrease in the threshold voltage easily arises from the leak of charges from the floating gate. Since this undesirable decrease in the limit of the threshold voltage reaches the initial threshold voltage (Vthi), when the threshold voltage is lower than the read word line electric potential (Vread), the data is inverted and can not be read out. Since the characteristic shown in FIG. 50 is comparatively strong for the charge gain and the difference between the low threshold voltage (VthL) and the read word line electric potential (Vread) is large, the fact that it can produce a comparatively large read current, but is weak for the data retention has been found by the present inventor.

In this manner, the high threshold voltage (VthH) of the non-volatile memory element is caused to gradually approach the initial threshold voltage (Vthi) in the state of thermal equilibrium by the leak of charges (data retention) by the self-electric field applied to the gate oxide film, and the low threshold voltage (VthL) is caused to gradually approach the initial threshold voltage (Vthi) in the state of thermal equilibrium by the electric field in the direction of the charge gain by the word line voltage (Vread) when the read operation is performed, or by the drain current. It has been recognized by the present inventor that it is difficult to maintain a high reliability of continuous reading for a long time, such as more than 10 years, because of the degradation in characteristics of both the data retention and the charge gain, even if the differential type memory cell structure is employed.

One object of the present invention is to provide a semiconductor integrated circuit which is capable of improving the long-term data holding performance by memory cells employing non-volatile memory elements.

Another object of the present invention is to provide a semiconductor integrated circuit which is mounted with non-volatile memories and is capable of remarkably reducing the rate of occurrence of faulty reading without adding any absolutely new process to an ordinary logic circuit process, a general-purpose DRAM process, or the like.

Still another object of the present invention is to provide a technology utilizing a flash memory cell constituted by a single layer polysilicon gate as a recovery circuit of a memory module or a memory circuit formed in the a semiconductor device.

The above-mentioned and other objects and new features of the present invention will be clear from the description in the present specification and from the accompanying drawings.

A general outline of typical aspects and features of the inventions disclosed in this application will be described as follows.

The present invention employs a memory cell structure which can eliminate the need for causing a channel current to flow through a non-volatile memory element in a read operation and the need for applying a large word line voltage to thereby prevent a data inversion caused by a charge gain and the like.

(1) A semiconductor integrated circuit in accordance with the present invention has a non-volatile memory element, including a first source electrode, a first drain electrode, a floating gate electrode and a control gate electrode, and is capable of having different threshold voltages; and a read transistor element, including a second source electrode, a second drain electrode and the floating gate electrode as a gate electrode, and is capable of having different mutual conductances according to the threshold voltage of the non-volatile memory element, as a basic constitution which a memory cell or an information memory cell has. A signal generated according to the mutual conductance of the read transistor element is transmitted to transmission means.

The function of the read transistor element is not limited to the above first aspect in accordance with the present invention, but it can be also grasped by the second aspect that the read transistor element includes a second source electrode, a second drain electrode and the above-mentioned floating gate electrode as a gate electrode, and is capable of having different switching states according to the threshold voltage which the non-volatile memory element has, or by the third aspect that the read transistor element includes a second source electrode, a second drain electrode and the above-mentioned floating gate electrode as a gate electrode, and is capable of having different threshold voltages according to the threshold voltage which the non-volatile memory element has.

In the above description, assume that, for example, when one threshold voltage of the non-volatile memory cell is a relatively high threshold voltage (threshold voltage in a writing state where electrons are injected into the floating gate) and the other threshold voltage is a low threshold voltage (threshold voltage in an erasing state where electrons are emitted from the floating gate), the transistor element is cut off in the state of the high threshold voltage and is on in the state of the low threshold voltage (naturally, the transistor element may be in a reverse state depending on the conductivity type of the transistor element). The erasing state of the non-volatile memory cell can be accomplished, for example, by disposing the first drain electrode and the control gate electrode of the non-volatile memory element at 0 volt like the ground voltage of a circuit and the first source electrode of the non-volatile memory element at 6 volts, and by ejecting electrons from the floating gate electrode to the first source electrode by a tunnel current. The writing state can be accomplished, for example, by disposing the first drain electrode and the control gate electrode of the non-volatile memory element at 5 volts and the first source electrode of the non-volatile memory element at 0 volt like the ground voltage of the circuit and by injecting hot electrons generated in the first drain electrode into the floating gate electrode.

Since the floating gate electrode of the non-volatile memory element is the gate electrode of the above-mentioned read transistor element, the read transistor element is set in a switching state or a mutual conductance according to the electron injection state, or the electron ejection state, in other words, the writing state or the erasing state of the floating gate electrode. Therefore, even if a select level is not applied to the control gate electrode, a current according to the switching state or the mutual conductance can flow to the transmission means (transmission circuit). A circuit diagram based on this example is shown in FIG. 1. In this circuit, a select level is not applied to the control gate electrode and hence it is recommended that a depression type MIS transistor be employed as the above-mentioned read transistor element in the sense of ensuring an amount of signal necessary for the transmission means.

On the other hand, when an enhancement type MIS transistor is employed as the above-mentioned read transistor element, it is desirable in the sense of ensuring an amount of signal necessary for the transmission means that a select level be applied to the control gate electrode also in the read operation. A circuit form based on this example is shown in a memory section in FIG. 44. It should be understood that, in this form, the read transistor element has different threshold voltages according to the electron injection state or the electron ejection state, in other words, the writing state or the erasing state of the floating gate electrode.

As described above, in the read operation, it is not necessary for a channel current to flow according to the threshold voltage of the non-volatile memory element. Accordingly, in the read operation, the source electrode and the drain electrode of the non-volatile memory element may be disposed at 0 volt like the ground potential of the circuit. Therefore, weak hot electrons are not injected into the floating gate electrode from the first drain electrode. Here, if the control gate electrode is also disposed at the ground potential of the circuit, a tunnel current is not generated, either. Granting that a select level is applied to the control gate electrode, the tunnel current is not generated between the first drain electrode and the floating gate electrode. Although a weak tunnel current or the like might be generated between the second drain electrode of the read transistor element and the floating gate electrode, if the select level of the control gate electrode is low, it can be concluded that a problem is not substantially presented. Alternatively, in the case where a drain voltage is applied to the read transistor element via MIS transistors vertically staked, as shown in FIG. 44, the drain voltage itself is lowered, and, hence, it can be concluded that a problem is not substantially presented.

In this manner, a problem of data inversion caused by the charge gain is not presented in the read operation. This can improve the data holding performance and reduce the rate of faulty reading.

(2) A constitution may be adopted in which the non-volatile memory element includes a capacitor element, having a capacitor electrode on a first semiconductor region functioning as a control gate electrode via an insulating layer and a MIS transistor including a source electrode, a drain electrode and a gate electrode, which are formed on a second semiconductor region, wherein the capacitor electrode is connected to the gate electrode and functions as a floating gate electrode.

From another aspect of the present invention, the non-volatile memory element may be composed of a first conductivity type first well region formed on a semiconductor substrate; a second conductivity type second well region formed on the semiconductor substrate; a second conductivity type first source electrode region, which is formed on the first well region and is to be connected to a first signal line; a second conductivity type first drain electrode region, which is formed on the first well region and is to be connected to a second signal line; a first insulating film formed on the principal surface of the first well region at the position between the first source electrode region and the first drain electrode region; a second insulating film formed on the principal surface of the second well region; a floating gate electrode region formed on the first and second insulating films; and a control gate electrode region, which is formed on the second well region and is to be connected to a third signal line.

In any case, a semiconductor integrated circuit including non-volatile memory elements can be fabricated without adding any absolutely new process to an ordinary logic circuit process or a general-purpose DRAM process, such as a CMOS process, a single layer polysilicon gate process, or the like.

(3) In order to reduce the rate of faulty reading by further taking data retention measures with respect to an information memory cell to which measures have been taken against the charge gain by adopting a structure in which the non-volatile memory elements are paired with the read transistor elements, it is recommended to adopt the following constitution.

First, a pair of non-volatile memory elements, as described above, and a pair of read transistor elements, as described above, are provided and the floating gate electrode of one of the non-volatile memory elements is shared by one of the read transistor elements and the floating gate electrode of the other non-volatile memory element is shared by the other read transistor element, and the pair of read transistor elements are connected in series to the transmission means. With this constitution, both of the pair of non-volatile memory elements are programmed in the writing state or in the erasing state. When the pair of non-volatile memory elements are in the writing state, the pair of read transistor elements are off. Here, although the possibility that held charges will be made to leak from the non-volatile memory elements in the writing state for some reason is not zero in probability, even if the held charges leak from one non-volatile memory element, the series path of the read transistors is held cut off, and, hence, the probability that the held charges will leak from both of the pair of non-volatile memory elements is extremely low. This makes it possible to improve the data retention measures and to further reduce the rate of faulty reading.

An example of a circuit form based on this constitution is shown in FIG. 1, in which depression type MIS transistors are vertically stacked as read transistor elements, or the circuit shown in the memory cell section in FIG. 44 is an example in which enhancement type MIS transistors are arranged in series as read transistor elements.

Second, a pair of non-volatile memory elements, as described above, and a pair of read transistor elements, as described above are provided, and the floating gate electrode of one of the non-volatile memory elements is shared by one of the read transistor elements and the floating gate electrode of the other non-volatile memory element is shared by the other read transistor element, and the pair of read transistor elements are connected in parallel to the transmission means. Also in this constitution, in a manner similar to the above example, both of the pair of non-volatile memory elements are programmed into the writing state or into the erasing state. Since in this second example it is assumed that the conductivity type of the read transistor element is different from that of the above example, when the non-volatile memory elements are in the writing state, both of the pair of read transistor elements are on. Here, although the possibility that held charges will leak from the non-volatile memory elements in the writing state due to some cause is not zero in probability, even if the held charges leak from one non-volatile memory element, the parallel path of the read transistor elements is held on, and, hence, the probability that the held charges will leak from both of the pair of non-volatile memory elements is extremely low. This makes it possible to improve the data retention measures and to further reduce the rate of faulty reading.

(4) As a use of the non-volatile memory elements and the read transistor elements, it is thought that redundancy in their structures can be used for recovering faults of the semiconductor integrated circuit. Here, the semiconductor integrated circuit has a plurality of unit information cells, each of which is composed of a pair of non-volatile memory elements and a pair of read transistor elements, and an electric program circuit to the non-volatile memory elements of the plurality of unit information cells, wherein the plurality of unit information cells form the memory circuit for recovery information with respect to a circuit to be recovered. This can improve the reliability of fault recovery.

A fuse program circuit for memorizing recovery information according to the melting state of a fuse element may be provided as another recovery information memory circuit for the circuit to be recovered. It is possible to improve the rate of recovery, in other words, the yield of the semiconductor integrated circuit, by recovering faults detected in the step of a wafer by means of a fuse program circuit and by using the above-mentioned electric program circuit for faults detected after a burn-in test. It is not possible to recover the faults after the burn-in test only by use of the fuse program circuit only the use of the electric program circuit increases the scale of the circuit or the area of the chip as compared with the case where the fuse program circuit is also used with the electric circuit.

The circuit to be recovered may be a memory array in which a DRAM is built. Further, the circuit to be recovered may be a memory array of a DRAM in which a microcomputer is built. Still further, the circuit to be recovered may be a memory array of an SRAM in which a microcomputer is built.

(5) In order to ultimately reduce the rate of faulty reading, it is recommended that a semiconductor integrated circuit be constituted by a plurality of unit information cells, each of which is composed of a pair of non-volatile memory cells and a pair of read transistor elements, wherein a part of the plurality of unit information cells forms a region for holding an error correction code related to the memory information of the remaining unit information cells, a part forms an electric program circuit related to the non-volatile memory elements of the plurality of unit information cells, and a part forms an ECC circuit capable of correcting an error in the read information of the plurality of unit information cells.

In order to ensure an error correction function by the ECC circuit, it is recommended that the electric program circuit has an operation mode of prohibiting writing into the unit information cell, when the ECC circuit is effective.

BRIEF DESCRIPTION OF THE DRAWING

FIG. 10 is a chart showing the state of voltage applied to each terminal when writing, erasing, or reading is performed to the memory cell shown in FIG. B.

FIG. 43 is a diagram exemplifying the control embodiment of a unit information cell by a bias controller.

DETAILED DESCRIPTION OF THE INVENTION

Source Line Sharing Type Memory Cell Structure

Figure 1:
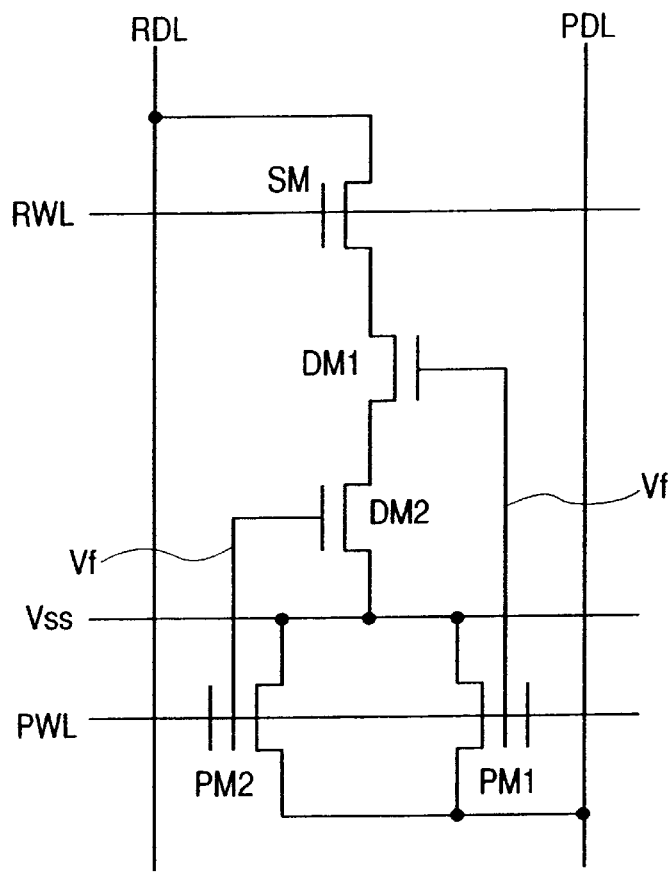
FIG. 1 is an equivalent circuit diagram to illustrate one example of a memory cell as an information memory cell included by a semiconductor integrated circuit in accordance with the present invention.
Figures 7, 8:
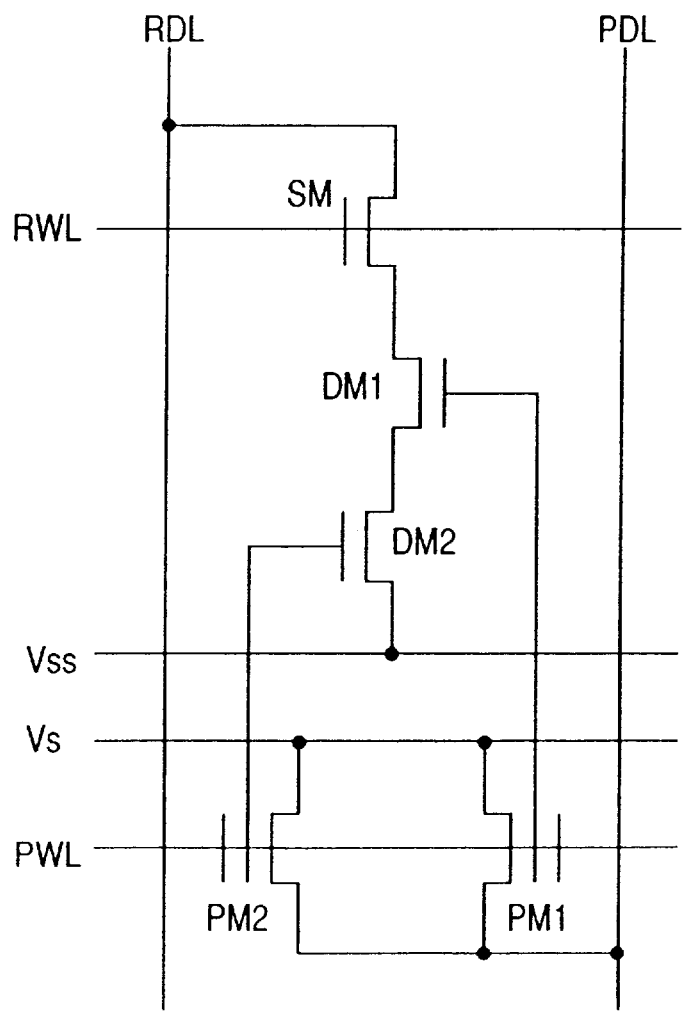
FIG. 7 is a chart showing the state of voltage applied to each terminal when writing, erasing, or reading is performed in the circuit shown in FIG. 1.
FIG. 8 is an equivalent circuit diagram to illustrate the second example of a memory cell as an information memory cell included by a semiconductor integrated circuit device in accordance with the present invention.

In FIG. 1, there is shown an equivalent circuit illustrating one example of a memory cell operating as an information memory cell forming a semiconductor integrated circuit in accordance with the present invention. In FIG. 7, there is exemplified the state of voltage applied to each terminal when a write operation, an erase operation, or a read operation is performed in the circuit shown in FIG. 1.

In the circuit shown in FIG. 1, the floating gates Vf of a plurality of non-volatile memory elements PM1, PM2 are used as the gate electrodes of a plurality of read MIS transistors DM1, DM2 which are OR-logically connected to each other and the word line PWL of the non-volatile memory elements PM1, PM2 is used as the grounding potential of the circuit.

That is, according to FIG. 1, the floating gates Vf of two non-volatile memory elements PM1, PM2 are used as the gate electrodes of n-channel type read MIS transistors DM1, DM2 which are connected in series to each other, respectively. For the sake of convenience, the junctions where the non-volatile memory elements PM1, PM2 are connected to a read data line are referred to as drain electrodes, and the junctions where the non-volatile memory elements PM1, PM2 are connected to a source line Vss are referred to as source electrodes. The source electrodes of the non-volatile memory elements PM1, PM2 and the source electrodes of the read MIS transistors DM1, DM2 share the source line Vss together.

Figure 54:
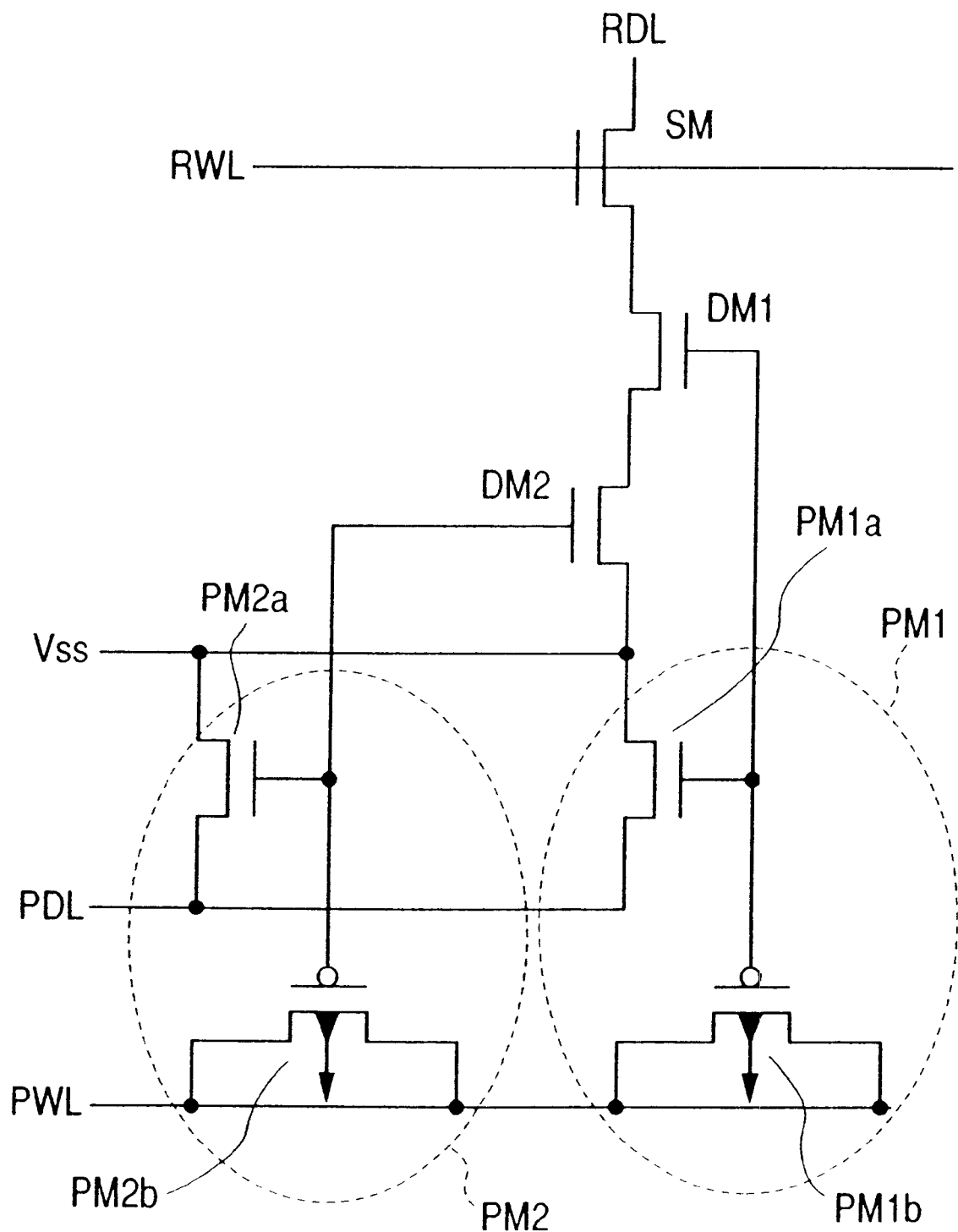
FIG. 54 is a circuit diagram exemplifying the nonvolatile memory cell in FIG. 1 in detail.

In FIG. 54, there is illustrated in detail the Nonvolatile memory elements PM1, PM2. The respective non-volatile memory elements PM1, PM2 have MIS capacitor elements MP1b, MP2b, each of which has a capacitor electrode on a first semiconductor region functioning as a control gate electrode via an insulating layer, and MIS transistors PM1a, PM2a, each of which has a first source electrode, a first drain electrode and a gate electrode which are formed in a second semiconductor region. In short, each of the MIS capacity elements MP1b, MP2b is constituted by a MIS transistor capacitor in which the source electrode, the drain electrode, and the back gate are commonly connected to each other. Each of the capacitor electrodes of the MIS capacitor elements MP1b, MP2b is commonly connected to each of the gate electrodes of the MIS transistors PM1a, PM2a to function as the floating gate electrode Vf.

When a write operation is performed to the above-mentioned non-volatile memory elements PM1, PM2, as shown in FIG. 7, a write data line PDL is disposed at a voltage of SV, a write word line PWL is disposed at a voltage of SV, and a read data line RDL, a read word line RWL and a source line Vss are disposed respectively at a voltage of 0V. This injects the hot electrons generated at the drain electrode into the floating gate electrode to increase the threshold voltages of the non-volatile memory elements PM1, PM2.

When an erase operation is performed to the above-mentioned non-volatile memory elements PM1, PM2, as shown in FIG. 7, the write data line PDL, the write word line PWL, the read data line RDL, and the read word line RWL are disposed respectively at a voltage of 0V, and the source line Vss is disposed at a voltage of 6V. This causes a tunnel current to remove electrons from the floating gate into the source electrode to decrease the threshold voltages of the non-volatile memory elements PM1, PM2.

The above-mentioned read MIS transistors DM1, DM2 are different in switching state or mutual conductance between the writing state and the erasing state of the non-volatile memory elements PM1, PM2. When the read operation is performed to the non-volatile memory elements PM1, PM2, as shown in FIG. 7, the read data line RDL and the read word line RWL are disposed at a voltage of 1.8V and the signal lines PDL, PWL, and Vss are disposed respectively at 0V. An n-channel type select MIS transistor SM receiving the read word line on the gate electrode enables the above-mentioned read MIS transistor DM1 to connect to the read data line RDL. The read data line RDL is brought into conduction with the source line Vss when both the read MIS transistors DM1, DM2 are in the ON state.

In this manner, when the read operation is performed, the write data line PDL, the write word line PWL, and the source line Vss are fixed at the ground potential (0V) of the circuit, respectively. Accordingly, at this time, weak hot electrons are not injected into the floating gate or electrons are not injected thereinto by the tunnel current.

Figure 2:
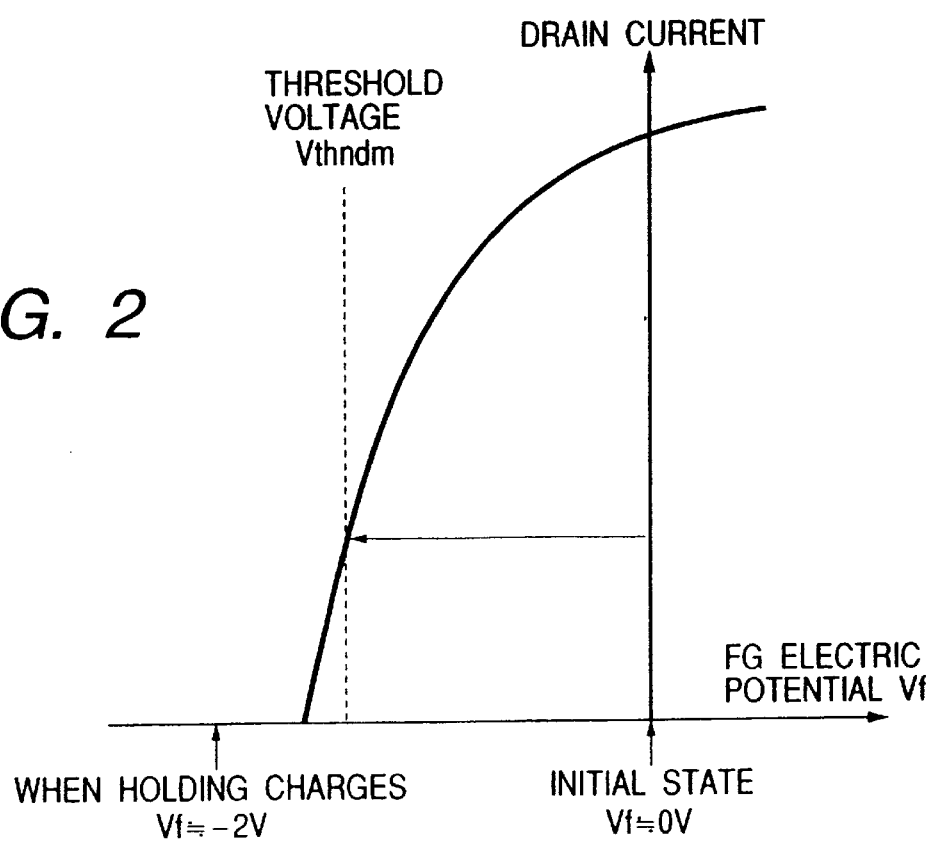
FIG. 2 is a voltage-current characteristic plot of a read MIS transistor shown in FIG. 1.

In FIG. 2, there is illustrated the voltage current characteristics of the above-mentioned read MIS transistors DM1, DM2. The initial threshold voltage (Vthndm) of the read MIS transistors DM1, DM2 is set in a range of voltage which is higher than the electric potential of the floating gate electrode Vf (approximately −2V) when the write operation is performed to the non-volatile memory elements PM1, PM2 to inject charges thereinto (in the writing state) and is lower than the electric potential of the floating gate electrode Vf (approximately −0V) in the initial state of the erasing state where the write operation is not performed to the non-volatile memory elements PM1, PM2. In other words, the read MIS transistors DM1, DM2 are depression type transistors. Into the semiconductor regions of the read MIS transistors DM1, DM2 there is introduced, for example, a low concentration of phosphorus.

In the writing state, where charges are held in the floating gate, two read MIS transistors DM1, DM2 connected in series to each other are cut off, and, hence, even if the charges held by one element of the non-volatile memory elements PM1, PM2 leak for some reason to return the one element to the initial state, a current path via the read select MIS transistor SM is held cut off, which does not produce faulty reading.

As a precondition, the rate of faulty reading of a memory cell of 2-cell 1-bit type constituting 1 bit by 2 non-volatile memory elements PM1, PM2 will be calculated. For example, assuming that the probability of occurrence of faulty reading in 10 years in a memory cell of 1-cell 1-bit type constituting 1 bit by 1 non-volatile memory element is f, the probability Pa that both of two cells will be good is given by $$Pa=(1-f)^2 \qquad (1)$$

and the probability Pb that either of the two cells will be faulty is given by $$Pb=(1-f)f+f(1-f)=2f(1-f) \qquad (2)$$

and the probability PC that both of the two cells will be faulty is given by $$Pc=f^2 \qquad (3)$$

where $$Pa+Pb+Pc=(1-f)^2+2f(1-f)+f^2=1$$

Letting the number of total bits of a chip be N, because a good cell means that it has no bit in the state of equation (3), N bits should be in the state of equation (1) or (2) and hence the probability Y of a good cell is given by $$Y=\Sigma_N\ Ck\ Pa^K\ Pb^{N-K} \qquad (4)$$

and the probability F of a faulty chip is given by $$F=1-Y=1-\Sigma_N\ Ck\ Pa^K\ Pb^{N-K} \qquad (5)$$

According to the binomial theorem, $$Y=\Sigma_N\ Ck\ Pa^K\ Pb^{N-K}=(Pa+Pb)^N$$
$$=\{(1-f)^2+2f(1-f)\}^N$$
$$=(1-f^2)^N$$

Therefore, the equation (5) is reduced to $$F=1-(1-f^2)^N \qquad (6)$$

Here, since a memory cell of 1-cell 1-bit type is faulty even if one bit is faulty, the probability Y' of a good memory cell of 1-cell 1-bit type is given by $$Y'=(i-f)^N \qquad (7)$$

and the probability F' of a faulty chip of 1-cell 1-bit type is given by $$F'=1-(1-f)^N \qquad (8)$$

Therefore, the rate of improvement R in the rate of a faulty chip by a semiconductor integrated circuit device in accordance with the present invention is given by $$R=F/F'=1-(1-f^2)^N/\{1-(1-f)^N\} \qquad (9)$$

When f<<1, the R is reduced to $$R=F/F'\approx f \qquad (10)$$

Therefore, a remarkable improvement in the rate of a faulty chip can be accomplished.

According to the memory information cell structure shown in FIG. 1, the floating gate electrode of the non-volatile memory element becomes the gate electrode of the above-mentioned read transistor element and hence the read transistor element has the electron injection state or electron emission state of the floating gate electrode, in other words, a switching state or a mutual conductance state according to the writing state or the erasing state. Accordingly, even if a select level is not applied to the control gate electrode, a current according to the switching state or the mutual conductance state can be applied to the above transmission means. Since the select level is not applied to the control gate electrode, to ensure an amount of signal required of the transmission means, a depression type MIS transistor is employed as the above-mentioned read transistor element.

In the read operation, it is not necessary to apply a channel current according to the threshold voltage of the non-volatile memory element. Therefore, in the read operation, the source electrode and the drain electrode of the non-volatile memory element may be disposed at the ground potential of the circuit, such as 0 volt, respectively. Therefore, the injection of weak hot electrons into the floating gate electrode from the first drain electrode is not generated. At this time, when the control gate electrode is disposed at the ground potential of the circuit, a tunnel current is not generated, either.

In this manner, in the reading operation, a problem of data inversion caused by the charge gain is not presented and hence it is possible to improve the holding data performance for a long time and to realize a reduction in the rate of faulty reading.

Also, both of the read transistor elements are in the OFF state when both of the non-volatile memory elements are in the writing state. Although the possibility that the held charges will leak from the non-volatile memory elements in the writing state for some reason is not zero in a probability, even if the held charges leak from one non-volatile memory element, the series path of the above-mentioned read transistor elements is held cut off and hence the probability that the held charges will leak from both of the non-volatile memory elements is extremely low. This results in further providing complete data retention measures to the information memory cell to which charge gain measures have been taken by pairing the above-mentioned non-volatile memory elements with the above-mentioned read transistor elements and in further reducing the rate of faulty reading.

Figure 3:
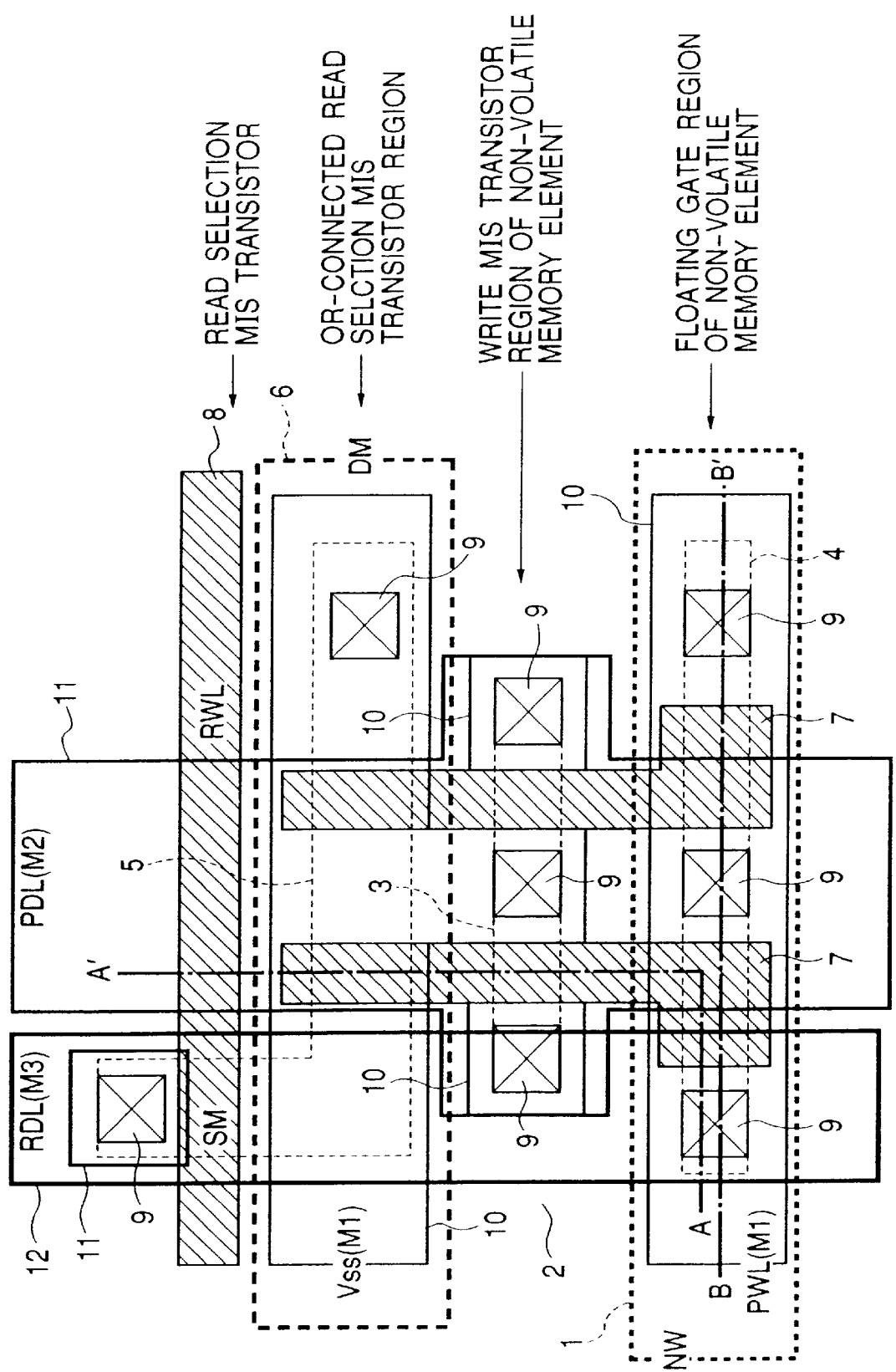
FIG. 3 is a cross-sectional view illustrating a device structure to realize the circuit configuration shown in FIG. 1.

In FIG. 3, there is illustrated a device structure for realizing the circuit constitution shown in FIG. 1. The circuit structure shown in FIG. 1 is one in which the above-mentioned non-volatile memory element capable of being fabricated by a manufacturing process, such as a single layer polysilicon process or the like, has a MIS transistor and a control gate with an insulating film interposed between itself and the floating gate of the MIS transistor, the control gate being formed of a layer doped with impurities.

Further describing the device structure in detail, as shown in the plan layout diagram in FIG. 3, the control gate constituting the non-volatile memory element is formed of a second conductivity type semiconductor region 1 formed in a first conductivity type semiconductor region 2. The write MIS transistor constituting the non-volatile memory elements PM1, PM2 is formed in the active region 3 of the first conductivity type semiconductor region 2. The above-mentioned floating gate is formed of a conductive layer 7 which is arranged on the channel of the write MIS transistor and on the channel of the read MIS transistor formed in the active region 5 of the first conductivity type semiconductor region 2 via a gate insulating film. The above-mentioned control gate is formed of the second conductivity type semiconductor region 1 arranged under the active region 4 extended from the above-mentioned floating gate 7 via the gate insulating film.

In order to adjust the initial threshold voltages of the read MIS transistors DM1, DM2, a mask pattern 6 for introducing a second conductivity type impurity is added and a read word line 8 composed of the same conductive layer as the floating gate is formed. A reference numeral 9 designates a contact hole pattern, 10 designates a first metal wiring layer pattern, 11 designates a second metal wiring layer pattern, and 12 designates a third metal wiring layer pattern. A write word line PWL connected to the control gate of the non-volatile memory elements and a source line Vss, to which the source regions of the write MIS transistor and the read MIS transistor are connected, are formed of the first metal wiring layer, and a write data line PDL is formed of the second metal wiring layer, and a read data line RDL is formed of the third metal wiring layer.

Figure 4:
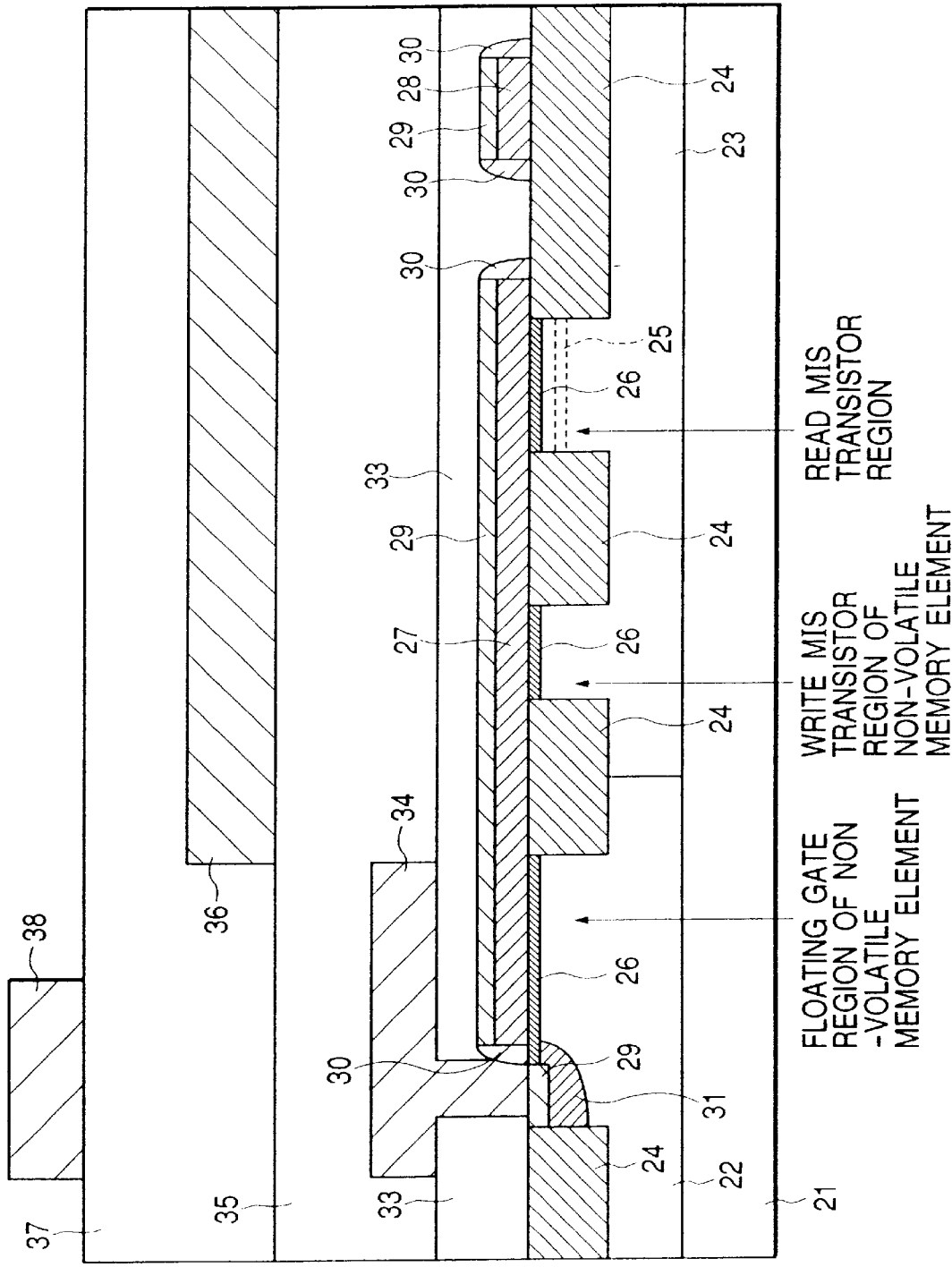
FIG. 4 is the cross-sectional view taken on a line A–A' in FIG. 3.
Figure 5:
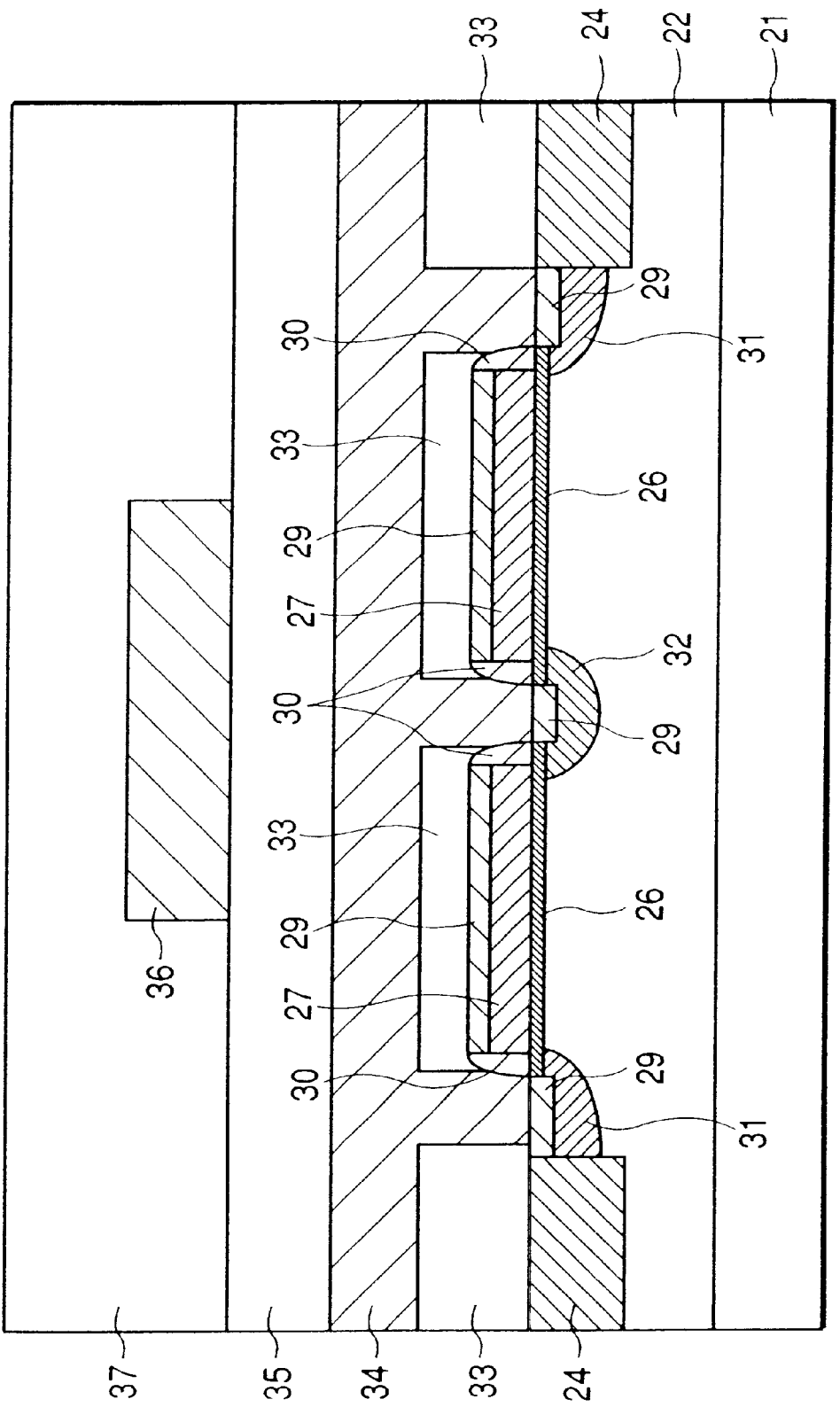
FIG. 5 is the cross-sectional view taken on a line B–B' in FIG. 3.

FIG. 4 shows a cross section taken on a line A–A' in FIG. 3, and FIG. 5 shows a cross section taken on a line B–B' in FIG. 3. On the surface region of a first conductivity type semiconductor substrate 21, a second conductivity type semiconductor region 22, functioning as the control gate of the non-volatile memory element, and a first conductivity type semiconductor region 23 are formed. In the first conductivity type semiconductor region 23, there are formed a write MIS transistor region of the non-volatile memory element isolated by an element isolating region 24 and provided with a gate insulating film 26, and a read MIS transistor region isolated by the element isolating region 24 and provided with the gate insulating film 26 and a second conductivity type impurity layer 25 for adjusting an initial threshold voltage. On the tops of the above second conductivity type semiconductor region 22, the write MIS transistor region, and the read MIS transistor region, there is arranged a floating gate 27 via the gate insulating film 26; and, on the surface region of the second conductivity type semiconductor region 22, a second conductivity type diffusion layer 31 and a first conductivity type diffusion layer 32 are formed. On the surface regions of the floating gate 27, the second conductivity type diffusion layer 31 and the first conductivity type diffusion layer 32, there is formed a metal silicide layer 29. On the peripheral portion of the floating gate 27, there is provided an insulating film side spacer 30, and a first interlayer insulating film 33, a first metal wiring layer 34, a second interlayer insulating film 35, a second metal wiring layer 36, a third interlayer insulating film 37, and a third met wiring layer 38 are provided.

Figure 6:
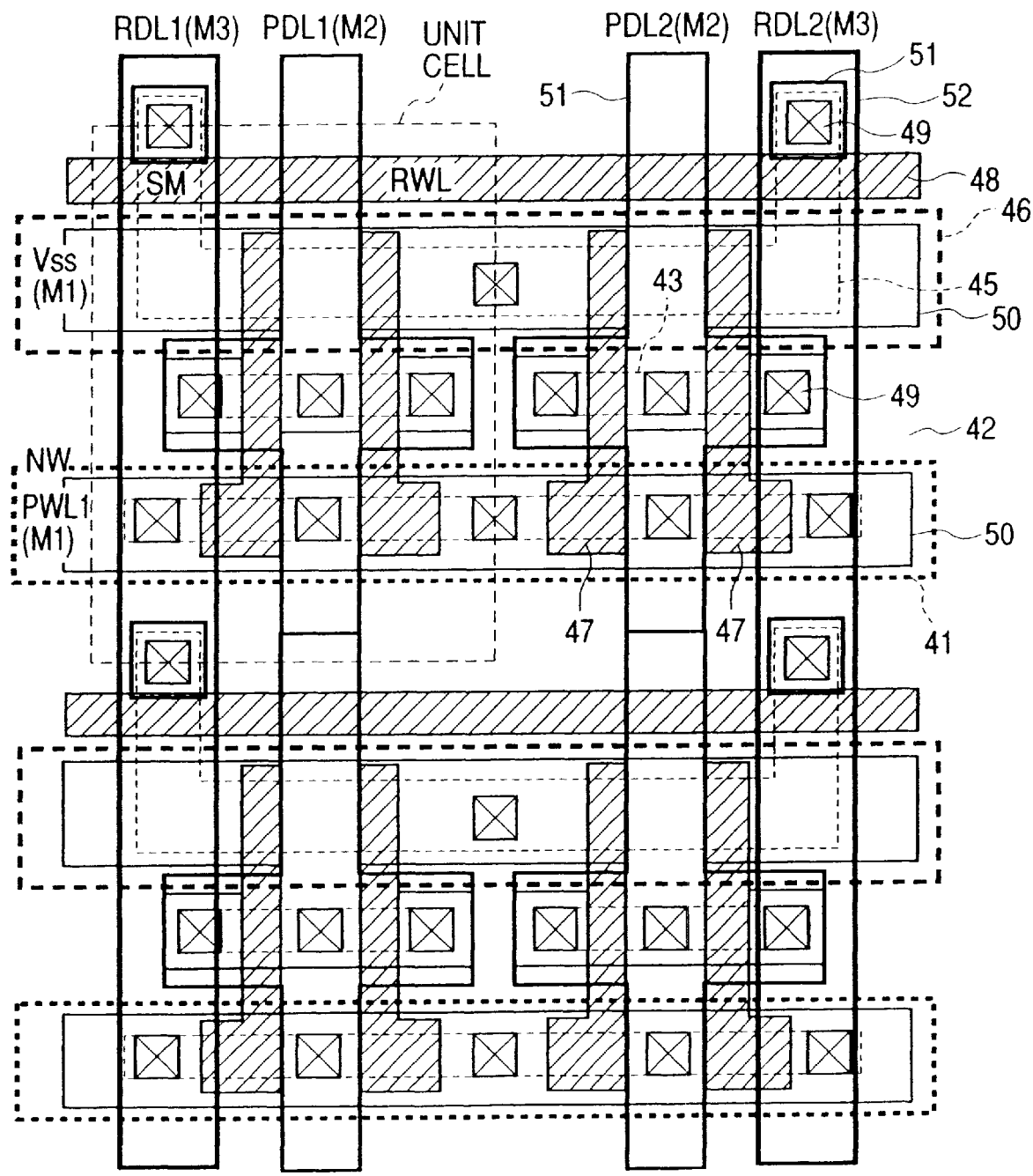
FIG. 6 is a plan view showing the layout of FIG. 3.

FIG. 6 is a plan view showing the layout in FIG. 3, and shows the layout of 4 bits constituting a memory cell array.

Source Line Separation Type Memory Cell Structure

In FIG. 8, a second example of a memory cell as an information memory cell including a semiconductor integrated circuit in accordance with the present invention is illustrated as an equivalent circuit.

The memory cell illustrated in the drawing is different from the one illustrated in FIG. 1 in that the source line Vs of the non-volatile memory elements PM1, PM2 is separated from the source line Vss of the read MIS transistor DM2.

Figure 9:
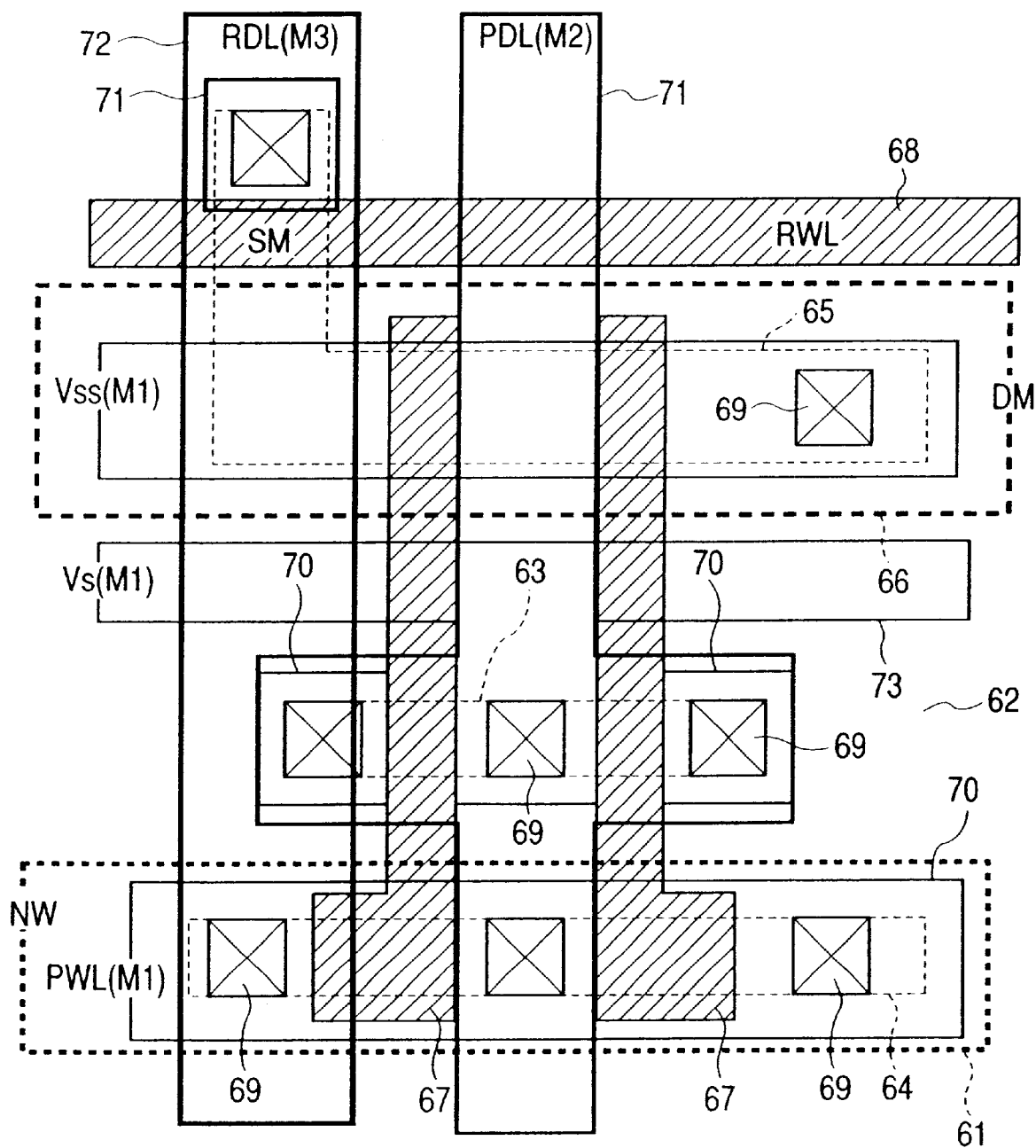
FIG. 9 is a plan view showing the layout of the memory cell shown in FIG. 8.

FIG. 9 shows a layout of the memory cell shown in FIG. 8. In FIG. 10, there are illustrated the states of voltages applied to the respective terminals when the write, erase and read operations are performed to the memory cell in FIG. 8.

Since the source line Vs of the non-volatile memory elements PM1, PM2 is independent, the voltage of 6V, which is applied when the erase operation is performed, is not applied to the read MIS transistors DM1, DM2. This can prevent the gate oxide films of the transistors from being degraded by voltage stress.

DRAM Mat Recovery Fuse

Figure 11:
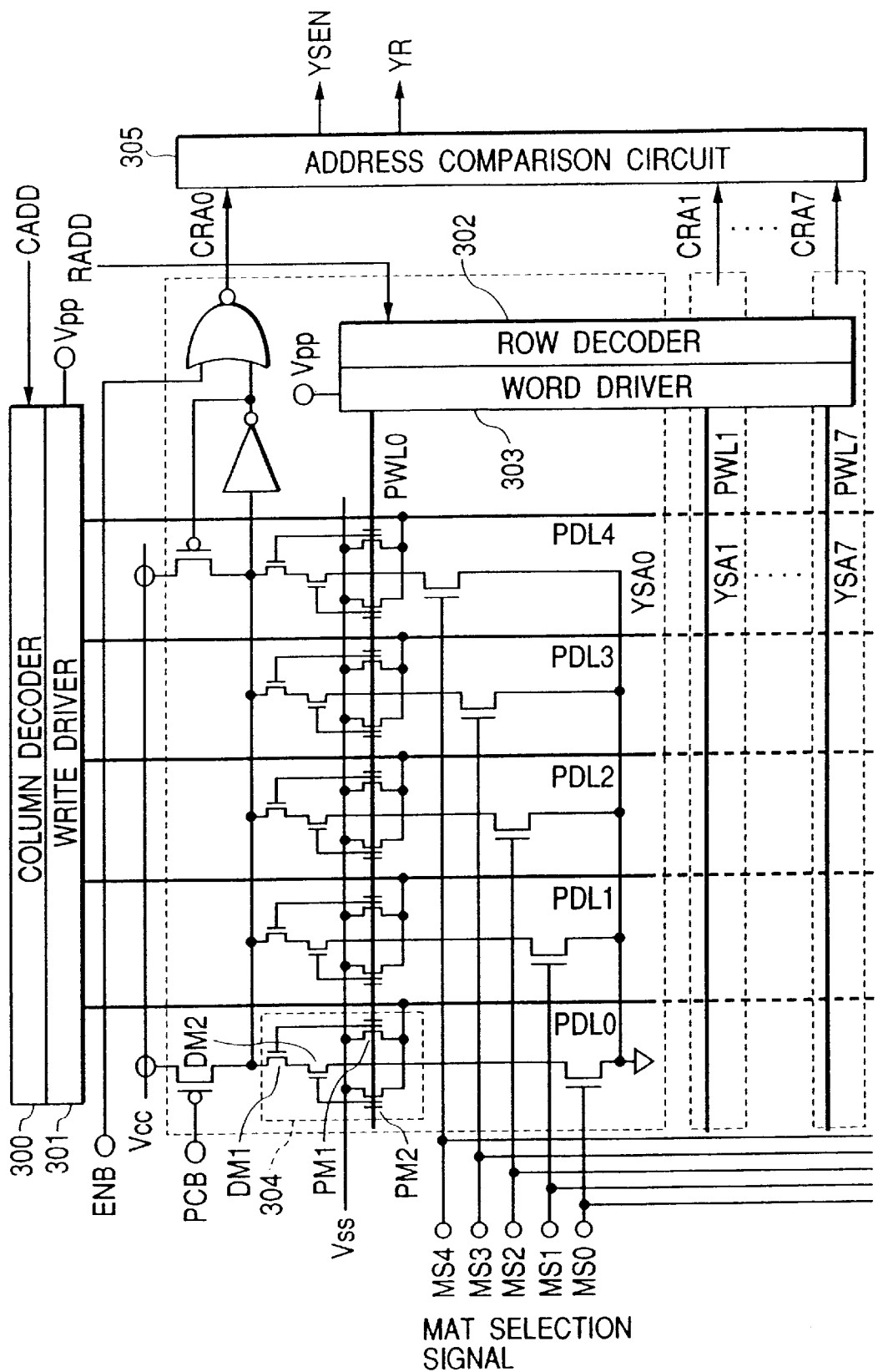
FIG. 11 is a circuit diagram to illustrate a mat selection recovery circuit of a DRAM which is one example of a semiconductor integrated circuit in accordance with the present invention.
Figure 12:
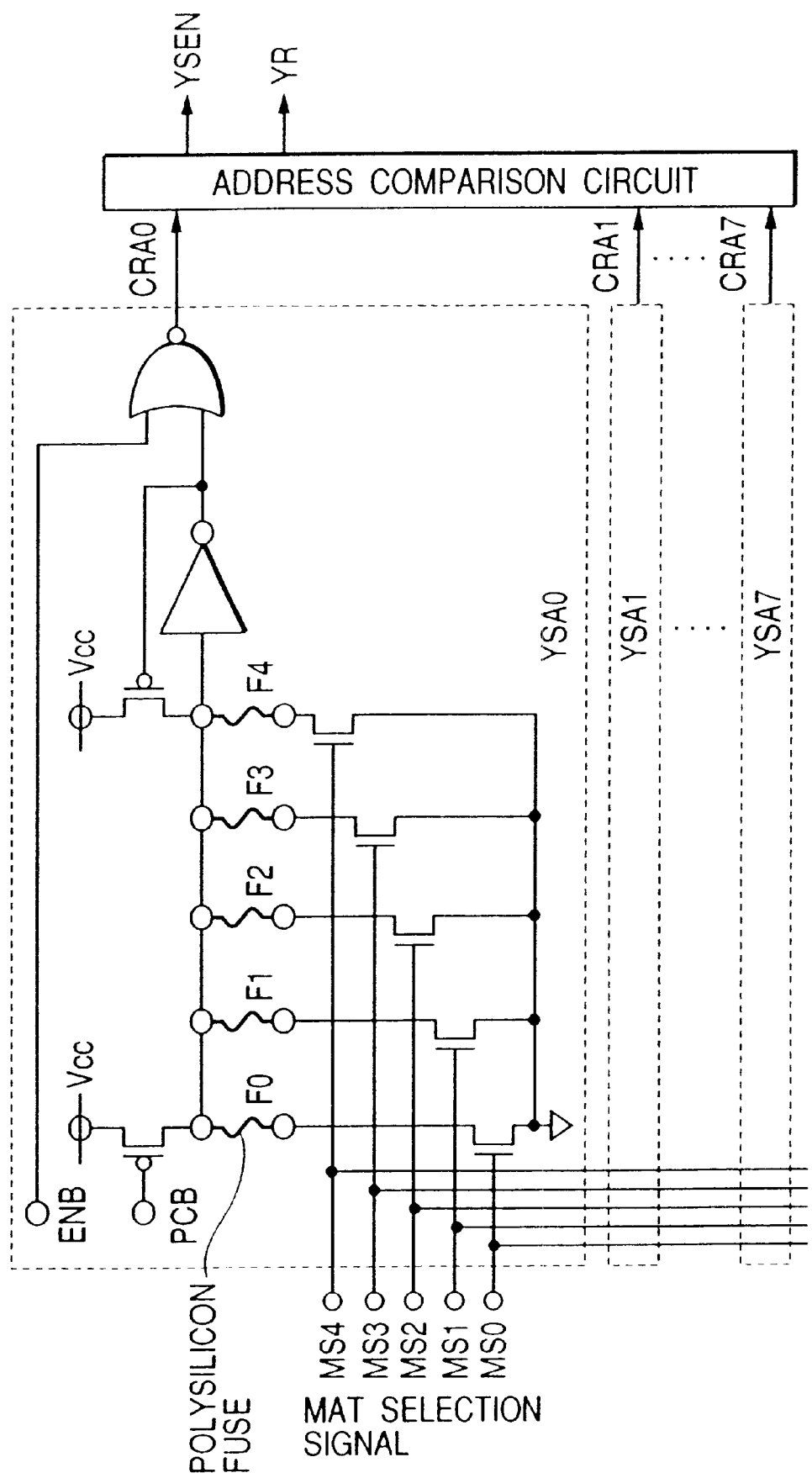
FIG. 12 is a circuit diagram to illustrate a mat selection recovery circuit when a conventional laser-melted fuse is used.

In FIG. 11, there is shown a DRAM mat selection recovery circuit diagram which is one example of a semiconductor integrated circuit in accordance with the present invention. Also, in FIG. 12, there is shown a mat selection recovery circuit diagram using a conventional laser-melted fuse. In order to replace the conventional laser-melted fuse with the non-volatile memory elements in accordance with the present invention, a column decoder 300 for controlling the write operation, a write driver 301, a row decoder 302, and a word driver 303 are added, and the write operation can realize a state equivalent to the state where a laser fuse is melted down and the read operation is performed as in the case with the conventional laser-melted fuse. A power source voltage Vpp necessary for the write operation is supplied from the external source.

Memory cells 304 each having a basic constitution illustrated in FIG. 1 are provided in 8 columns by 5 rows, and are selectively written one by one by the column decoder 300 and the row decoder 302. The read operation is performed in units of 8 memory cells 304 selected by the column by the mat selection signals MS0 to MS4. Read information is supplied to an address comparison circuit 305 as recovery address information CRA0 to CRA7 and is compared with the 8 bits corresponding to the access address signal at that time, and the comparison results YSEN, YR are used for a redundancy selection control.

Figure 53:
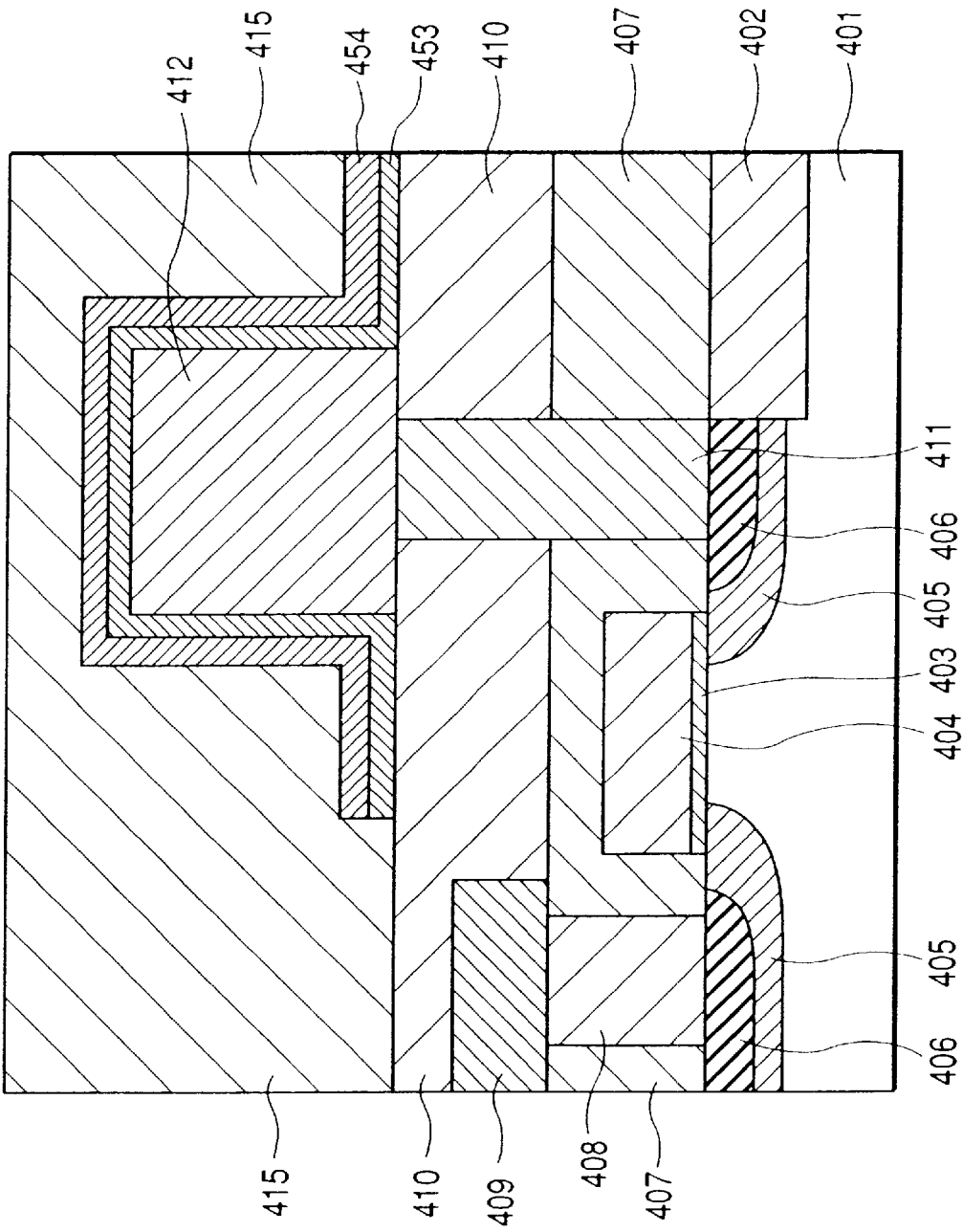
FIG. 53 is a longitudinal cross-sectional view illustrating one example of a dynamic memory cell in a DRAM.

The gate oxide film of the transistor constituting the non-volatile memory element is formed by the same oxidization process as the gate oxide film used for the DRAM memory cell. Therefore, the non-volatile memory elements PM1, PM2 can be formed without adding any new process to the basic DRAM process. Here, the DRAM memory cell has a cross sectional structure, for example, as shown in FIG. 53.

Flash Memory

Figure 13:
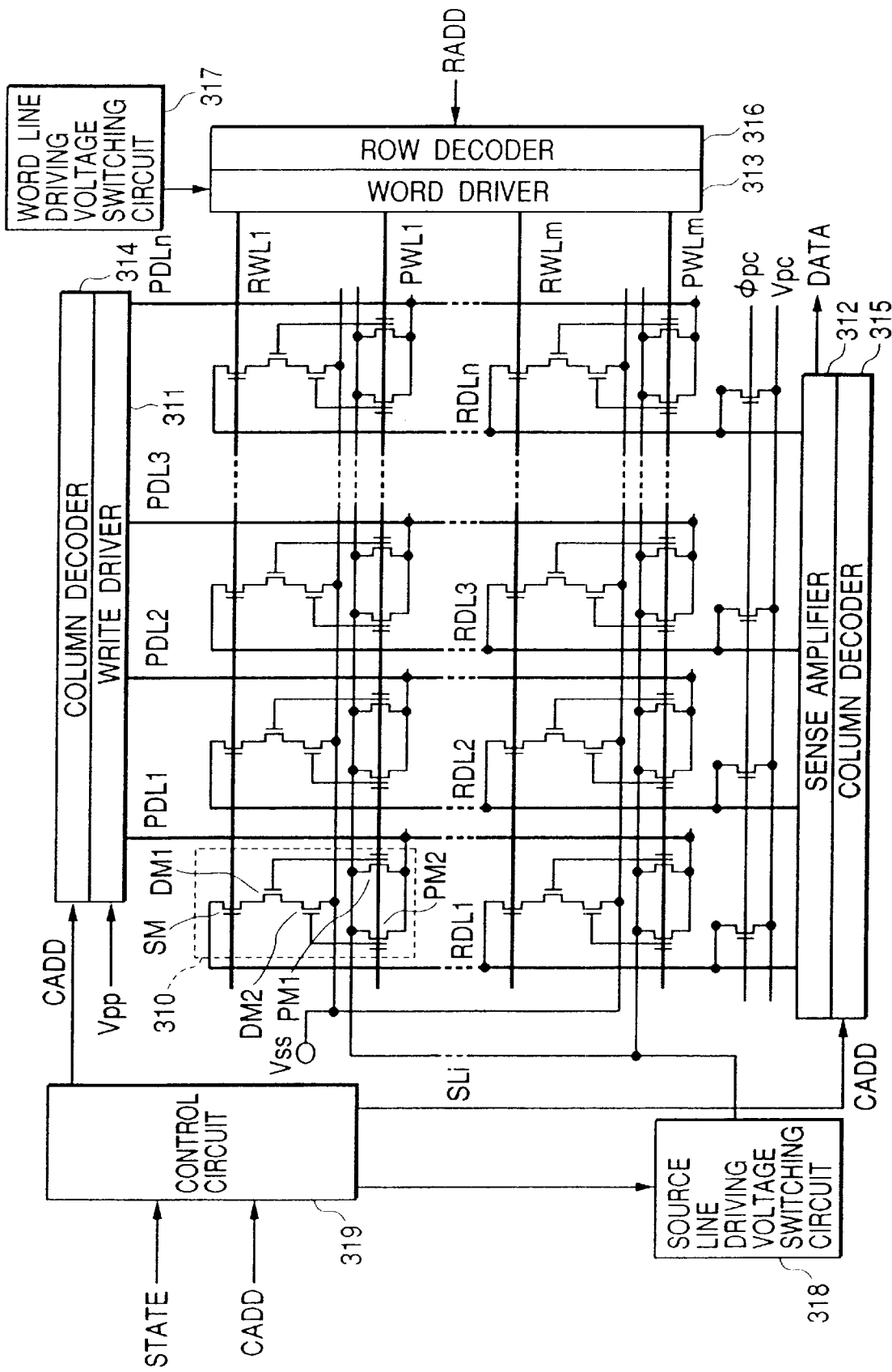
FIG. 13 is a block diagram schematically illustrating a circuit of a flash memory which is one example of a semiconductor integrated circuit in accordance with the present invention.

In FIG. 13, there is schematically illustrated the circuit block diagram of a flash memory which is one example of a semiconductor integrated circuit in accordance with the present invention. A plurality of memory cells 310 illustrated in FIG. 8 are arranged in a matrix, and write date lines PDL1 to PDLN are connected to a write driver 311, read data lines RDL1 to RDLN are connected to a sense amplifier 312, and write word-lines PWL1 to PWLM and read word lines RWL1 to RWLN are connected to a word driver 313. When the write operation is performed, a column decoder 314 decodes a column address signal CADD to produce the selection signals of the write data lines PDL1 to PDLN and drives the selected write data line by the write driver 311. The selection of the write word lines PWL1 to PWLM when the write operation is performed is directed to the word driver 313 by a row decoder 316 for decoding a row address signal RADD. On the other hand, when the read operation is performed, a column decoder 315 decodes a column address signal CADD to produce the selection signal of the read data lines RDL1 to RDLN and amplifies the signal of the selected read data line by the sense amplifier 312 and produces it as read data. The selection of the read word lines RWL1 to RWLM when the read operation is performed is directed to the word driver 313 by the row decoder 316 for decoding the row address signal RADD. The erase operation to the memory cells 310 is performed by one operation. Voltage to drive the word lines by the word driver 313 is switched by a word line driving voltage switching circuit 317. The voltage of the source line Vss is switched by a source line driving voltage switching circuit 318. The flash memory is controlled as a whole by a control circuit 319.

System LSI Recovery Fuse

Figure 14:
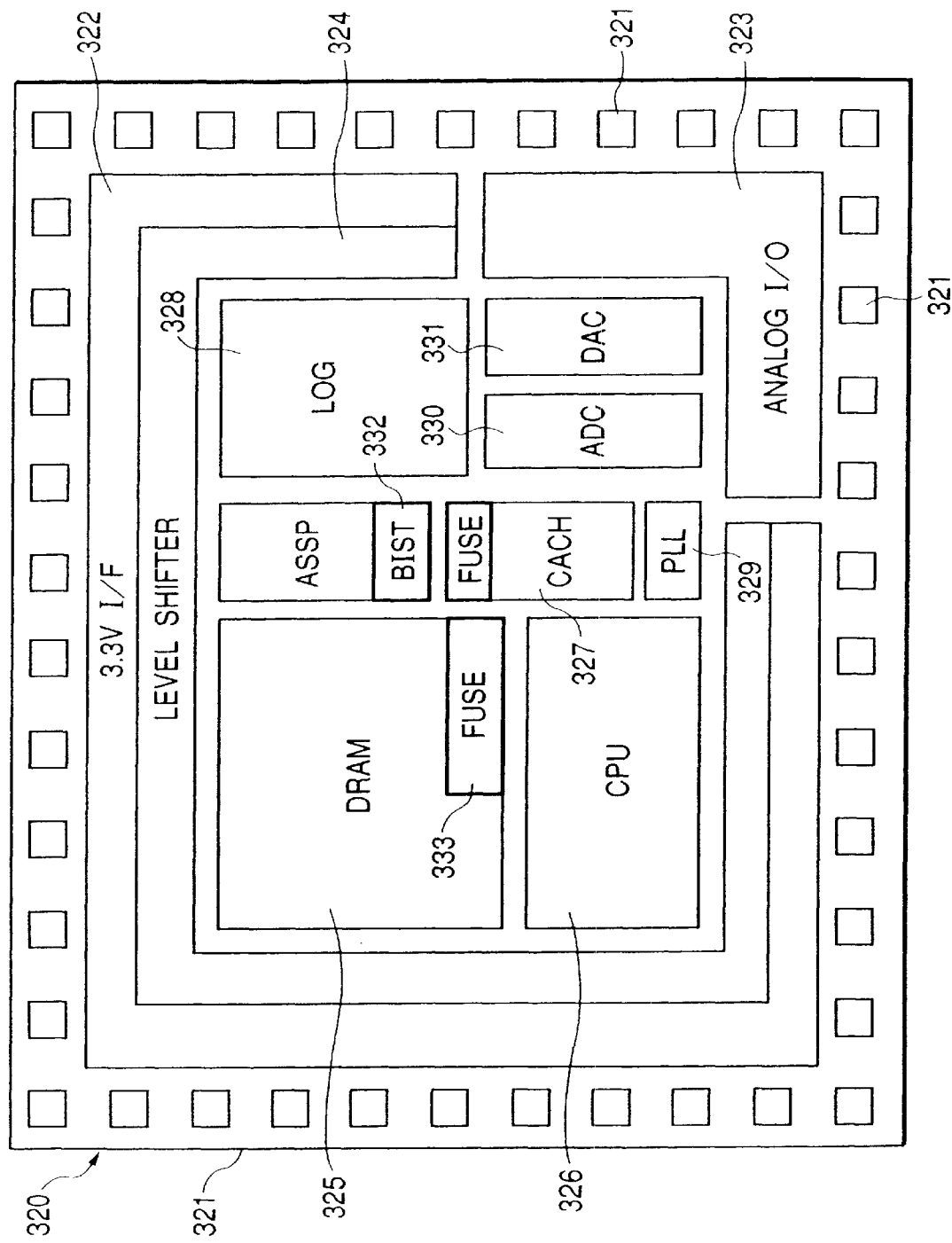
FIG. 14 is a plan view of a chip of a system LSI which is one example of a semiconductor integrated circuit in accordance with the present invention.

In FIG. 14, there is schematically illustrated the plan view of a system LSI chip which is one example of a semiconductor integrated circuit in accordance with the present invention. The system LSI 320 illustrated in the drawing is provided with a large number of external connection electrodes 321 such as bonding pads or the like arranged at the peripheral portion of a semiconductor substrate and an external input/output circuit (3.3 VI/F) 322 and an analog input/output circuit (analog I/O) 323, both circuits being arranged inside the bonding pads, though the invention is not limited thereto. The external input/output circuit 322 and the analog input/output circuit 323 are operated by an external power source having a relatively high level like 3.3 volts. A level shifter 324 lowers the voltage of the external power source to a voltage of 1.8 volts for an internal power source. Inside the level shifter 324, there are provided a dynamic random access memory (DRAM) 325, a central processing unit (CPU) 326, a cache memory (CACH) 327, a logic circuit (LOG) 328, a phase-locked loop circuit (PLL) 329, an analog/digital conversion circuit (ADC) 330, a digital/analog conversion circuit (DAC) 331, and a built-in self test circuit (BIST) 332. What is designated by a reference numeral 333 is an electrically erasable writable non-volatile memory FUSE, for example, a flash memory. The DRAM 325, the CPU 326, the LOG 328, the CACH 327, and the BIST 332 are operated by the internal power source having a voltage of 1.8 V supplied by the level shifter 324. The DRAM 325, however, raises the internal power source voltage to form a word line selection level and uses it for the operational power source of the word driver and the like. In the data read operation, the flash memory (FUSE) 333 is operated by the internal power source voltage, but in the erase operation or in the write operation, it needs high voltage and the high voltage may be generated by an internal voltage boosting circuit or may be supplied by the external power source via a predetermined external connection electrode in a predetermined operational mode such as the EPROM write mode of the system LSI 320, which will be described later.

The above-mentioned flash memory (FUSE) 333 is used for storing the recovery information of the DRAM 325 (control information to replace a faulty memory cell with a redundant memory cell), and the flash memory (FUSE) 333 is used for storing the recovery information of the cache memory 327, and is provided, instead of a program circuit for recovery by fuse, though the invention is not limited thereto. The above flash memory 333 constitutes a programmable logic circuit in which its memory information determines the logic function of the output to the input. For example, the flash memory (FUSE) 333 functions as a logic circuit in which it performs a predetermined logic calculation to a plurality of bits of an address signal and holds the results of the calculation as data in advance and outputs a predetermined logic calculation result corresponding to a combination of logic values of the address input signal.

The above-mentioned system LSI 320 has a complementary MIS transistor (insulating gate field effect transistor) formed on one semiconductor substrate like a single crystal silicon by a single layer polysilicon gate process and the thickness of the gate oxide film of the MIS transistor is classified into two kinds, though the invention is not limited to this.

Each of the external input/output circuit 322, the analog input/output circuit 323, the DRAM 325, the flash memory 333, the ADC 330, and the DAC 331 has MIS transistors each having a gate length of 0.4 $\mu$m and a gate oxide film thickness of 8 nm in the case of using a 0.2 $\mu$m process technology, though the invention is not limited to this. This is because it is desirable for improving the information holding performance of the flash memory that a tunnel oxide film composed of a gate oxide film is made comparatively thick and further because a certain level of withstand voltage (withstand voltage against the breakage of the gate oxide film) needs to be ensured against the operational voltage of the MIS transistor. Therefore, the gate insulating film of the MIS transistor constituting the non-volatile memory element of the above-mentioned flash memory and the gate insulating film of the MIS transistor included by the above-mentioned external interface circuit are made to have an equal film thickness in the range of permissible error due to variations in the process. Although the range of permissible error of the gate insulating film thickness due to variations in the process is about ±0.5 nm for a target film thickness of 8.0 nm in a process for a minimum work size of 0.25 $\mu$m to 0.2 $\mu$m and about ±0.3 nm for a target film thickness of 6.5 nm in a process for a minimum work size of 0.18 $\mu$m to 0.15 $\mu$m, though the invention is not limited to this.

In contrast to this, the circuit operated by the internal power source voltage which is lowered to a comparatively lower level, that is, the logic circuit 328, the cache memory 327, or the CPU 326 is composed of a MIS transistor having a gate length of 0.2 $\mu$m and a gate film thick of 4 nm. The level shift circuit has a MIS transistor having both of the gate oxide film thicknesses, though the invention is not limited to this.

The gate electrodes of the MIS transistors different in the gate oxide film thickness from each other are composed of polysilicon layers having the same film thickness. Here, that the polysilicon layers have the same film thickness means that they are equal in film thickness to each other in the range of permissible error due to variations in the process. The range of permissible error due to variations in the process is about ±10% for a target film thickness of 30 nm to 200 nm, though the invention is not limited to this.

The above-mentioned gate oxide films which are to be equal in film thickness to each other are formed by the same photo mask. Also, the abovementioned polysilicon gates which are to be equal in film thickness to each other are formed by the same photo mask. In this manner, by making the thickness of the gate oxide film of the non-volatile memory element having a single layer gate structure equal to that of the gate oxide film of the MIS transistor of the other circuit, it is possible to prevent the manufacturing process of the system LSI from being complicated and further to provide the non-volatile memory element of the flash memory with a performance of holding information for a considerably long time.

Figure 15:
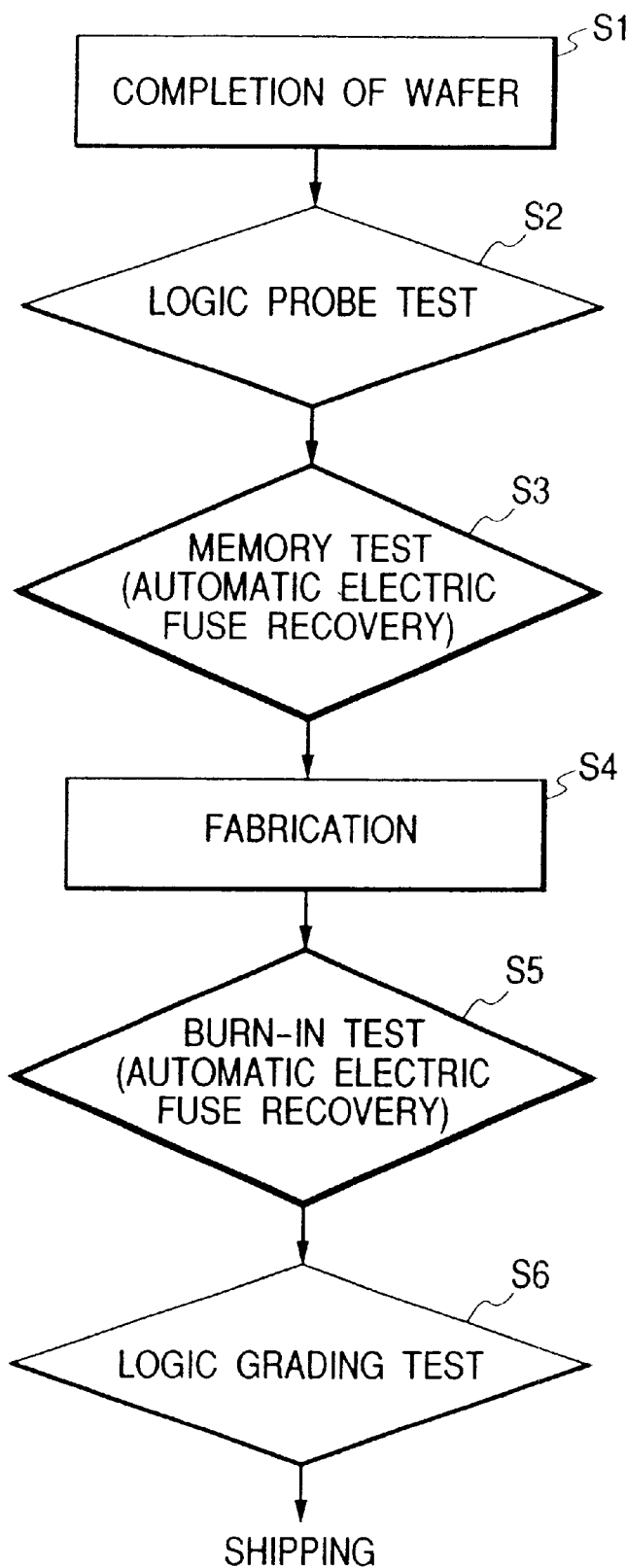
FIG. 15 is a flow chart to show a testing process of a system LSI in accordance with the present invention.

FIG. 15 shows the testing flow chart of a system LSI in accordance with the present invention. After a wafer is completed (S1), first, a logic circuit test is conducted by using a logic tester (S2) and then a memory test is done on the chip passing the test (S3). The memory test is conducted by the self-diagnostics of the built-in self test (BIST) circuit 332 mounted on the chip and the obtained fault information is memorized as write data in the above-mentioned flash memory (FUSE) 333 to constitute a programmable logic circuit determined by the memorized information to complete a fault recovery. Next, a chip whose faulty memories have been recovered is fabricated in a predetermined package (S4) and is subjected to an operation test in which temperature and power voltage are accelerated (burn-in test) (SS). If a faulty refresh occurs, for example, in the memory cell of the DRAM 325 in this burn-in test, a second recovery involving replacing a faulty bit with a redundant bit is conducted and recovery information is written into the flash memory (FUSE) 333. Then, a grading test is conducted on the logic circuit (S6) to grade it according to operating speed and the like. Then, the system LSI is shipped.

DRAM Hybrid Recovery Fuse

Figure 16:
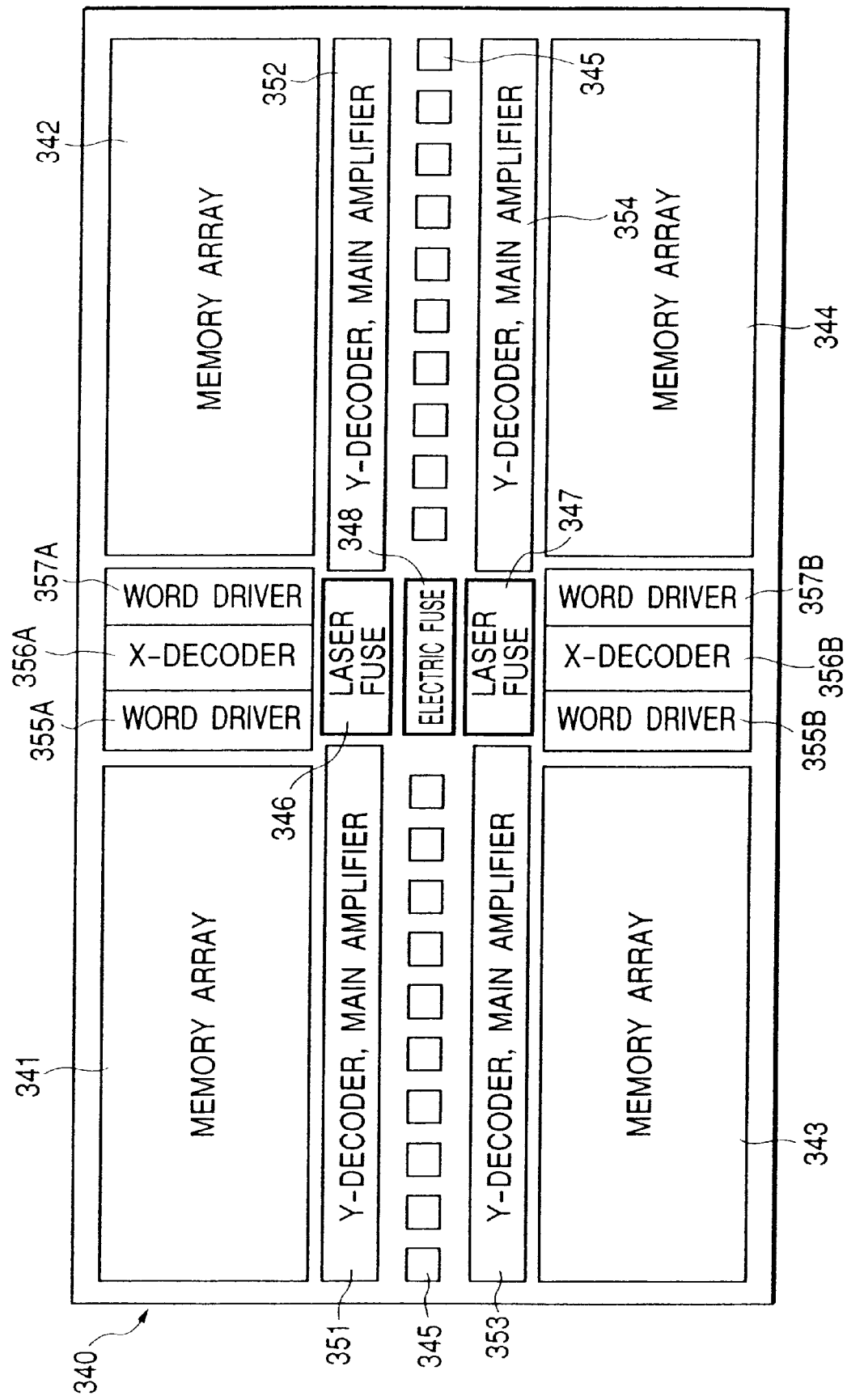
FIG. 16 is a plan view of a chip of a 1-G bit DRAM which is one example of a semiconductor integrated circuit in accordance with the present invention.

In FIG. 16, there is schematically illustrated the chip plan view of a 1-G bit DRAM 340 which is one example of a semiconductor integrated circuit in accordance with the present invention. This DRAM 340 is composed of four banks of memory arrays 341 to 344 and has bonding pads 345 arranged in the center. A Y-decoder and a main amplifier are mounted on each memory array, as shown by reference numerals 351 to 354. A word driver 355A, an X-decoder 356A, a word driver 357A are shared by the memory arrays 341, 342, and a word driver 355B, an X-decoder 356B, and a word driver 357B are shared by the memory arrays 343, 344.

Figure 52:
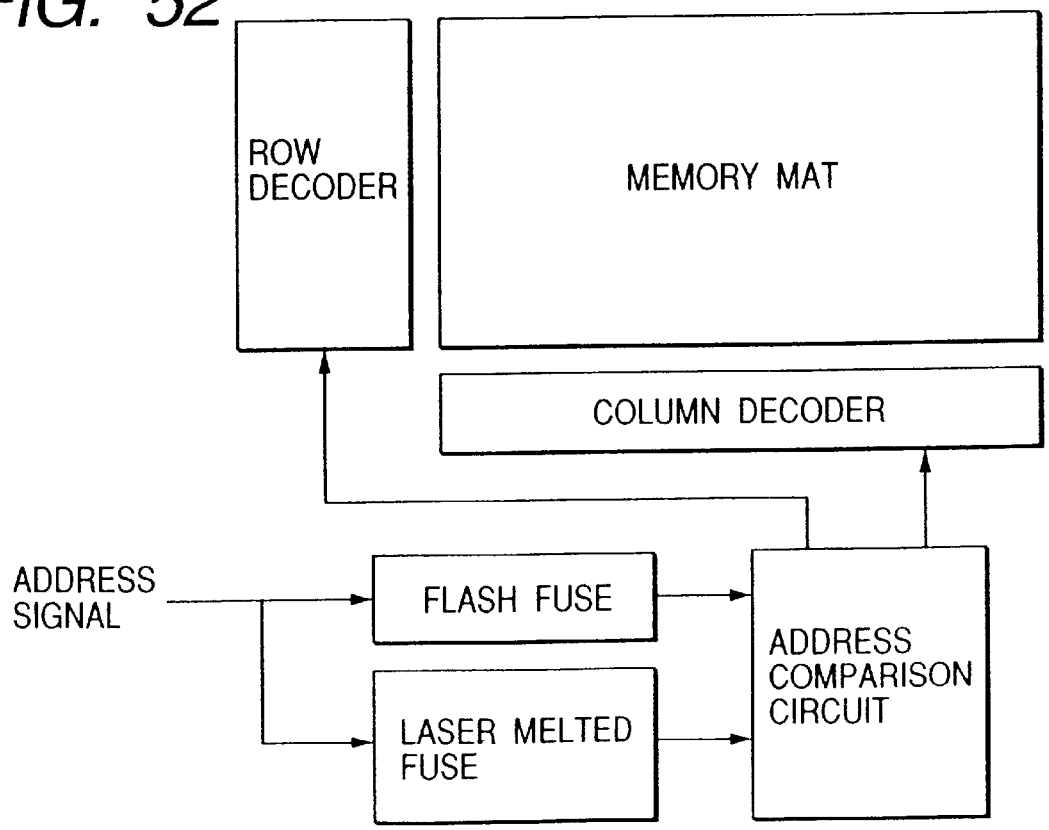
FIG. 52 is a block diagram to illustrate, in the connection of circuits, a relationship between a laser fuse and an electric fuse.

The recovery fuses including two sets of 2000 laser fuses designated by reference numerals 346, 347 and an electric fuse composed of a flash memory with 100 bits designated by a reference numeral 348 are arranged in the center. The relationship between the laser fuses 346, 347 and the electric fuse 348 in a circuit connection, for example, is that between a Flash fuse and a laser-melted fuse in FIG. 52.

Figure 17:
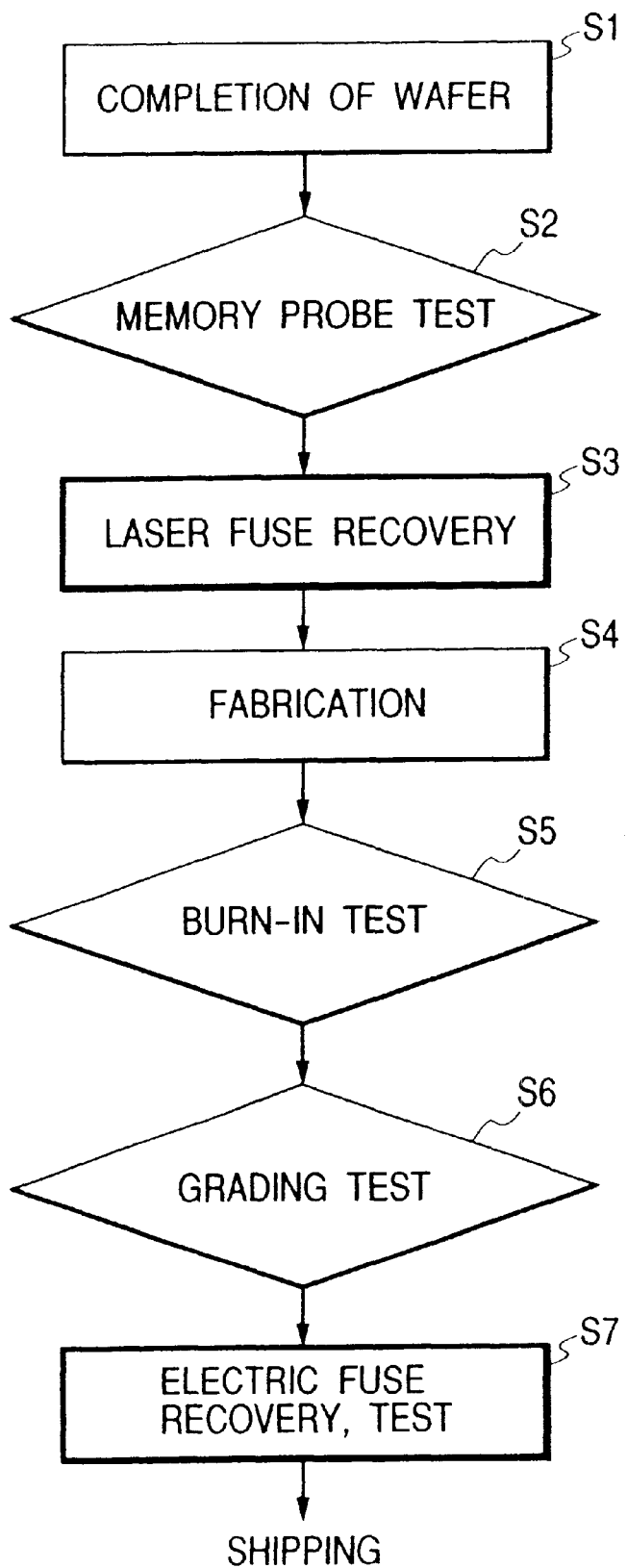
FIG. 17 is a flow chart to show a testing process of the DRAM shown in FIG. 16.

In FIG. 17, there is shown a testing flow chart of the above DRAM 340. After a wafer is completed (Si), first, a memory test is done on a chip by using a memory tester (S2). To replace a detected faulty bit with a redundant bit or a redundant mat, a laser fuse recovery is conducted (S3). Next, the DRAM 340 is fabricated in a predetermined package (S4) and is subjected to a burn-in test of an operation test, in which temperature and power voltage are accelerated (SS), and a grading test (S6). If a fault such as faulty refresh happens in the memory cell of the DRAM 340 in this burn-in test (SS), recovery information is written into the electric fuse 348 made of a flash memory, as a second recovery by the electric fuse, whereby a faulty bit is replaced by a redundant bit. Then, after this electric fuse recovery, a memory test is conducted on the recovered address (S7). Then, the system LSI is shipped.

Flash Memory

In FIG. 18 to FIG. 21, the cross-sectional structural views of a flash memory, which is one example of a semiconductor integrated circuit in accordance with the present invention, are illustrated for each stage of a manufacturing process.

Figure 18:
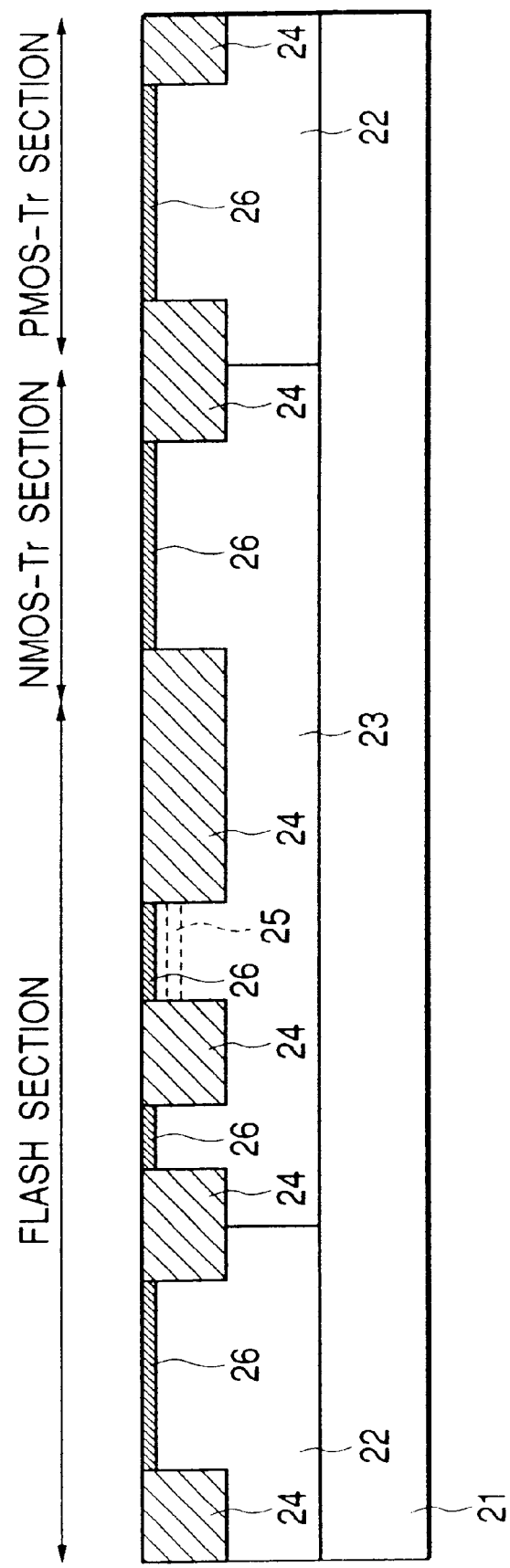
FIG. 18 is a first cross-sectional structural view to illustrate a manufacturing process of a flash memory which is one example of a semiconductor integrated circuit in accordance with the present invention.

To begin with, as shown in FIG. 18, a trench type element isolating region 24 having a depth of 300 nm is formed on a p-type semiconductor substrate 21, and there are formed an n-type semiconductor region 22 which is to be a control gate of a flash memory (flash section) and on which a p-type channel MIS transistor (PMOS-Tr) is to be formed and a p-type semiconductor region 23 on which an n-type channel MIS transistor (NMOS-Tr) is to be formed, a gate oxide film 26 having a thickness of 7 nm is grown, and then an n-type impurity layer 25 for adjusting an initial threshold voltage is introduced only into the read MIS transistor section of the flash memory.

Figure 19:
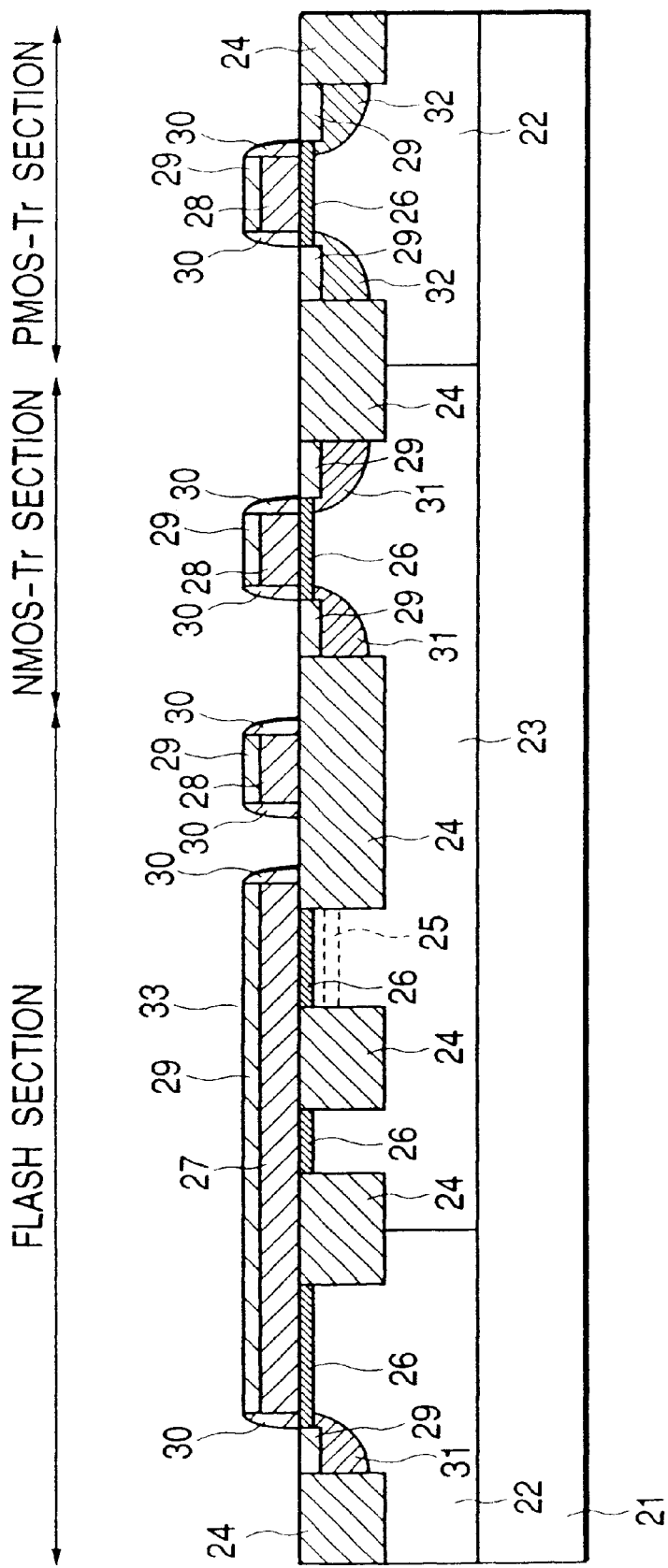
FIG. 19 is a second cross-sectional structural view to illustrate a manufacturing process of a flash memory which is one example of a semiconductor integrated circuit in accordance with the present invention.

Next, as shown in FIG. 19, a polysilicon film 27 is deposited which has a thickness of 200 nm and is to be the gate electrode of a peripheral circuit transistor and the floating gate of the flash memory, and a side spacer 30 formed of silicon nitride film having a thickness of 80 nm is formed. Then, the surface region of the n-type semiconductor region 22 which is to be the control gate of the flash memory cell, an n-type diffusion layer 31 which is to be the source and drain regions of the n-type channel MIS transistor NMOS-Tr, and a p-type diffusion layer 32 which is to be the source and drain regions of the p-type channel MIS transistor PMOS-Tr are formed, and a cobalt suicide film 29 having a thickness of 20 nm is formed selectively on the surface region of the above-mentioned polysilicon film 27, the surface region of the n-type diffusion layer 31, and the p-type diffusion layer 32.

Figure 20:
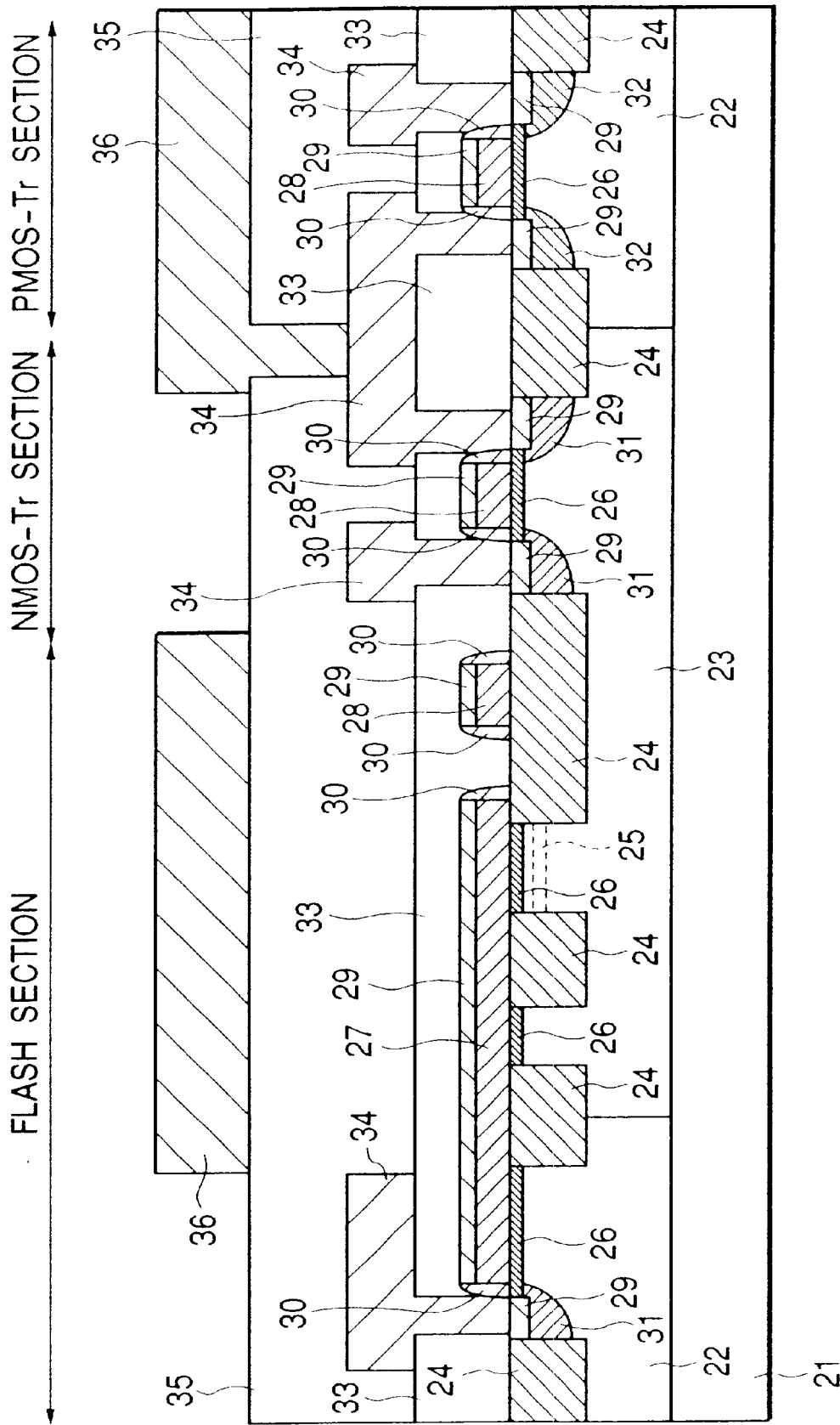
FIG. 20 is a third cross-sectional structural view to illustrate a manufacturing process of a flash memory which is one example of a semiconductor integrated circuit in accordance with the present invention.

Further, as shown in FIG. 20, a first interlayer insulating film 33 is deposited, a contact hole is made, a first metal wiring layer 34 is deposited, and a predetermined pattern is formed thereon. Further, a second interlayer insulating film 35 is deposited, a first through hole is made, a second metal wiring layer 36 is deposited, and a pattern is formed thereon.

Figure 21:
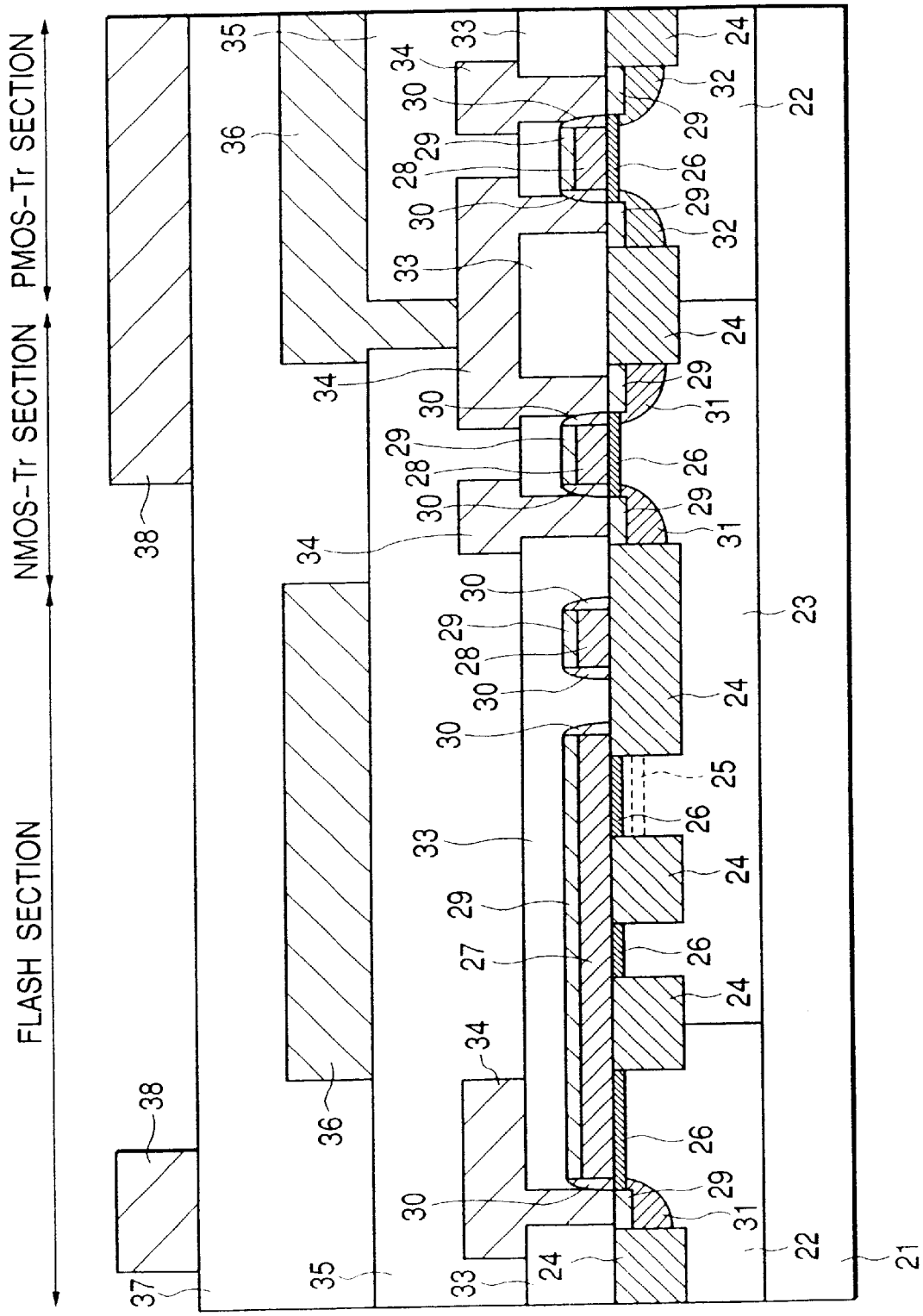
FIG. 21 is a fourth cross-sectional structural view to illustrate a manufacturing process of a flash memory which is one example of a semiconductor integrated circuit in accordance with the present invention.

Finally, as shown in FIG. 21, a third interlayer insulating film 37 is deposited, a second through hole is made, a third metal wiring layer 38 is deposited, and a pattern is formed thereon. Then, a final passivation film is deposited and an opening is made in a bonding pad. This is the end of the manufacturing process of the flash memory.

Cell Structure with High Reliability

Figure 22:
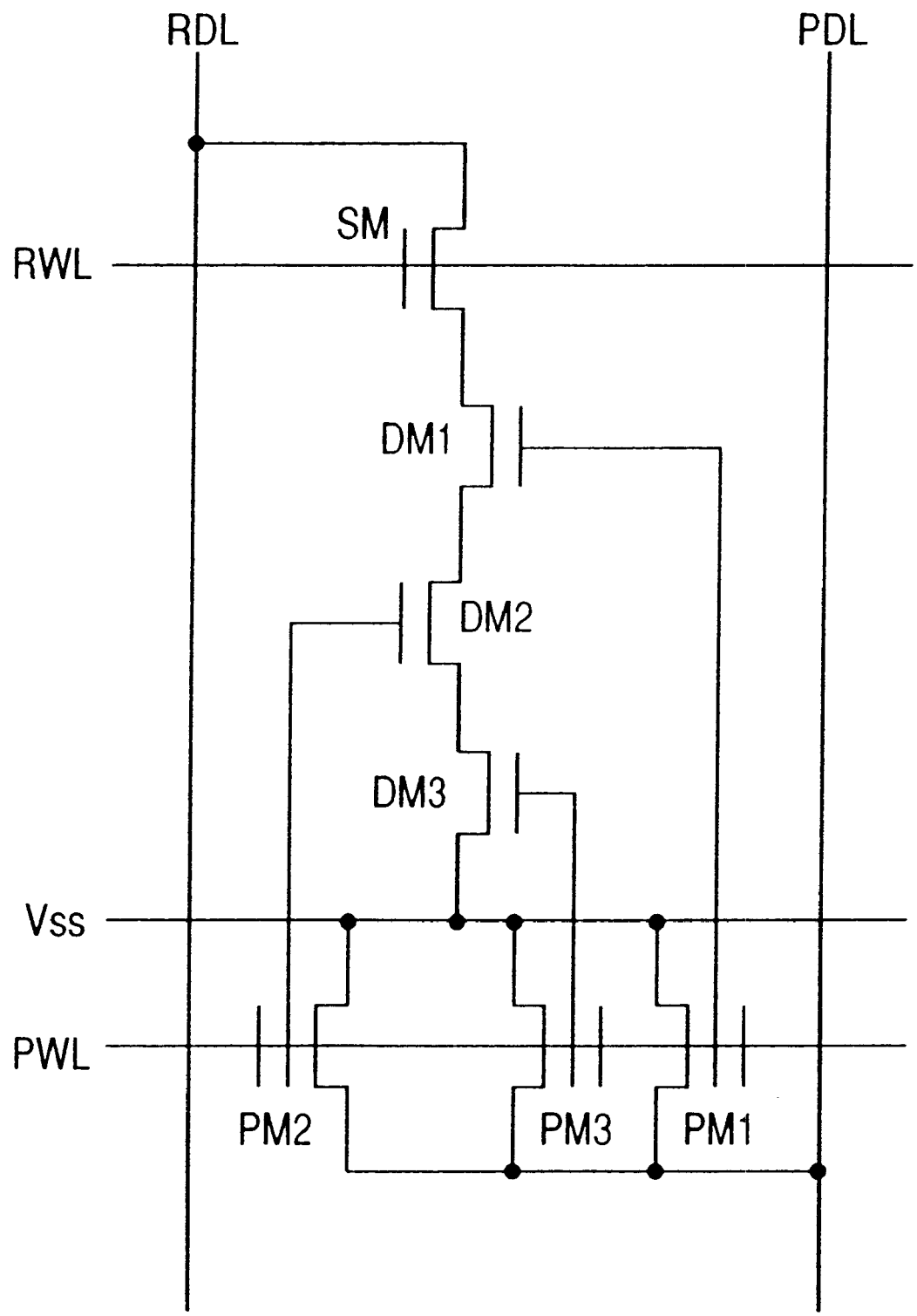
FIG. 22 is an equivalent circuit diagram illustrating a highly reliable flash memory cell which is another example of a non-volatile information memory cell included by a semiconductor integrated circuit in accordance with the present invention.

In FIG. 22, there is illustrated an equivalent circuit diagram of a flash memory cell with high reliability, which is another example of a non-volatile information memory cell formed as a semiconductor integrated circuit in accordance with the present invention. In the memory cell shown in the drawing, the respective floating gates of three non-volatile memory elements PM1, PM2, PM3, which are connected in parallel to each other, are arranged as the gate electrodes of read MIS transistors DM1, DM2, DM3. The three read MIS transistors DM1, DM2, DM3 are connected in series to each other to establish an OR logic. By selecting a write data line PDL and a write word line PWL, the write operation is performed to the three non-volatile memory cells PM1, PM2, PM3 at the same time to hold electrons in all the floating gates, and the three read MIS transistors DM1, DM2, DM3 are cut off at the same time. In the case where charges happen to leak, in the state where charges are held, due to the faults of the gate oxide film and the moisture introduced from the outside, even if the above-mentioned faults are encountered in two elements out of the three non-volatile memory cells PM1, PM2, PM3, the memory cell does not become faulty because a read current path is held cut off. This constitution can further improve the performance of holding data for a long time and realize a remarkable reduction in the rate of faulty reading.

Small Cell Structure

Figure 23:
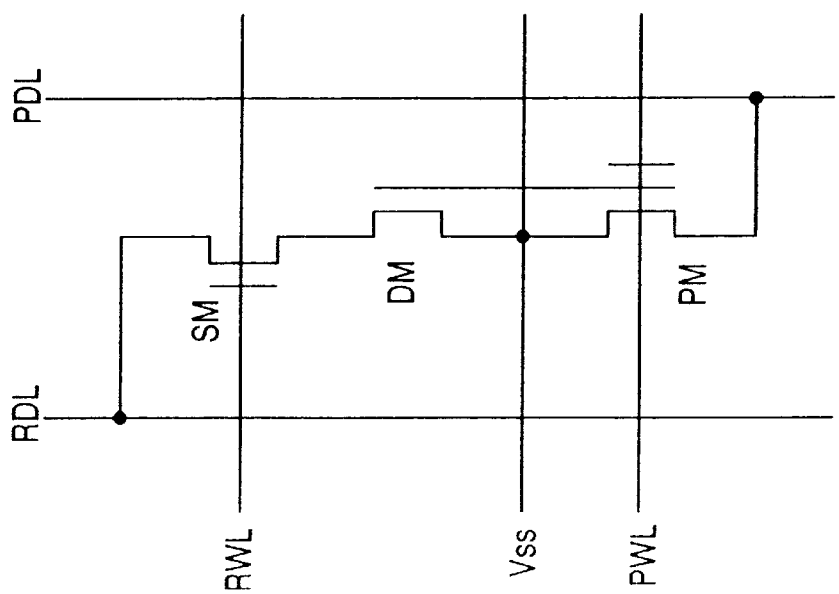
FIG. 23 is an equivalent circuit diagram illustrating a small area flash memory cell which is a further example of a non-volatile information memory cell included by a semiconductor integrated circuit in accordance with the present invention.

In FIG. 23, there is illustrated an equivalent circuit diagram of a small area flash memory cell, which is still another example of a non-volatile information memory cell forced as a semiconductor integrated circuit in accordance with the present invention. In the memory cell shown in the drawing, the floating gate of a non-volatile memory cell PM is arranged as the gate electrode of a read MIS transistor DM, and hence, the cell area can be reduced to a minimum. This is a measure against a charge gain. Further, in order to ensure charge holding characteristics, in other words, to increase the resistance to data retention, the gate oxide film to be used is formed to a thickness of 10 nm or more.

Voltage Sense Type Cell

Figure 24:
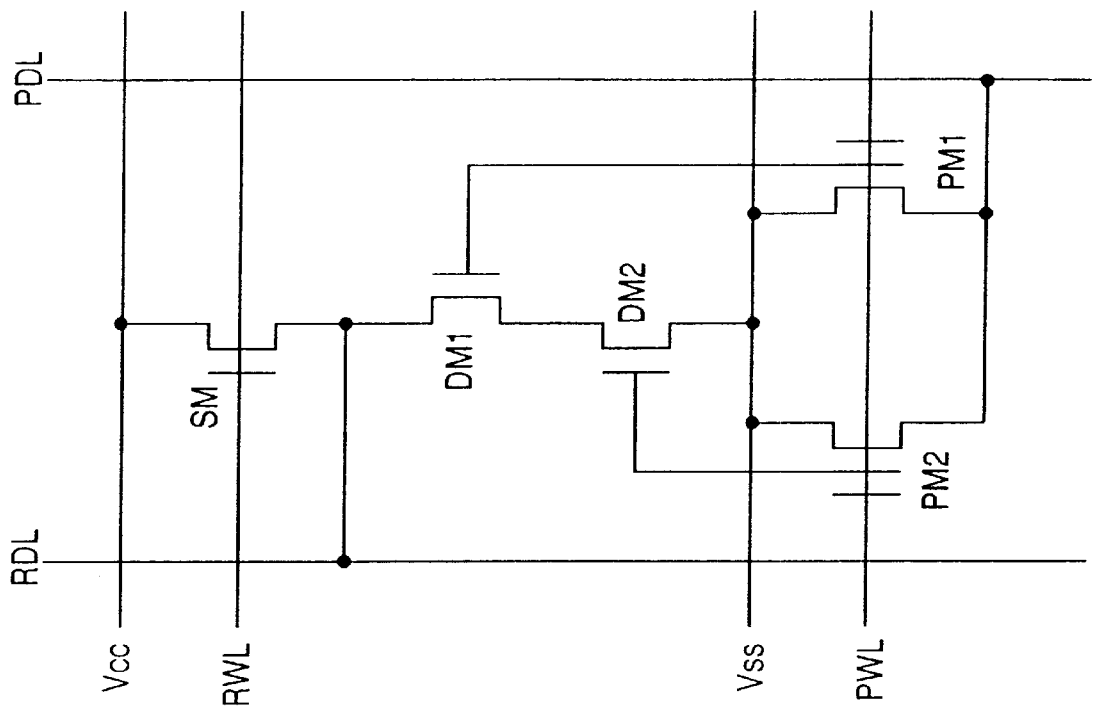
FIG. 24 is an equivalent circuit diagram illustrating a voltage sense type flash memory cell which is still another example of a non-volatile information memory cell included by a semiconductor integrated circuit in accordance with the present invention.

In FIG. 24, there is illustrated an equivalent circuit diagram of a voltage sense type flash memory cell which is still another example of a non-volatile information memory cell formed as a semiconductor integrated circuit in accordance with the present invention. In the memory cell shown in the drawing, the respective floating gates of two non-volatile memory elements PM1, PM2 connected in parallel to each other are arranged as the gate electrodes of read MIS transistors DM1, DM2 connected in series to each other and a read MIS transistor DM1 is arranged in series between the read MIS transistors DM1 and a power source line Vcc. A read operation is performed by selecting a read word line RWL and by sensing voltage produced on a read data line RDL. That is, a change in the electric potential of the read data line RDL is detected by a voltage detection type sense amplifier (got shown) or the like according to whether the read MIS transistors DM1, DM2 are in the cut-off state or not.

Metal Cover Type Memory Cell

Figure 25:
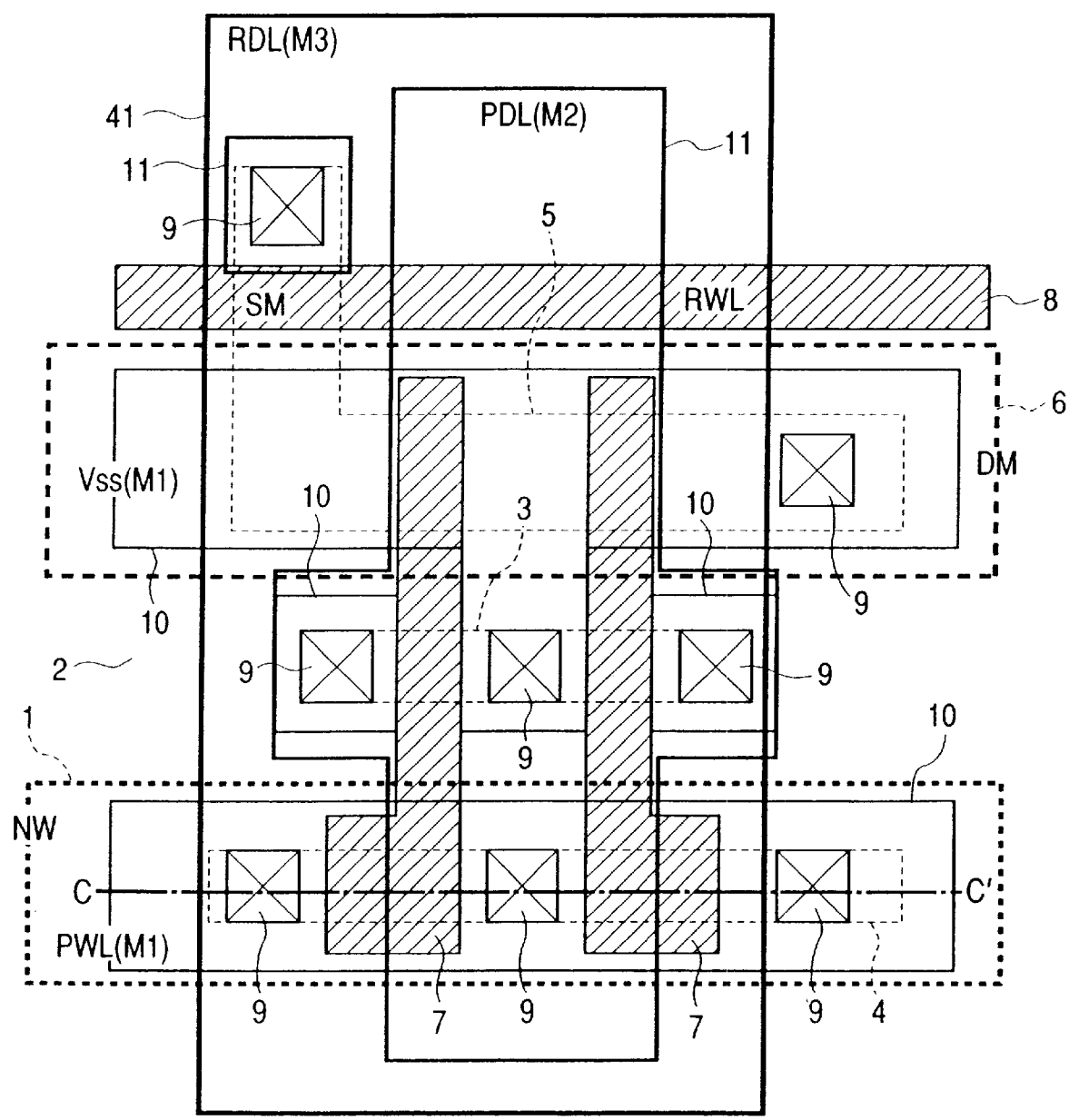
FIG. 25 is a plan view illustrating the layout of a metal cover type flash memory cell which is a still further example of a non-volatile information memory cell included by a semiconductor integrated circuit in accordance with the present invention.
Figure 26:
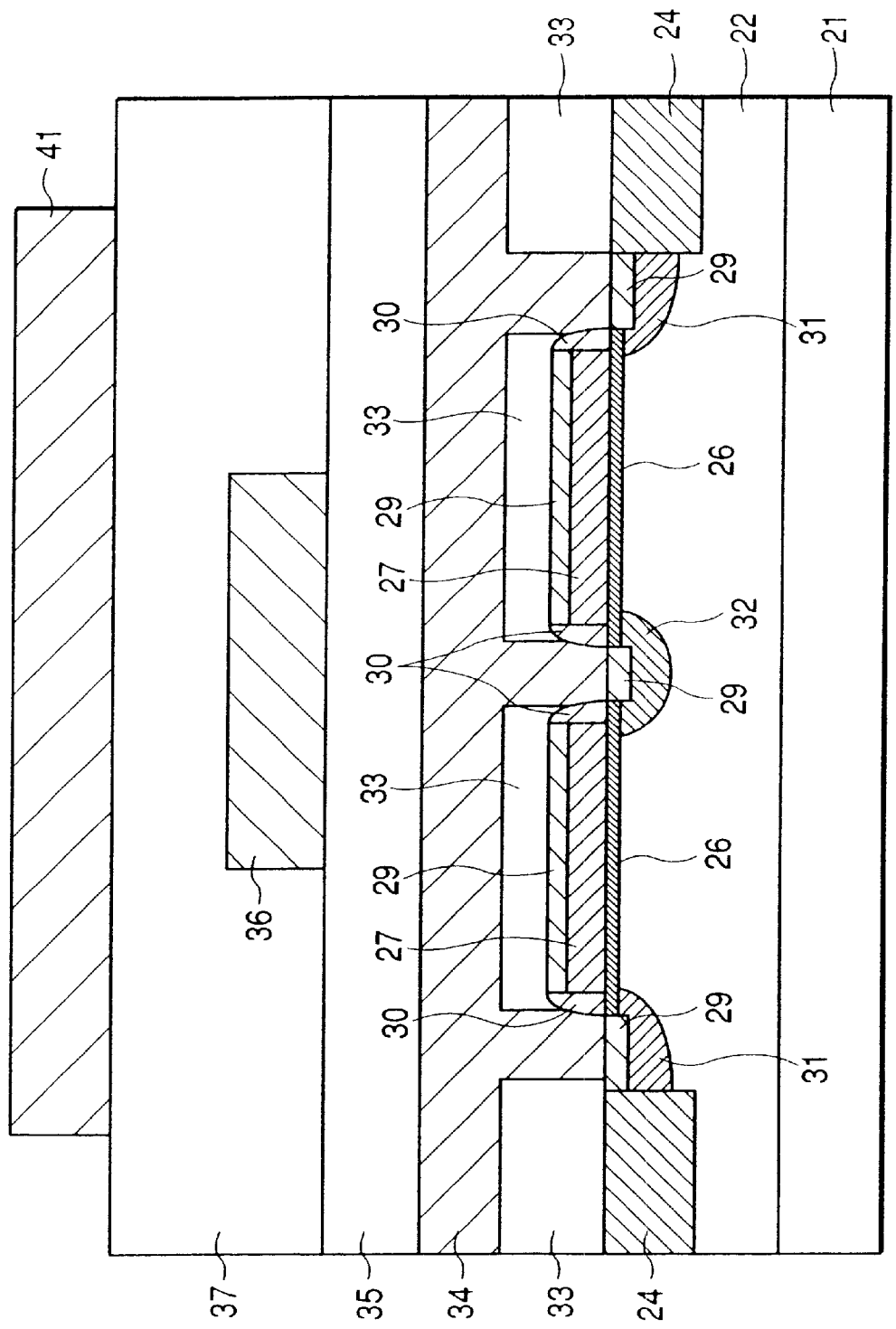
FIG. 26 is the cross-sectional view taken on a line C–C' in FIG. 25.

In FIG. 25, there is illustrated a plan layout of a metal cover type flash memory cell, which is still another example of a non-volatile information memory cell formed as a semiconductor integrated circuit in accordance with the present invention. Also, in FIG. 26, there is illustrated the cross sectional view taken on a line C–C' in FIG. 25. In the memory cell shown in the drawing, a third metal wiring layer 41 constituting a read data line RDL is arranged such that it covers floating gate regions 7, 27 arranged below to prevent the held charges from being excited and emitted from the floating gates by the injection of x-rays, radioactive rays, light or the like to further improve the performance of holding data for a long time.

Figure 27:
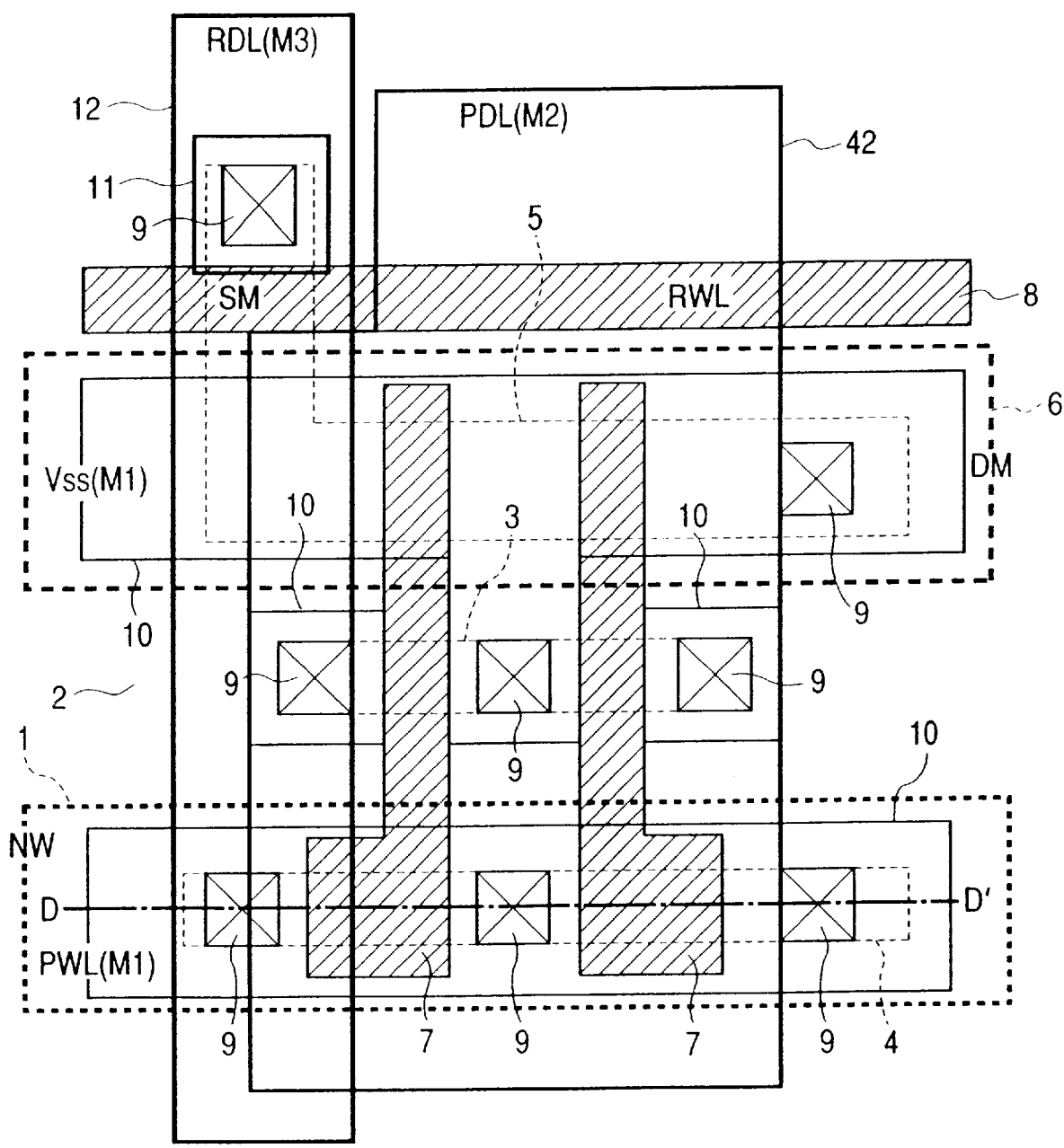
FIG. 27 is a plan view illustrating the layout of a metal cover type flash memory cell which is still another example of a non-volatile information memory cell included by a semiconductor integrated circuit in accordance with the present invention.
Figure 28:
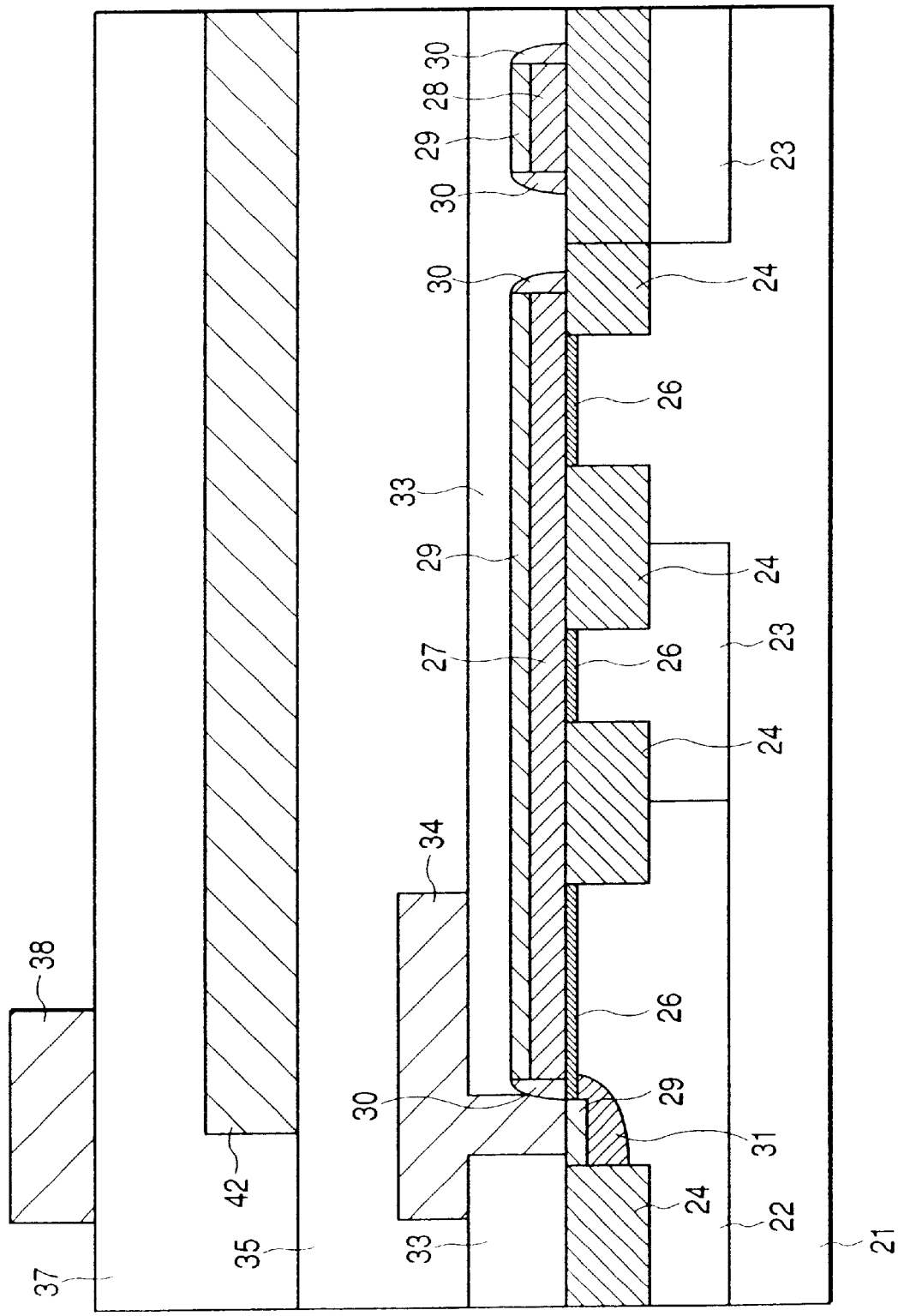
FIG. 28 is the cross-sectional view taken on a line D–D' in FIG. 27.

In FIG. 27, there is illustrated a plan layout of a metal cover type flash memory cell, which is still another example of a non-volatile information memory cell formed as a semiconductor integrated circuit in accordance with the present invention. Also, in FIG. 28, there is illustrated the cross sectional view taken on a line D–D' in FIG. 27. In the memory cell shown in the drawing, a second metal wiring layer 42 constituting a write data line PDL is arranged such that it covers floating gate regions 7, 27 arranged below to prevent the held charges from being excited and emitted from the floating gates by the injection of x-rays, radioactive rays, light or the like to further improve a performance of holding data for a long time.

PMOS Cell

Figure 29:
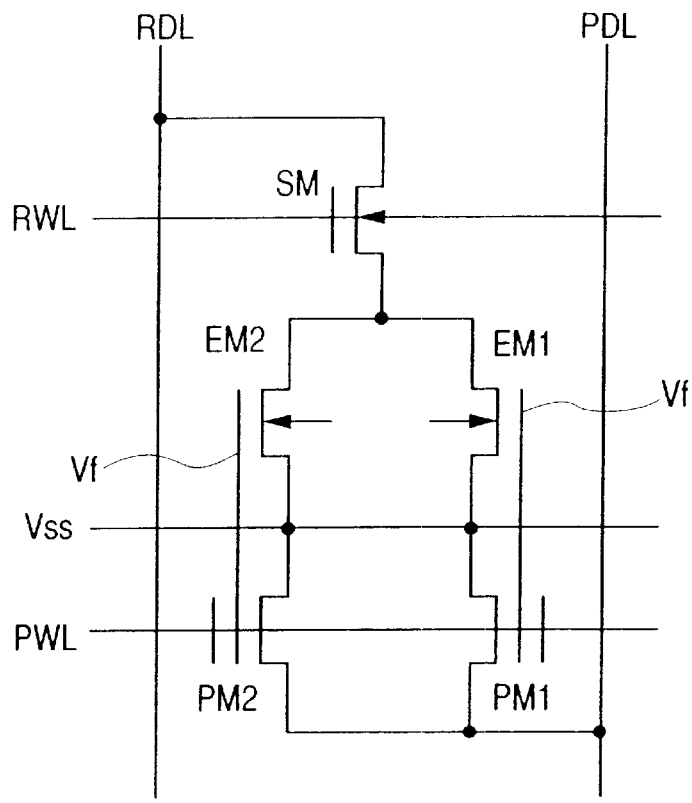
FIG. 29 is an equivalent circuit diagram illustrating a flash memory cell employing a p-channel type MIS transistor which is a still further example of a non-volatile information memory cell included by a semiconductor integrated circuit in accordance with the present invention.
Figure 30:
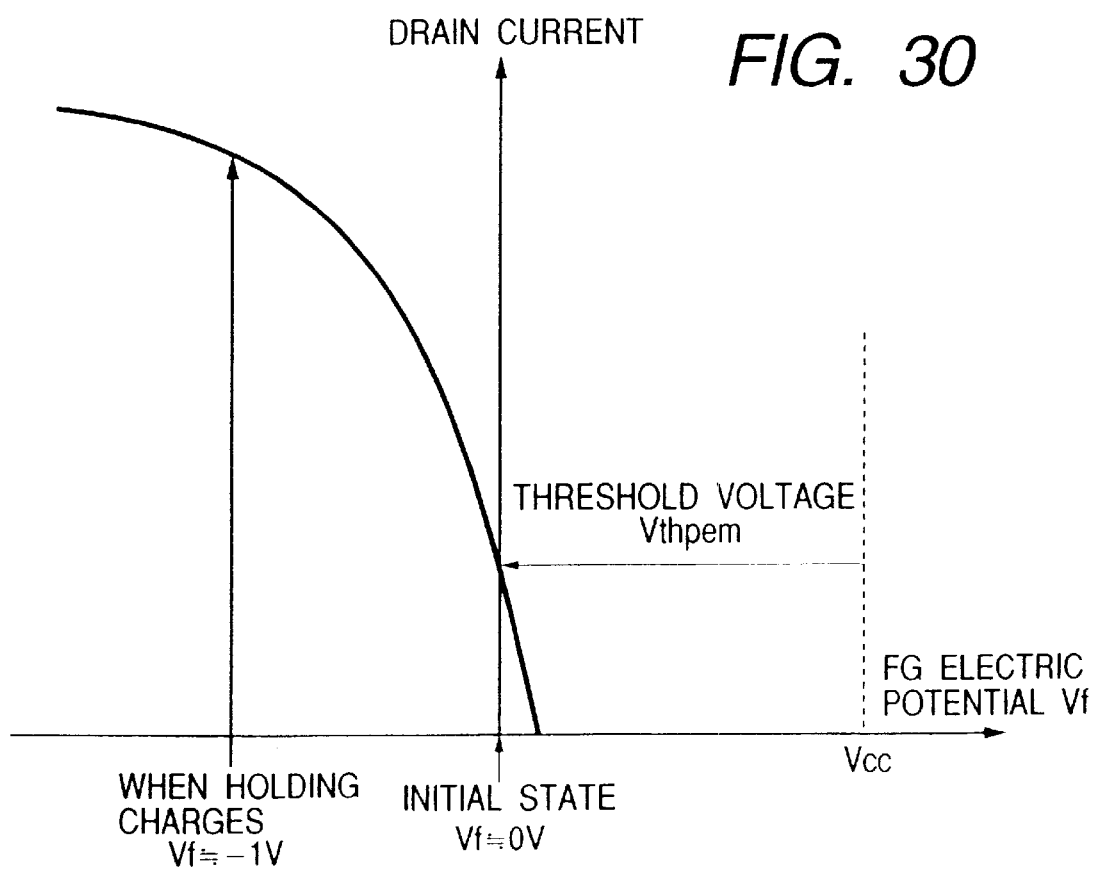
FIG. 30 is a voltage-current characteristic plot relating to read MIS transistors EM1, EM2.
Figure 31:
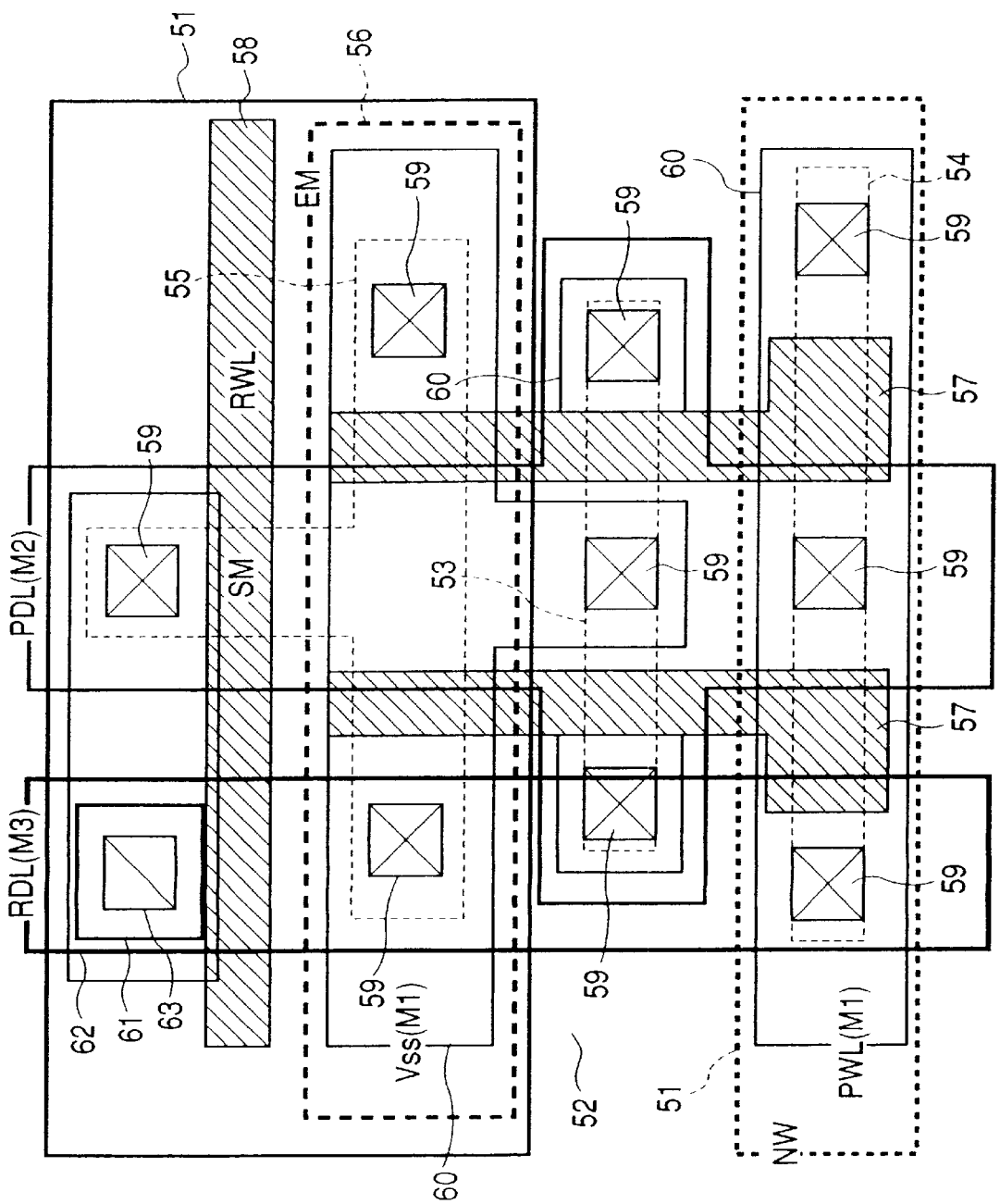
FIG. 31 is a plan view showing the layout of the memory cell in FIG. 29.

In FIG. 29, there is illustrated an equivalent circuit diagram of a flash memory cell using a p-channel type MIS transistor, which is still another example of a non-volatile information memory cell formed as a semiconductor integrated circuit in accordance with the present invention. In the memory cell shown in the drawing, read MIS transistors EM1, EM2 are p-channel type MIS transistors and the read MIS transistors EM1, EM2 are connected in parallel to each other so as to constitute an OR logic. In the voltage-current characteristics shown in FIG. 30, the initial threshold voltage (Vthpem) of the read MIS transistors EM1, EM2 are normally off in the initial state and become on when electrons are held in the floating gate. Therefore, even if the charges in one of the floating gates leak in the state where charges are held to produce faulty conditions, the memory cell does not produce faulty reading because a read current path is held at the ON state. Therefore, this can improve the performance of holding data for a long time and realize a reduction in the rate of faulty reading. In FIG. 31, there is illustrated a plane layout of the memory cell in FIG. 29.

2 NAND Type Cell

Figure 32:
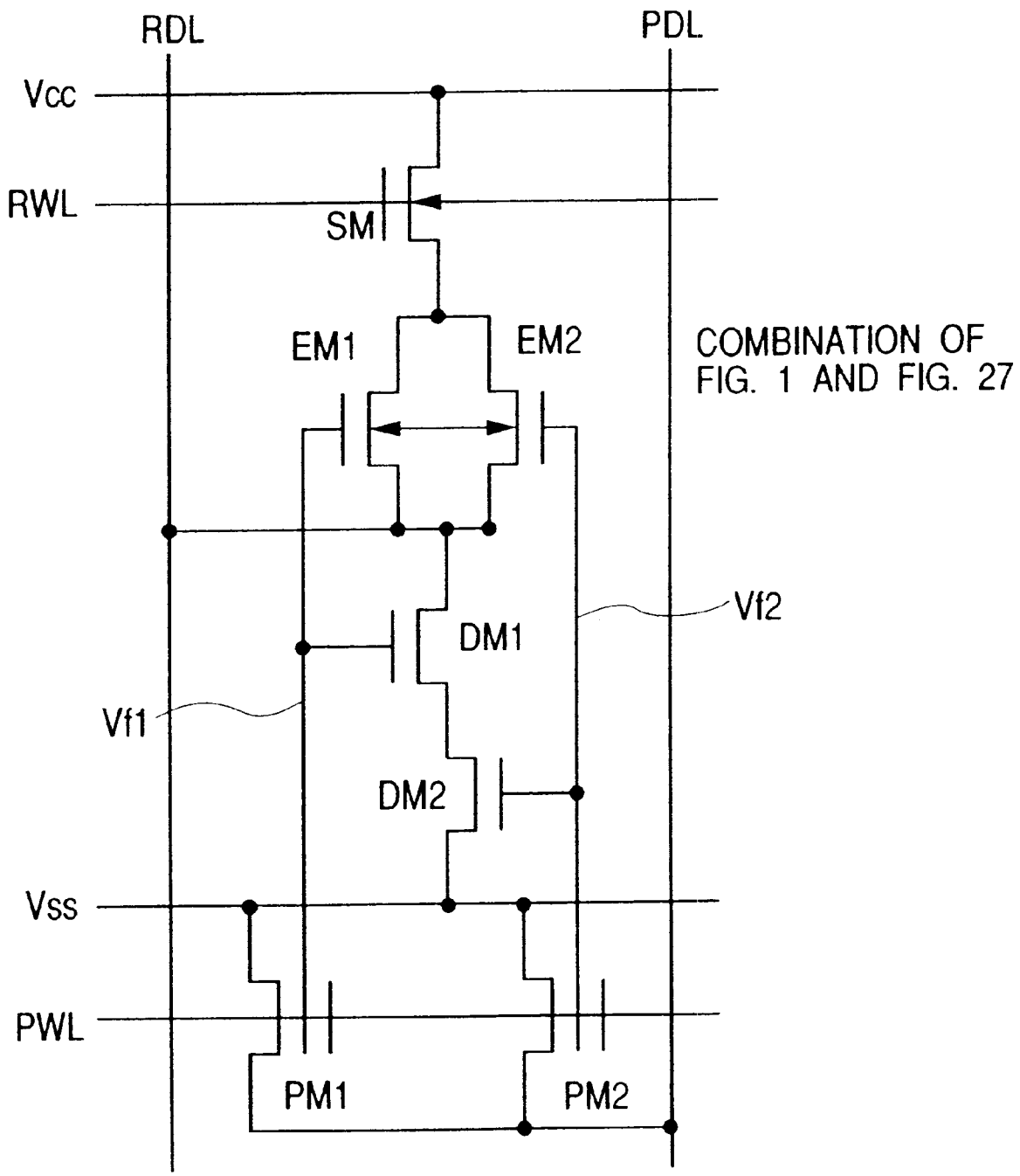
FIG. 32 is an equivalent circuit diagram illustrating a 2 NAND type flash memory cell which is still another example of a non-volatile information memory cell included by a semiconductor integrated circuit in accordance with the present invention.
Figure 33:
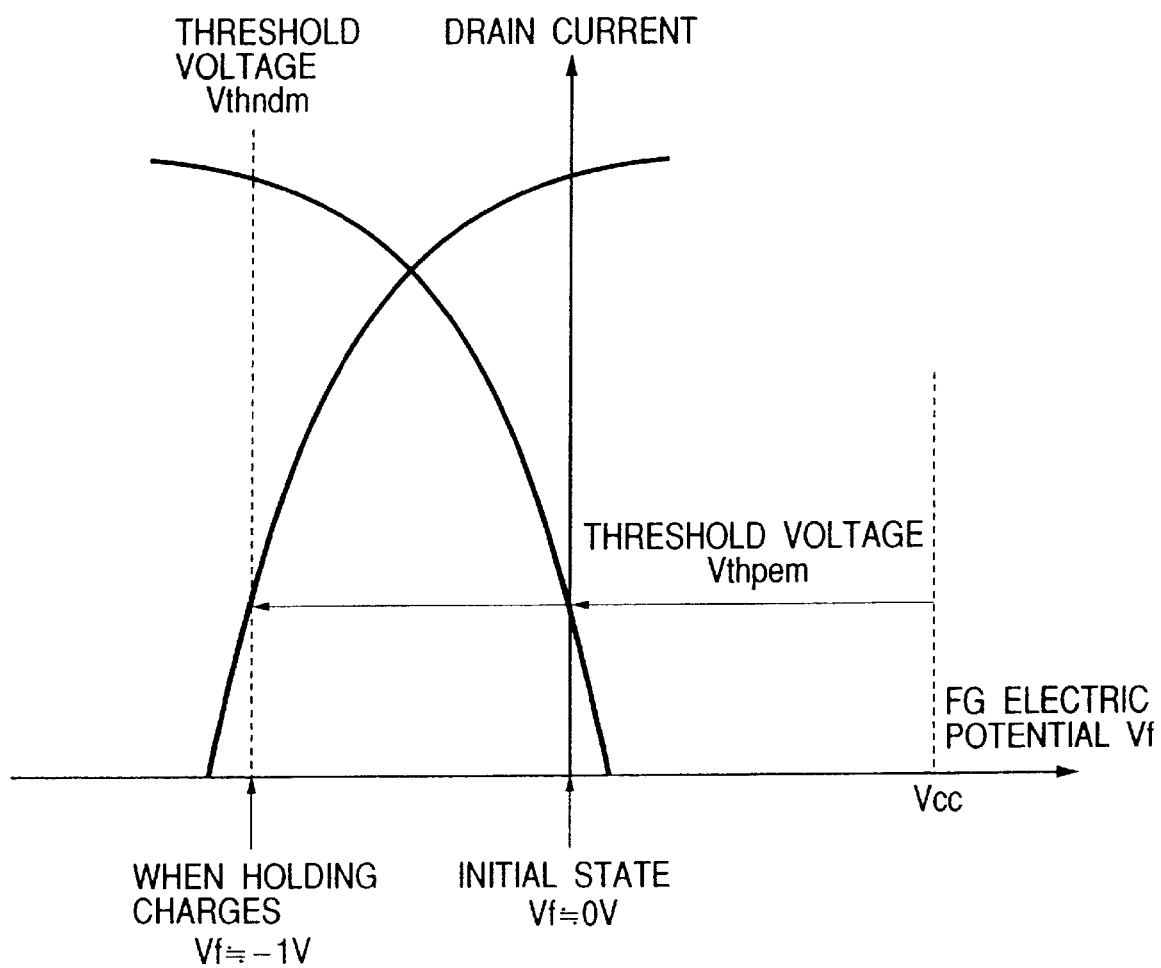
FIG. 33 is a voltage-current characteristic plot of a MIS transistor used for the 2 NAND type flash memory in FIG. 32.
Figure 34:
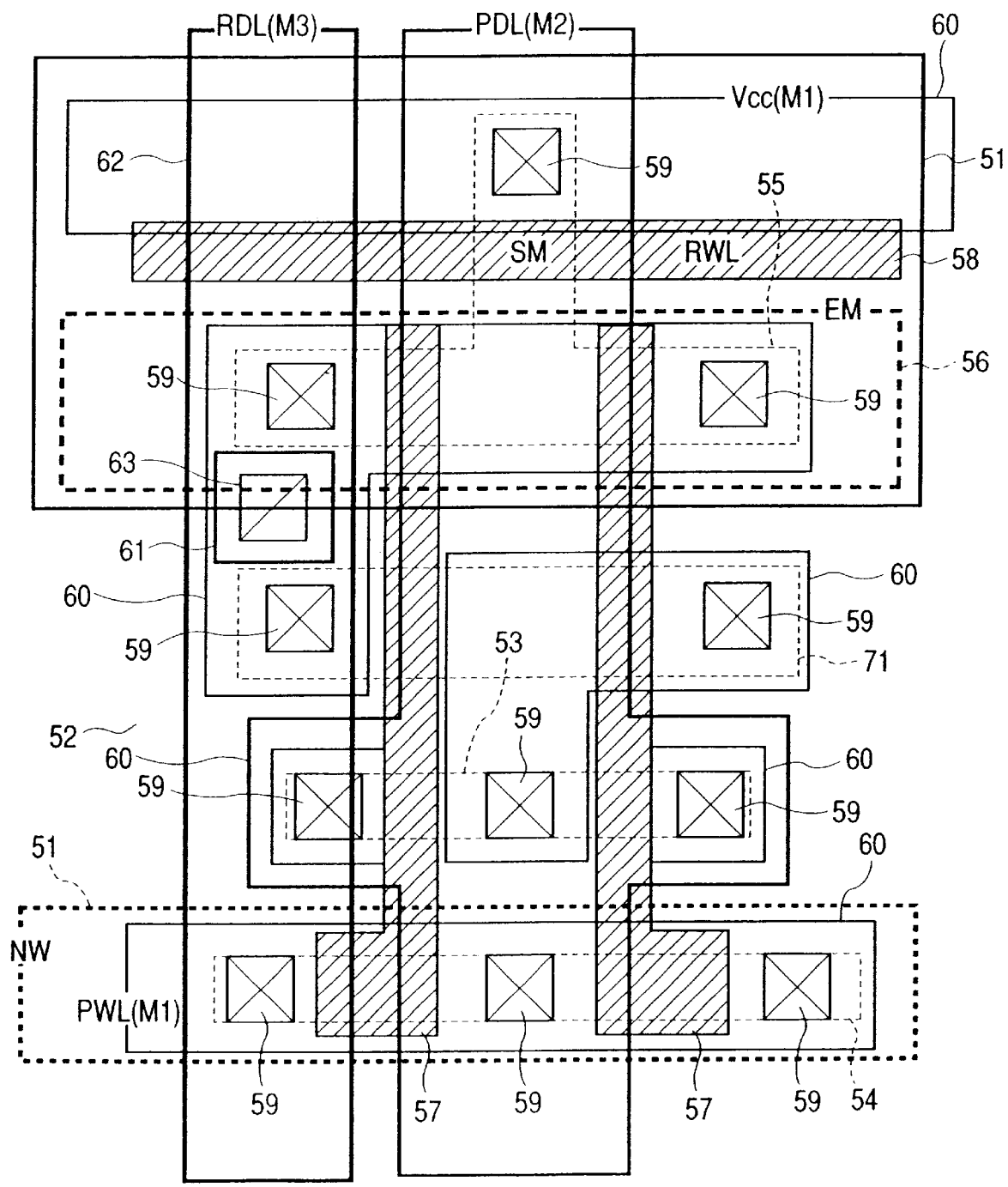
FIG. 34 is a plan view showing the layout of the memory cell in FIG. 32.

In FIG. 32, there is illustrated an equivalent circuit diagram of a 2 NAND type flash memory cell, which is still another example of a non-volatile information memory cell formed as a semiconductor integrated circuit in accordance with the present invention. The memory cell shown in the drawing has a so-called 2 NAND logic whose read circuit section is constituted by two p-channel type MIS transistors EM1, EM2, which are connected in parallel to each other, and two n-channel type MIS transistors DM1, DM2 which are connected in series to each other. Since a read data line is connected to the junction of the p-channel type MIS transistors EM1, EM2 and the n-channel type MIS transistors DM1, DM2, that is, the output of 2 NAND, it can produce approximately a power source voltage amplitude as a data line voltage when a read operation is performed, which eliminates the need for a sense amplifier. The initial threshold voltages of the p-channel type MIS transistors EM1, EM2 and the n-channel type MIS transistors DM1, DM2 are set in such a way that they are symmetrically on or off according to whether charges are injected into or ejected from the floating gate, as is clear from the voltage-current characteristics shown in FIG. 33. As is clear from FIG. 34 showing the plan layout of the memory cell in FIG. 32, this memory cell has a large cell area because it has many constituent elements, but it has an advantage of eliminating the need for a sense amplifier and does not always increase the memory cell module area.

Self-Learning Type 2 NAND Gate

Figure 35:
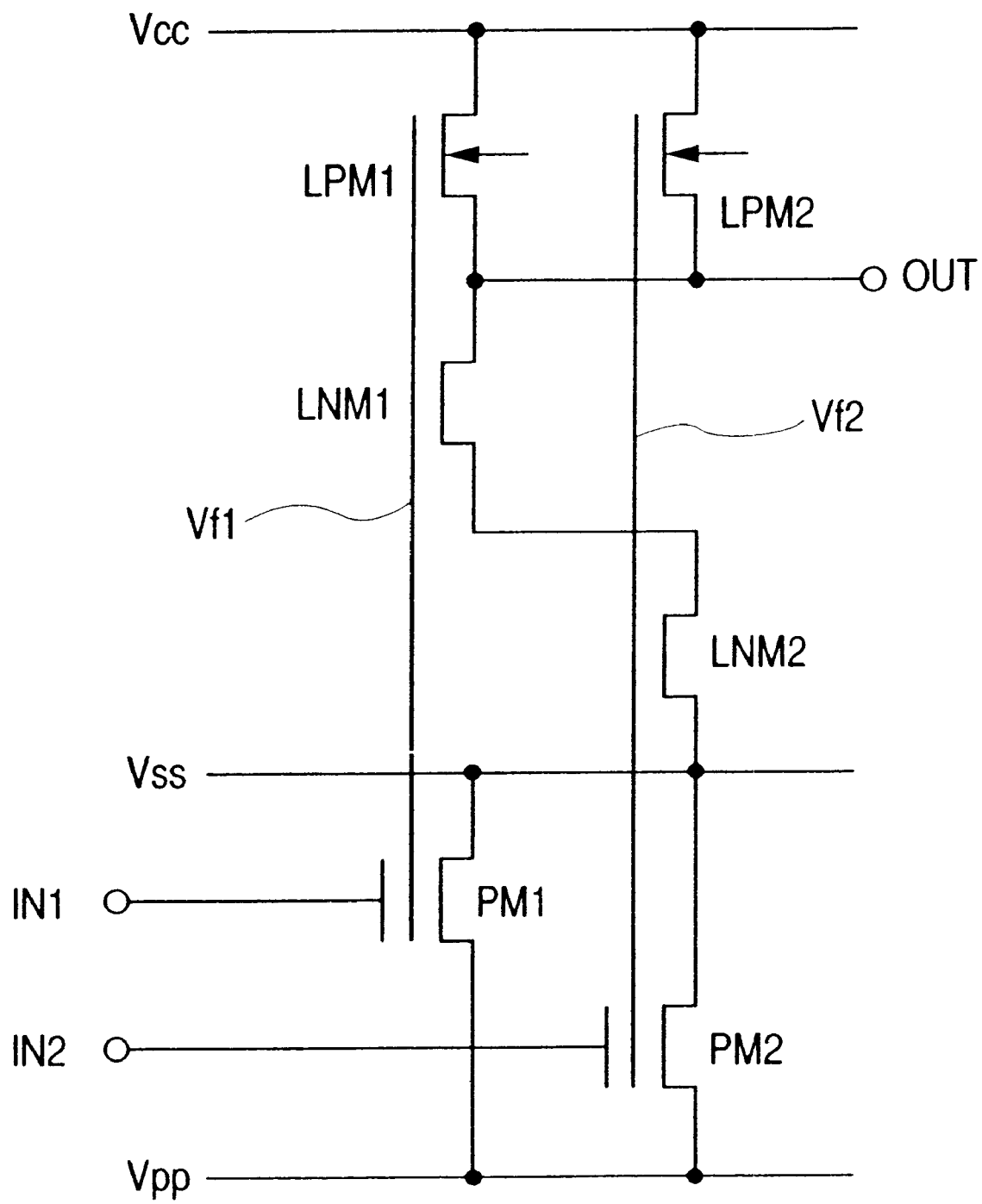
FIG. 35 is a circuit diagram illustrating a self-learning type 2 NAND gate which is a still another example of a non-volatile information memory cell included by a semiconductor integrated circuit in accordance with the present invention.

In FIG. 35, there is illustrated a circuit diagram of a self-learning type 2 NAND gate, which is still another example of a non-volatile information memory cell formed as a semiconductor integrated circuit in accordance with the present invention. The 2 NAND gate shown in the drawing has two p-channel type MIS transistors LPM1, LPM2 connected in parallel to each other between a power source line Vcc and an output OUT and two n-channel type MOS transistors LNM1, LNM2 connected in series to each other between the non-volatile memory element PM2 and the p-channel type MIS transistor LPM1. The gates of the MIS transistors LPM2, LNM2 are common to the floating gate of the non-volatile memory element PM2 and the gates of the MIS transistors LPM1, LNML are common to the floating gate of the non-volatile memory element PM1. The non-volatile memory elements PM1, PM2 are arranged in parallel between a source line Vss and a drain line Vpp. To the source line Vss there is applied the ground electric potential of the circuit and to the drain line Vpp there is applied a high voltage for writing.

Figure 36:
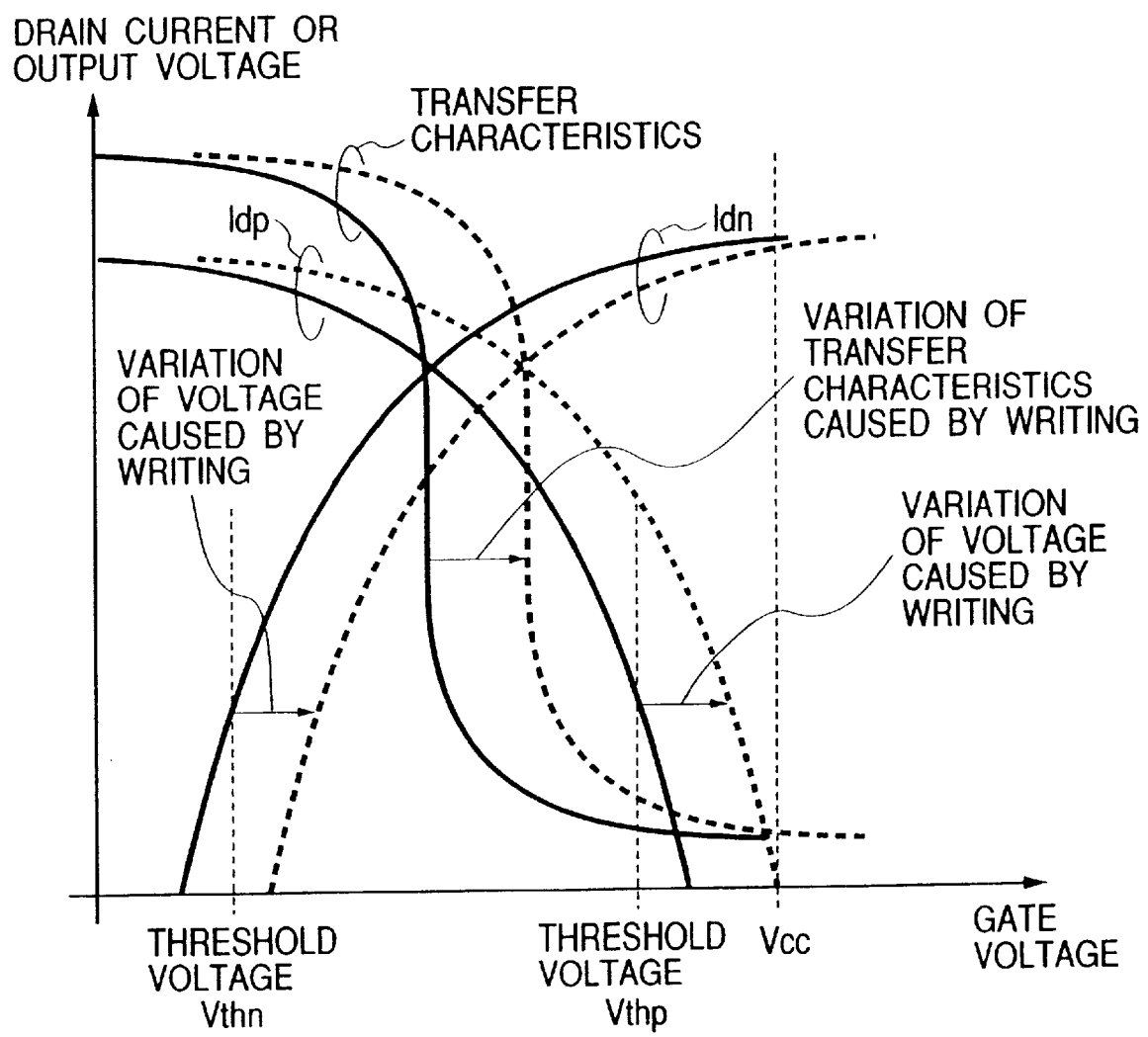
FIG. 36 is a signal transmission characteristic plot relevant to an input signal of the circuit in FIG. 35.
Figure 37:
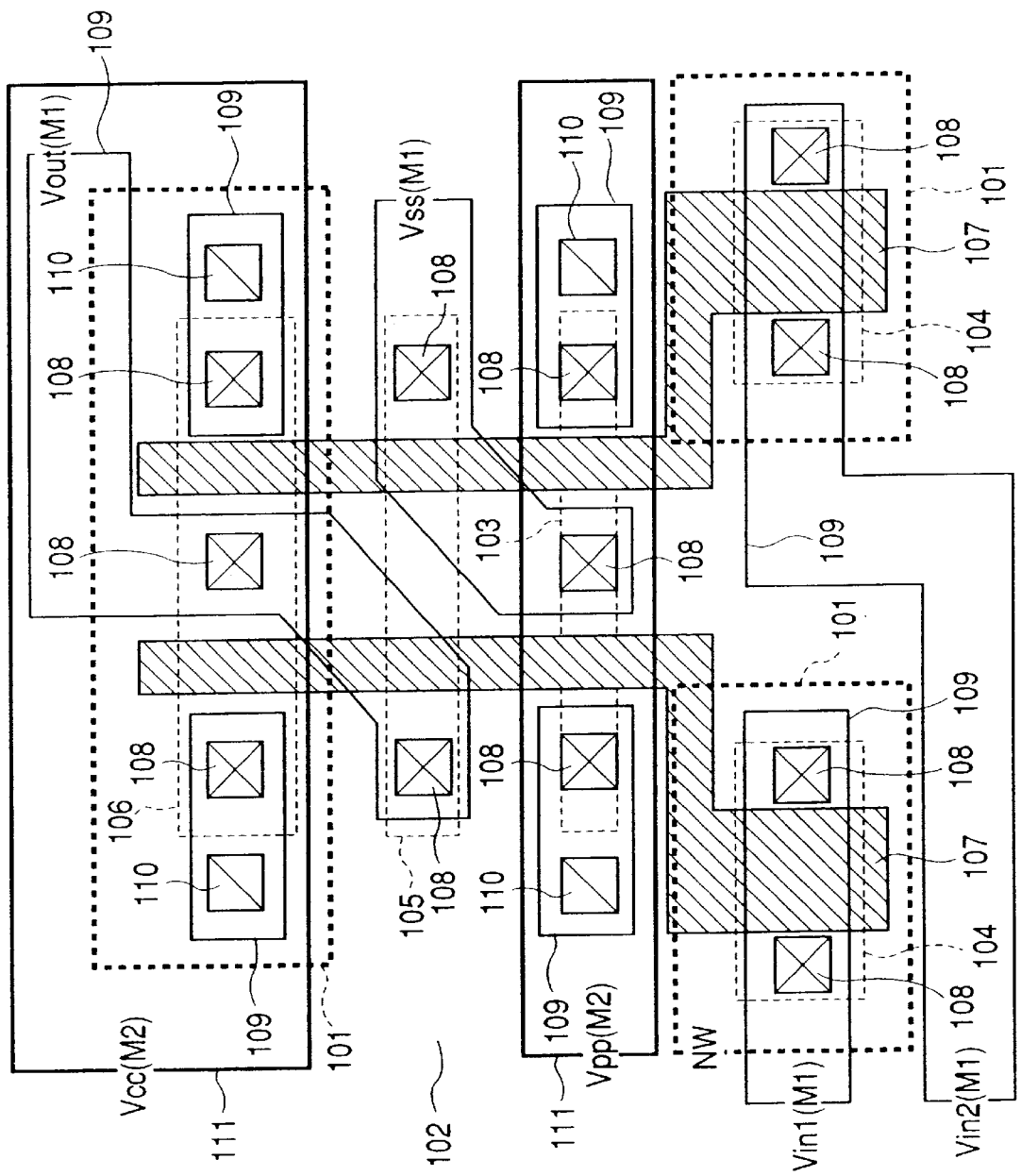
FIG. 37 is a plan view showing the layout of the memory cell-in FIG. 35.

The 2 NAND gate shown in the drawing can provide a NAND output OUT according to the input signals IN1, IN2. Further, since the source line of the non-volatile memory elements PM1, PM2 is connected to the ground voltage of the circuit and the drain line thereof is connected to the high voltage for writing, the 2 NAND gate has a self-learning function in which the signal transmission characteristic is shifted to the high level output side, as shown in FIG. 36, in proportion to the number of inputs of the high level pulse signals or the number of high level pulses of the input signals IN1, IN2. Here, in FIG. 37, there is illustrated the plane layout of the memory cell in FIG. 35.

Gate Oxide Film Degradation Monitor

Figure 38:
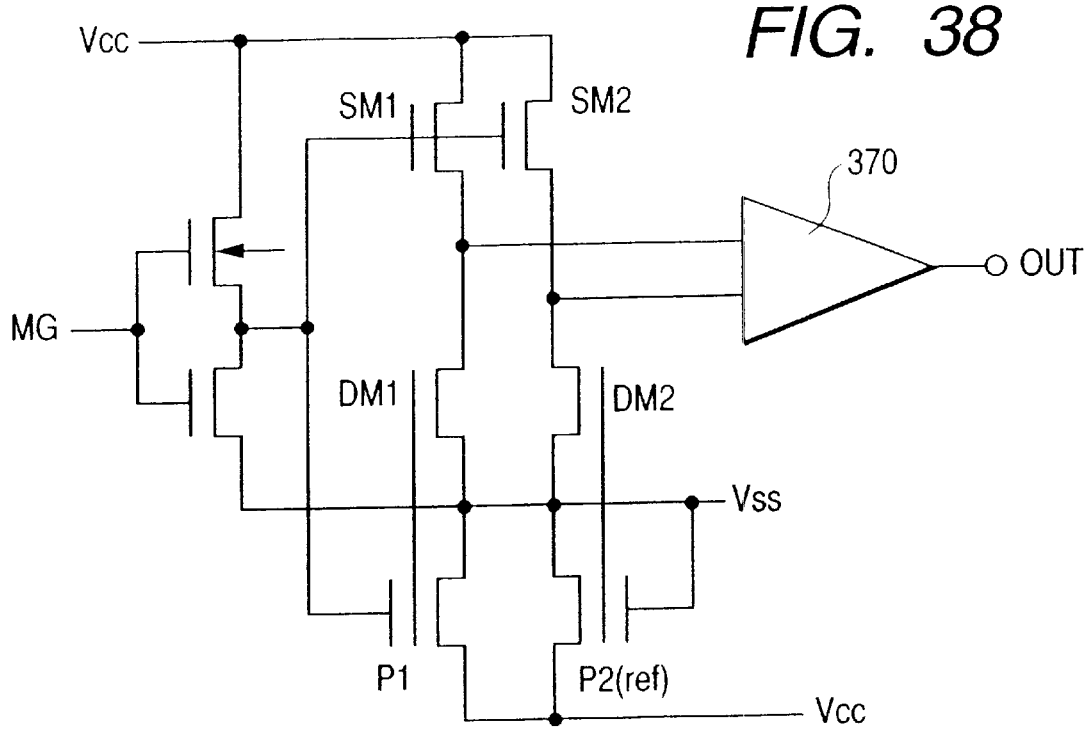
FIG. 38 is a circuit diagram of a circuit for monitoring the degradation of the gate oxide film to which a non-volatile information memory element in accordance with the present invention is applied.

In FIG. 38, there is illustrated the circuit diagram of a gate oxide film degradation monitor to which a non-volatile memory element in accordance with the present invention is applied. A read MIS transistor DM1 and a select MIS transistor SM1 are connected in series to a non-volatile memory element P1 and, similarly, a read MIS transistor DM2 and a select MIS transistor SM2 are connected in series to a non-volatile memory element P2. Each of the non-volatile memory elements P1, P2 is composed of a standard MIS transistor and a capacitor MIS transistor. The drain voltages of the read MIS transistors DM1, DM2 form the differential inputs to a differential amplifier 370. On the other hand, the control gate of the non-volatile memory element P2 is connected to the ground voltage Vss of the circuit. The control gate of the other non-volatile memory element P1 and the gate electrodes of the select MIS transistors SM1, SM2 are connected to the output of a complementary inverter circuit receiving a signal MG. The divided voltages of DM1, DM2 vary in practical use according to the degradation in characteristics caused by the hot electrons (HE) injected into the floating gates of the non-volatile memory element. The voltage differential between DM1, DM2 is amplified by the differential amplifier circuit 370, which makes it possible to monitor the amount of hot electrons (HE) injected into the floating gates.

Differential Amplifier Type Cell

Figure 39:
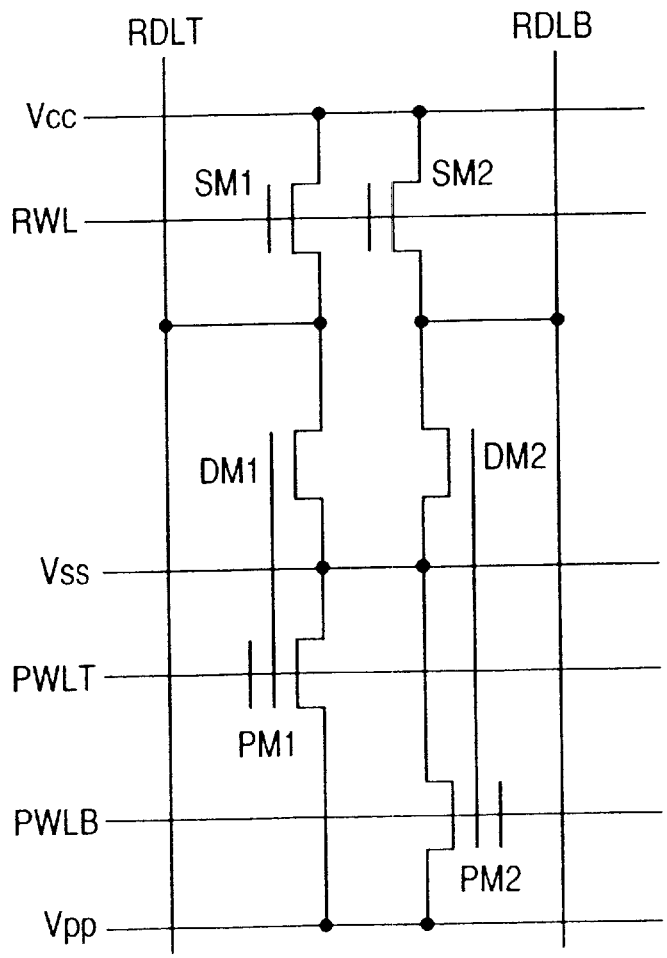
FIG. 39 is an equivalent circuit diagram illustrating a differential amplification type flash memory cell which is still another example of a non-volatile information memory cell included by a semiconductor integrated circuit in accordance with the present invention.
Figure 40:
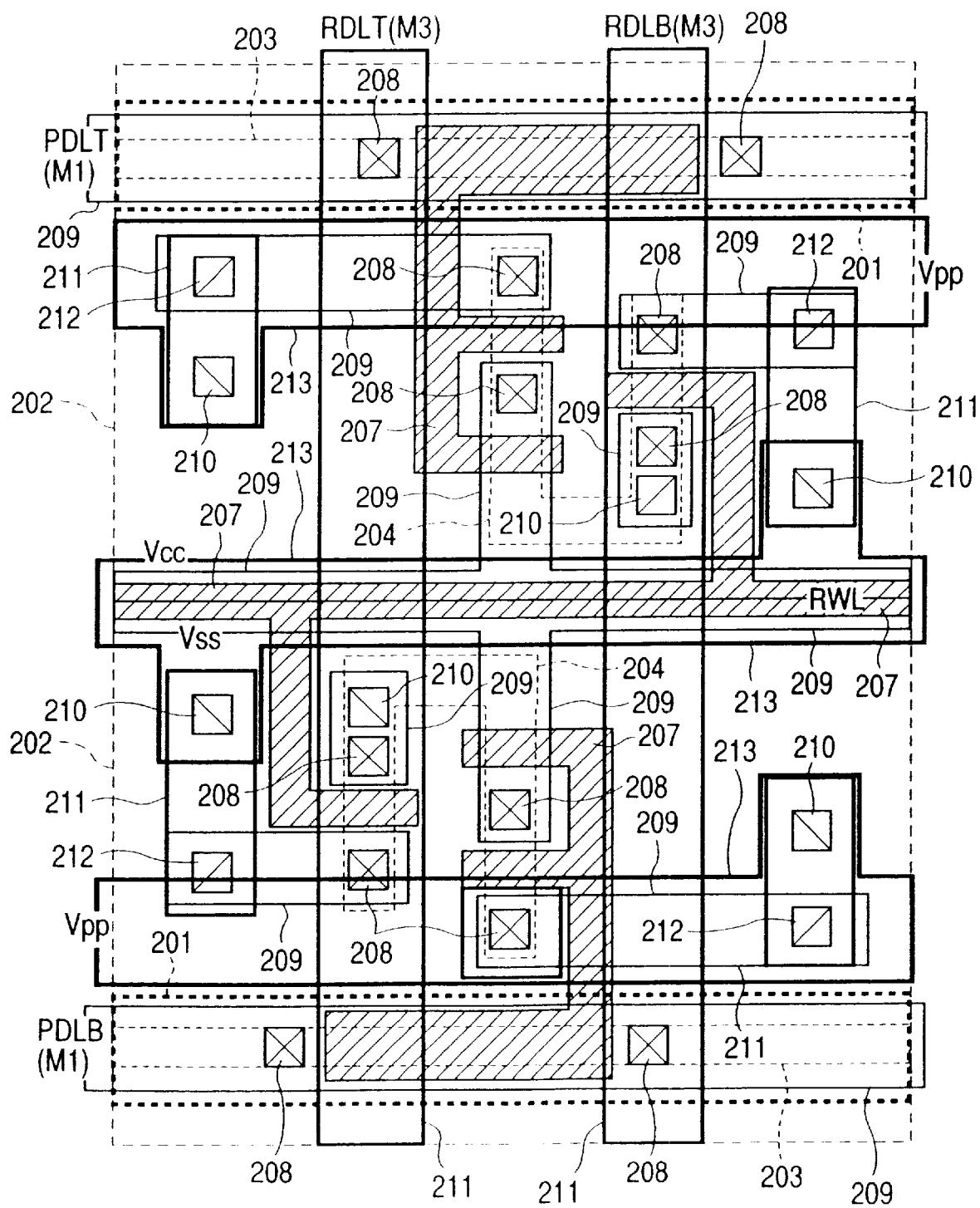
FIG. 40 is a plan view of the layout of the flash cell in FIG. 39.

In FIG. 39, there is illustrated an equivalent circuit diagram of a differential amplifier type flash cell, which is still another example of a non-volatile information memory cell formed as a semiconductor integrated circuit in accordance with the present invention. The information memory cell shown in the drawing is constituted in such a way that the cell structures shown in FIG. 23 are provided on the inversion side and on the non-inversion side, respectively, and both of them are writable separately. That is, the information memory cell has a series circuit composed of a non-volatile memory element PM1, a read MIS transistor DM1 and a select MIS transistor SM1, and a series circuit composed of a non-volatile memory element PM2, a read MIS transistor DM2 and a select MIS transistor SM2, wherein the drain of the read MIS transistor DM1 is connected to one complementary read data line RDLT and the drain of the read MIS transistor DM2 is connected to the other complementary read data line RDLB and a write word line PWLT is connected to the control gate of the non-volatile memory element PM1 and a write word line PWLB is connected to the control gate of the non-volatile memory element PM2. One of the non-volatile memory elements PM1, PM2 is brought into a writing state and the other is brought into an erasing state to memorize information. Here, in FIG. 40, there is illustrated the plane layout of the flash cell shown in FIG. 39.

Fuse Module with Built-in ECC

Figure 41:
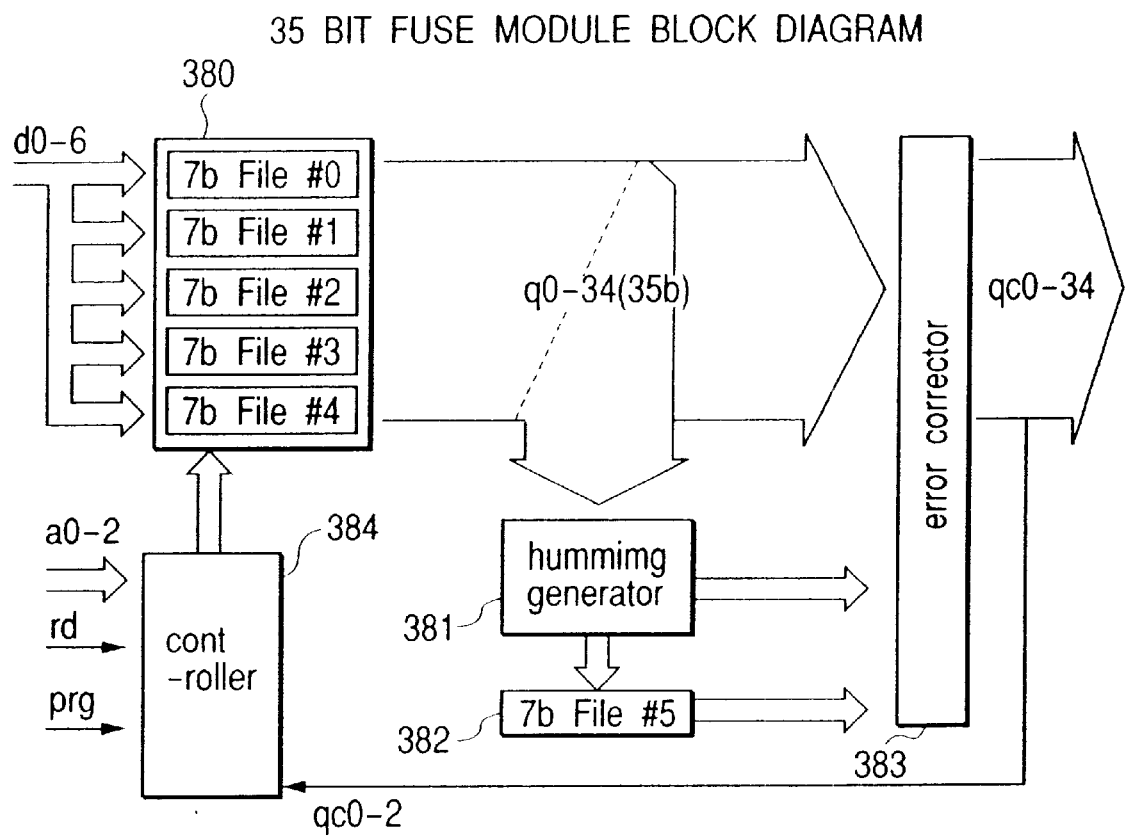
FIG. 41 is a block diagram of a fuse module which is still another example of an integrated circuit in accordance with the present invention.

In FIG. 41, there is illustrated the block diagram of a fuse module which is still another example of a semiconductor integrated circuit in accordance with the present invention. The fuse module shown in the drawing has a non-volatile memory 380 including five non-volatile memory blocks (7b File#0–7b File#4) as a non-volatile information memory cell group; a Hamming code generator 381 for generating a Hamming code to the 35-bit data q0-34 outputted by the non-volatile memory 380; a non-volatile memory 382 including a non-volatile memory block (7b File#5) for memorizing the Hamming code generated by the Hamming code generator 381; an error correction circuit 383 which can receive the Hamming code outputted by the non-volatile memory block 382 and the 35-bit data q0-34 outputted by the non-volatile memory 380 and make an error correction to the received data; and a control circuit 384. Write data into the non-volatile memory 380 is given as d0-6 from the outside. The output of the error correction circuit 383 is shown as qc 0-34. To the control circuit 384 are applied an address signal a0-2 for selecting the non-volatile memory blocks 7b File#0–7b File#4, a direction signal rd for the read operation, and a direction signal prg for the write operation.

Figure 48:
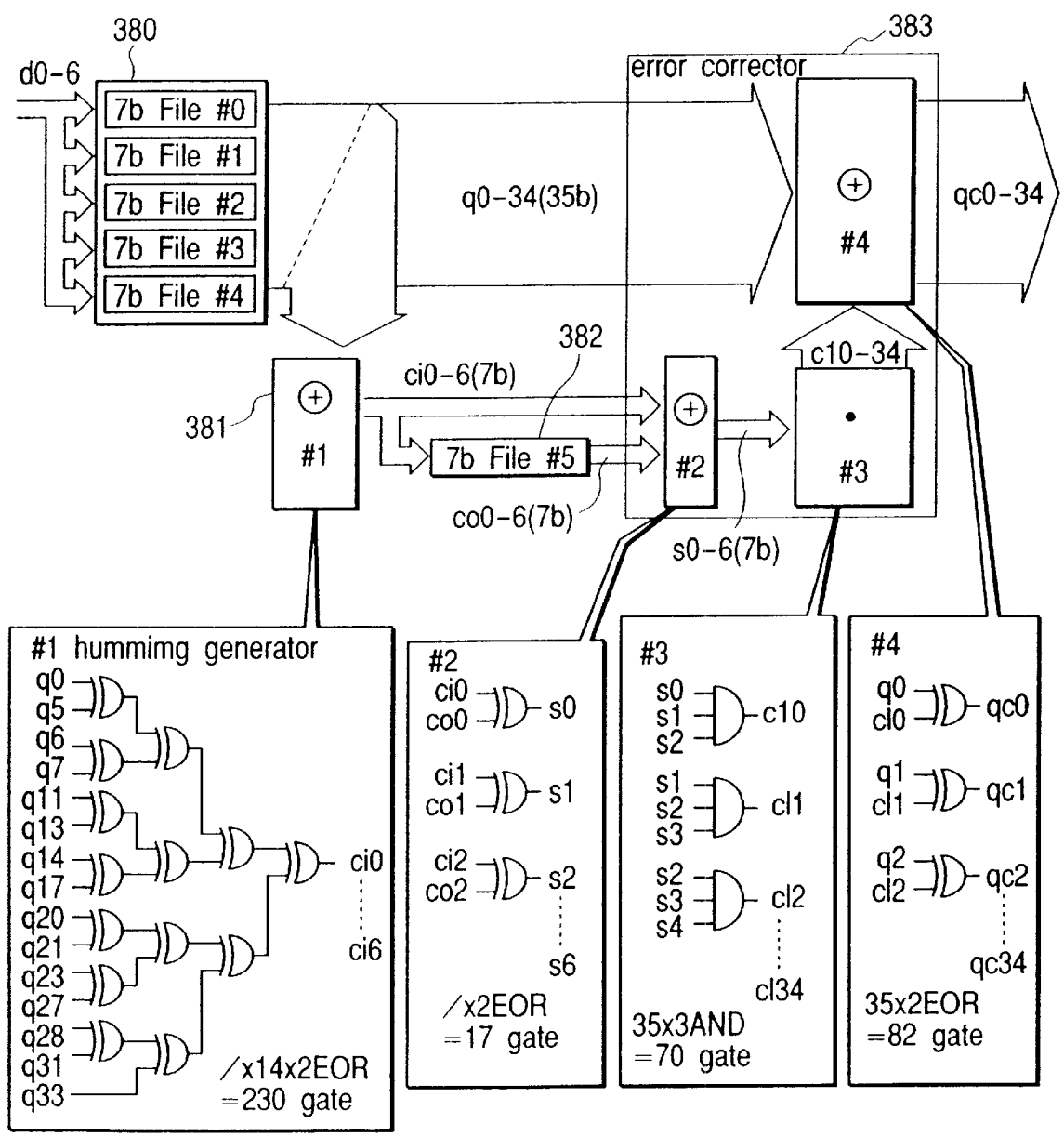
FIG. 48 is a logic circuit diagram illustrating one example of logic for generating a Hamming code by means of a Hamming generator.
Figure 49:
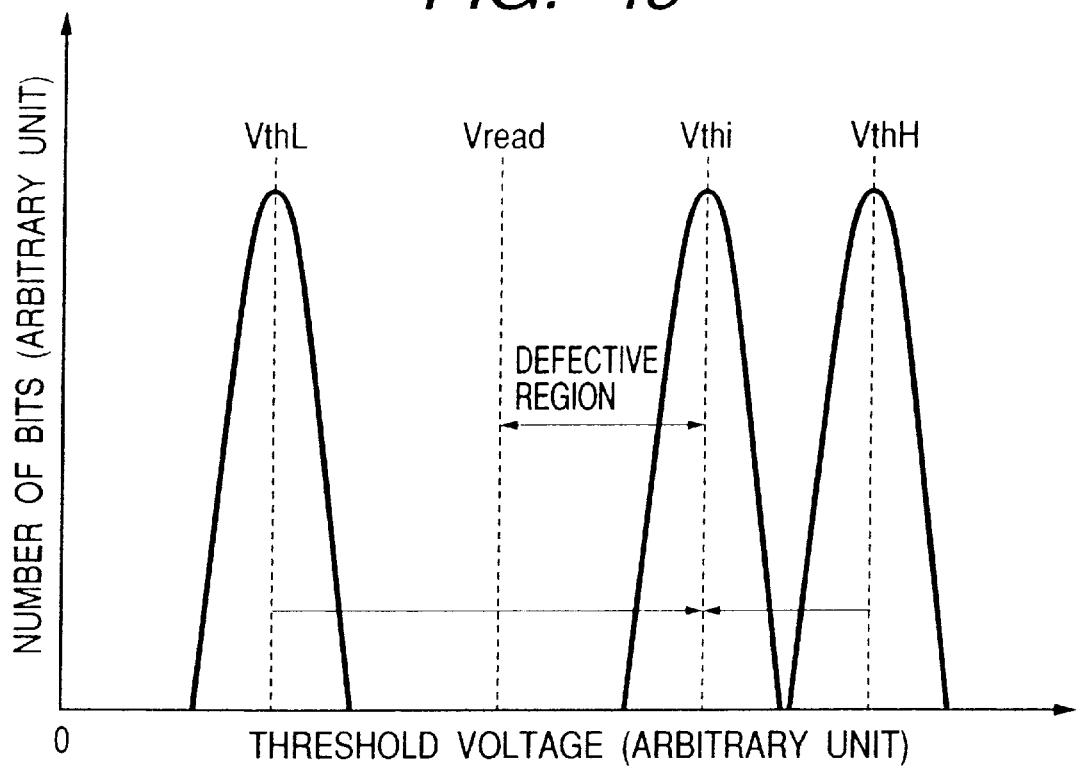
FIG. 49 is an illustration exemplifying the threshold voltage distribution of the non-volatile memory cell in the case where an initial threshold voltage (Vthi) is set at a relatively high value.
Figure 50:
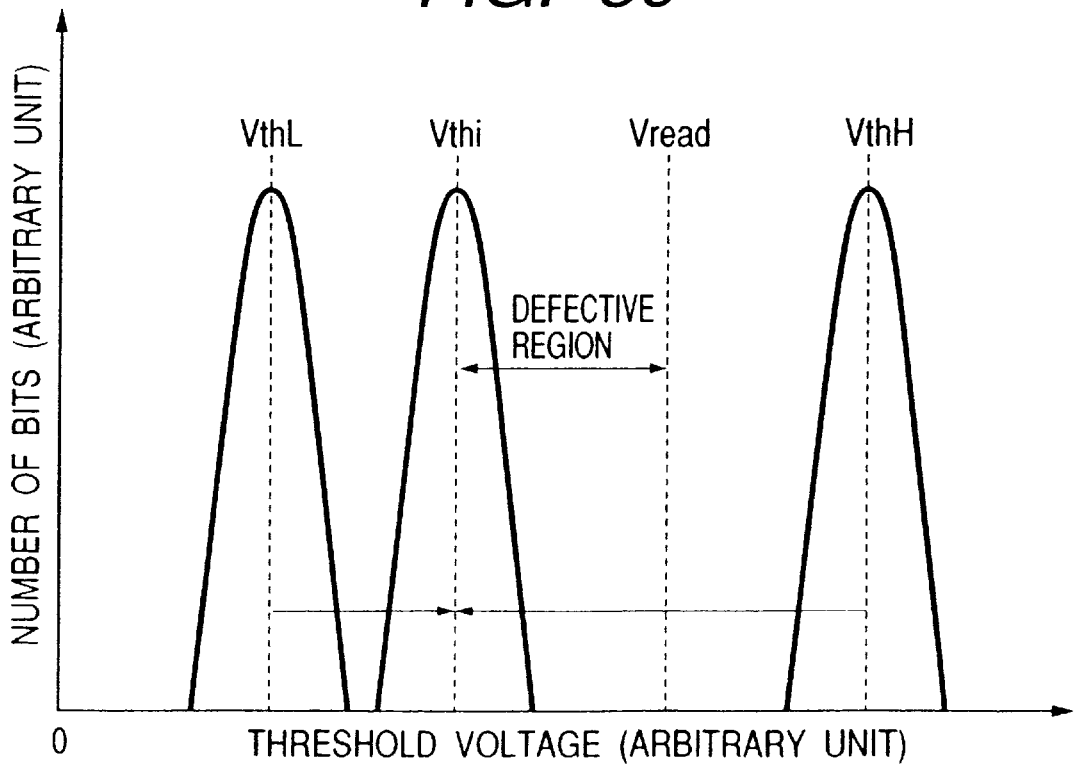
FIG. 50 is an illustration exemplifying the threshold voltage distribution of the non-volatile memory cell in the case where an initial threshold voltage (Vthi) is set at a relatively low value.

In FIG. 48, there is illustrated one example of logic for generating a Hamming code by the above-mentioned Hamming code generator 381 and one example of error detection and correction logic used by the above-mentioned error correction circuit 383.

Figure 42:
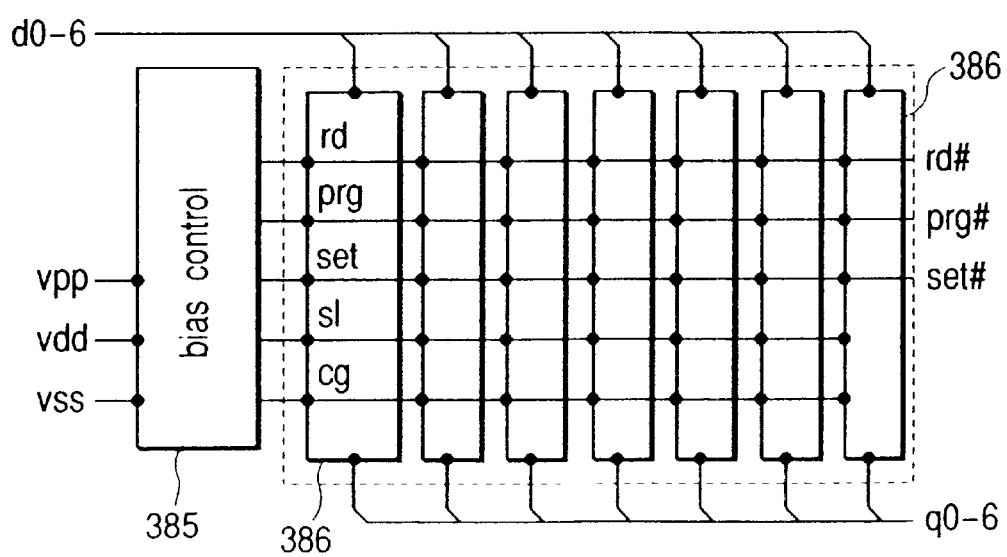
FIG. 42 is a circuit diagram illustrating an example of a non-volatile memory block.

In FIG. 42, there is illustrated an example of non-volatile memory blocks 7b File#0-7b File#5. Each of the non-volatile memory blocks has 7 bits of unit information cells 386 which are constituted equally to each other. The unit information cells 386 are controlled by a bias controller 385. The bias controller 385 produces control signals rd, prg, set, sl, and cg to the unit information cells 386 based on the direction from the control circuit 384.

Figure 44:
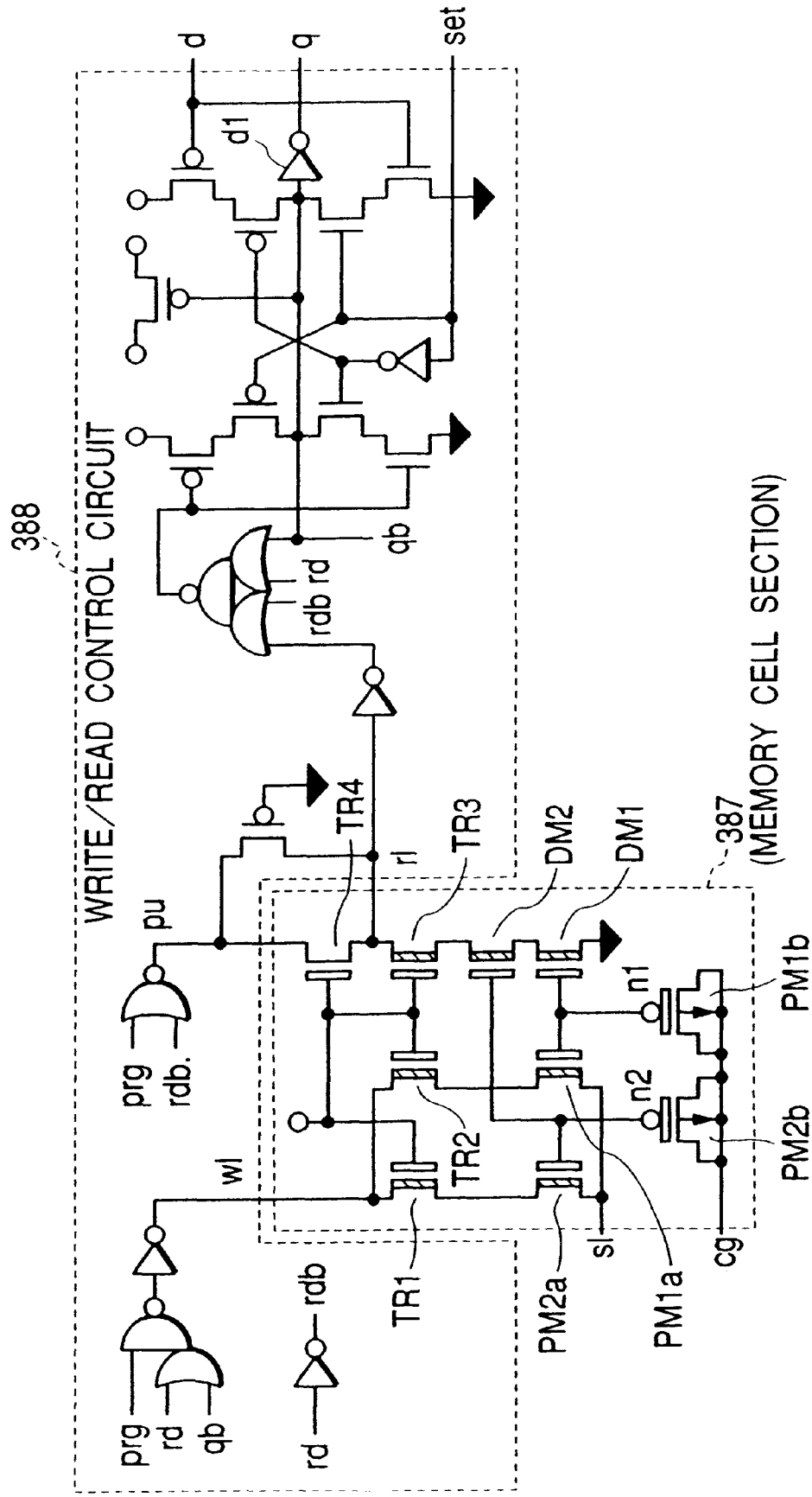
FIG. 44 is a circuit diagram illustrating one example of a unit information cell.

In FIG. 44, there is illustrated one example of the unit information cell 386. The unit information cell 386 is composed of a memory cell section 387 and a write/read control circuit 388.

The memory cell 387 includes a non-volatile memory element PM1 which is composed of a MIS capacitor element PM1b and a MIS transistor PM1a and a non-volatile memory element PM2 which is composed of a MIS capacitor element PM2b and a MIS transistor PM2a, as is the case shown in FIG. 54.

Figure 51:
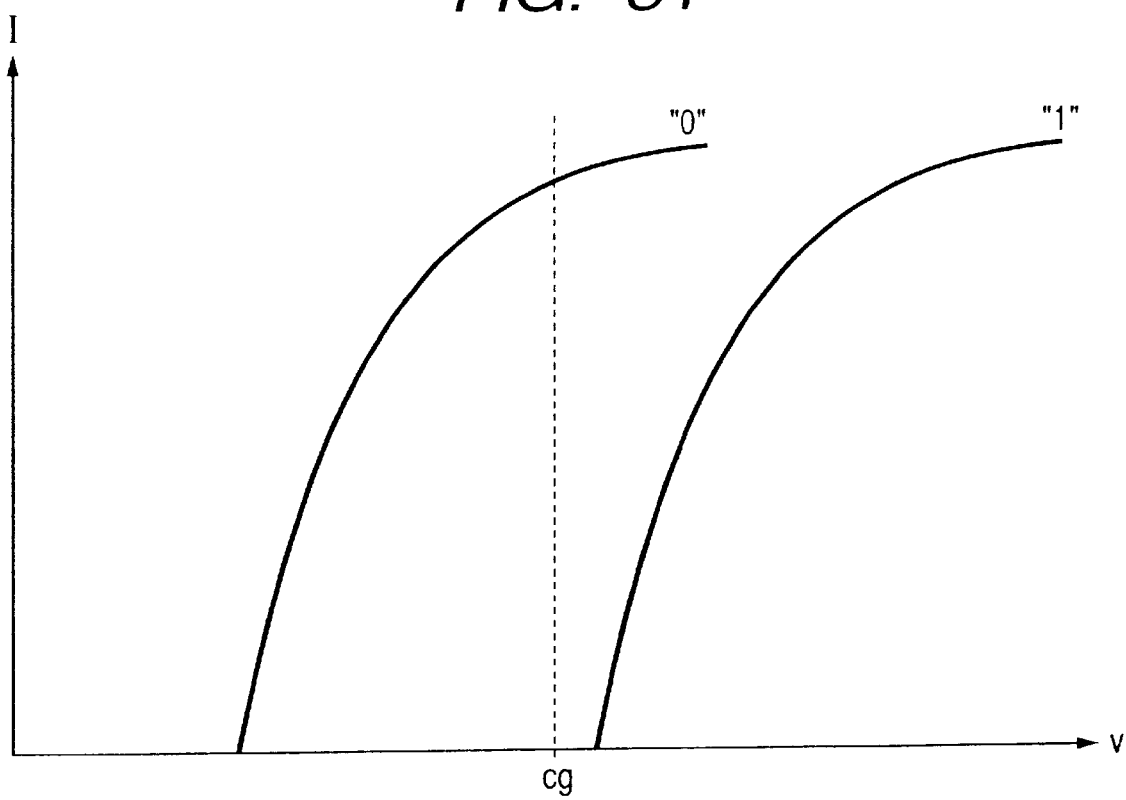
FIG. 51 is a voltage-current characteristic plot of a read MIS transistor constituted by a non-volatile enhancement type memory cell.

In the constitution in FIG. 44, read MIS transistors DM1, DM2 are composed of enhancement type transistors. The voltage-current characteristics of the MIS transistors DM1, DM2 are shown in FIG. 51. The voltage-current characteristics to a control gate voltage cg are different between the writing state and the erasing state of the non-volatile memory cell corresponding thereto. A reference numeral "1" designates the writing state and "0" designates the erasing state.

The drain of the read MIS transistor DM2 is connected to a control node pu via n-channel type MIS transistors TR3, TR4 and the electric potential of a junction node of the transistors TR3 and TR4 is applied to a write/read control circuit 388 as an output rl. The above-mentioned MIS transistors PM1a, PM2a are connected to a control node wl via n-channel type MIS transistors TR1, TR2. The gate electrodes of the transistors TR1 to TR4 are biased by a power source voltage. A reference character cg corresponds to a control gate and sl corresponds to a source line.

Figure 46:
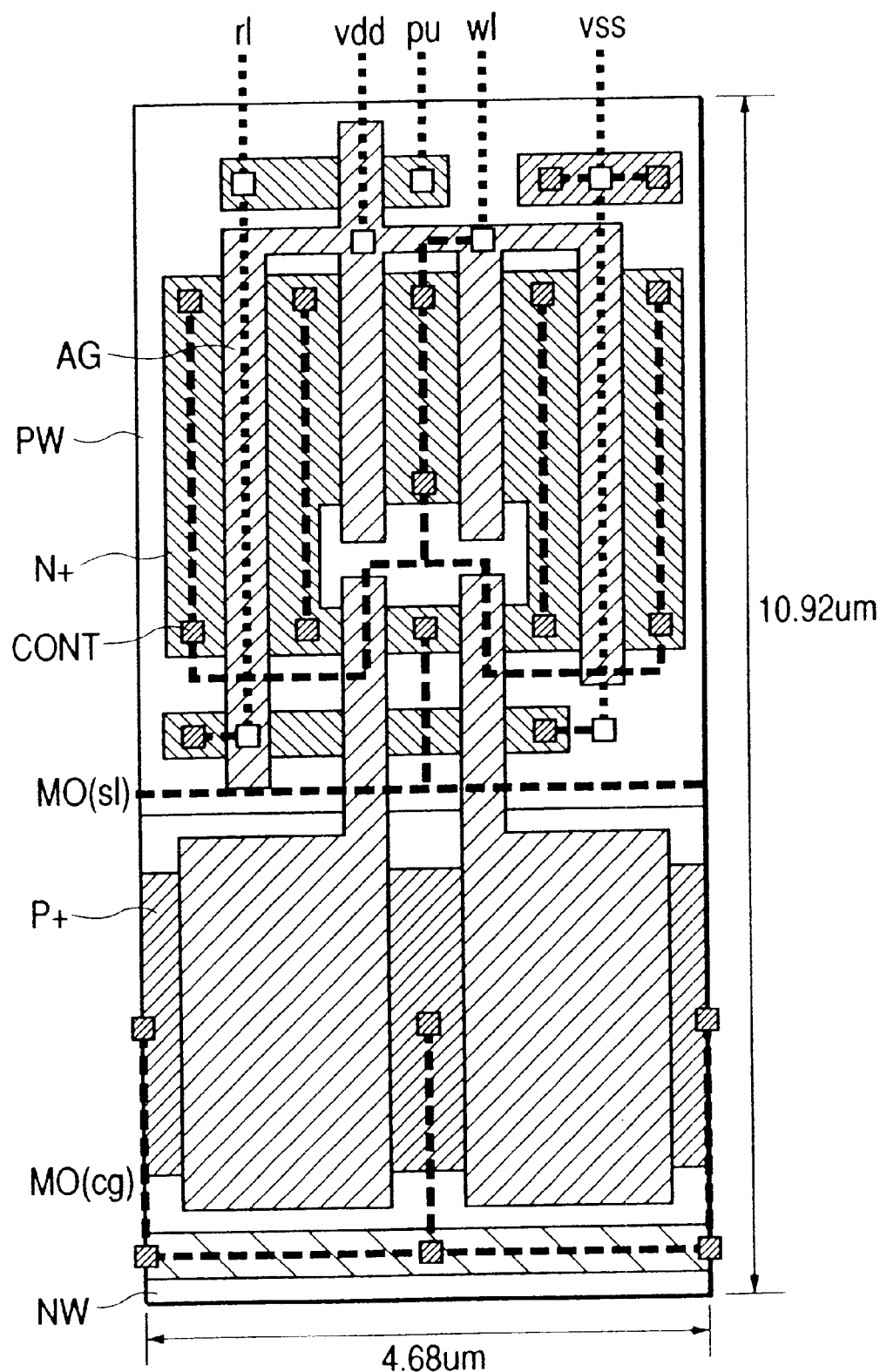
FIG. 46 is a plan view to illustrate a layout pattern of a memory cell section.

In FIG. 46, there is illustrated the layout pattern of the memory cell section 387. In FIG. 46, the memory cell section 387 is formed in a p-type well region PW and in an n-type well region NW. A reference character N+ designates an n-type diffusion region, which is formed in the p-type well region PW and is made the source electrode and the drain electrode of the n-channel MIS transistor, and a reference character AG designates the gate electrodes of the TR1, TR2, and a reference character CONT designates a contact hole, and P+ designates a diffusion layer which is formed in the n-type well region NW and is made the control gate constituted by the PM1b, PM2b.

Figure 45:
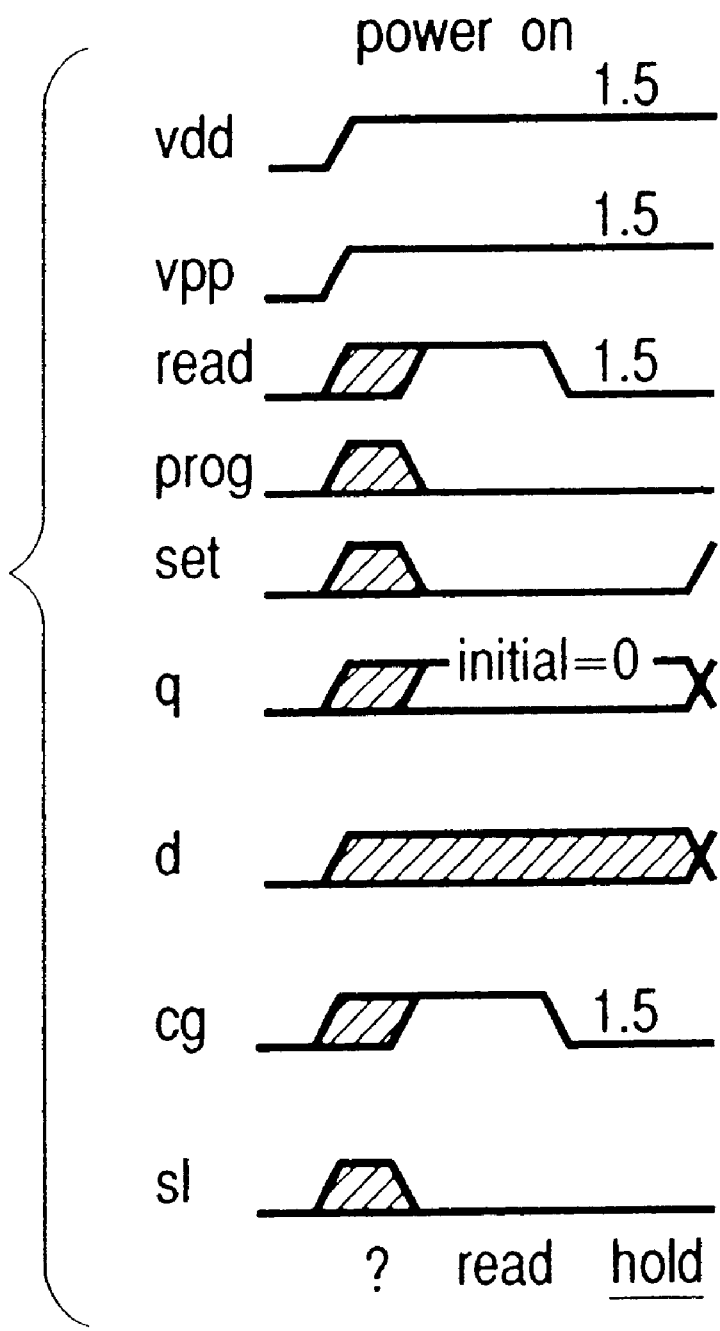
FIG. 45 is a read timing chart in the state where a fuse module is practically used after a program to a unit information cell is completed.
Figure 47:
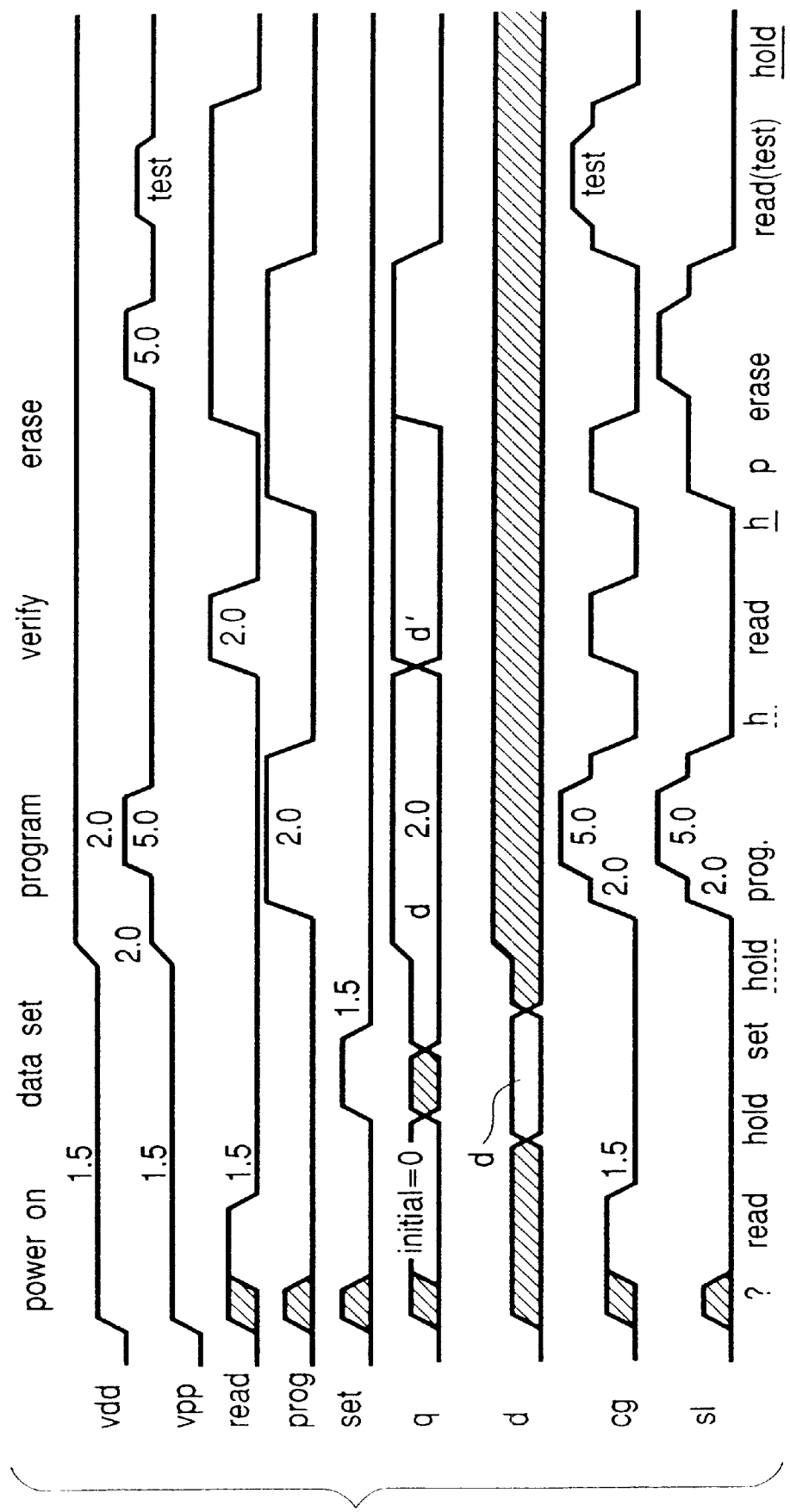
FIG. 47 is a timing chart of a program operation to a unit information cell according to the control embodiment in FIG. 43.

In FIG. 43, there is shown the control states of the unit information cells 386 produced by the above-mentioned bias controller 385. In FIG. 47, there is illustrated one example of a timing chart of a program operation to the unit information cell 386 according to the control state. In FIG. 45, there is shown a read timing chart in the state where a fuse module is practically used after the program is completed to the unit information cell 386.

Operations illustrated in these drawings will be summarized. In the write operation, terminals sl, cg are disposed at 5V and a terminal wl is disposed at 0V to turn on the non-volatile memory cells PM1, PM2 to inject hot electrons into the floating gate from the terminal sl side. In the erase operation, only the terminal sl is disposed at SV to emit electrons from the floating gate by tunnel emission. In the read operation, the terminal pu is disposed at 1.5V and the terminal cg is disposed at 1.5V to latch the electric potential of the terminal rl determined by the switching state or the mutual conductance state of the transistors DM1, DM2 according to the accumulated charges on the floating gate into a latch circuit at a later position. In the read operation, both of the source electrode (sl) and the drain electrode (wl) of the non-volatile memory elements PM1a, PM2a are disposed at 0V. Therefore, in the read operation, no weak hot electrons are injected into the floating gate from the transistors PM1a, PM2a. At this time, although weak hot electrons are going to be injected into the floating gate from the read MIS transistors DM1, DM2, since the TR4, TR3, DM2, DM1 are vertically stacked, the drain voltages of the read MIS transistors DM1, DM2 become smaller than pu and the control level of cg in the read operation is also low, so it can be concluded the injection of the hot electrons is substantially negligibly small. Accordingly, the rate of faulty reading of the non-volatile memory elements PM1, PM2 themselves is reduced.

Further, as described above, since the Hamming code generator 381, the non-volatile memory 382, and the error correction circuit 383 form an ECC circuit, granting that the data read from the non-volatile memory blocks 7bFile#0 to 7bFile#4 of the non-volatile memory 389 is faulty, they are automatically corrected and hence the rate of faulty reading can be reduced ultimately. In order to assure such an error correcting function by the ECC circuit, in the above-mentioned non-volatile memories 380, 382, a program circuit for writing into the non-volatile memory blocks 7bFile4O to 7bFile44, 7bFile#S has an operation mode of prohibiting writing into the non-volatile memory blocks 7bFile4O to 7bFile#4, 7bFile#5 when the ECC circuit is effectively operated. For example, although not shown, a 1-bit non-volatile flag for indicating whether the write operation is completed or is not yet completed is provided on the non-volatile memory 380, and when the non-volatile flag is set by the controller 384, the above-mentioned operation mode of prohibiting writing is directed to the above-mentioned program circuit.

Up to this point, while the invention made by the present inventor has been described specifically based on the preferred embodiments, it is not intended that the present invention be limited to the preferred embodiments, but it should be understood that various changes, substitutions and alterations can be made therein without departing from the spirit and scope of the invention as defined by the appended claims.

For example, the above-mentioned non-volatile memory element can be applied widely to a non-volatile memory element and the like for constituting a programmable logic in addition to the one for storing recovery information in a recovery circuit.

Effects produced by the typical aspects and features of the invention disclosed in the present application will be described briefly in the following.

That is, it is possible to improve a long-term information holding performance by means of a memory cell using a non-volatile memory element. It is possible to remarkably reduce the rate of faulty reading without adding an absolutely new process to an ordinary logic circuit process or a general-purpose DRAM process. It is possible to provide a technology for utilizing a flash memory cell composed of a single layer polysilicon gate as a memory module formed in a semiconductor device or the recovery circuit of a memory circuit.

It is possible to provide a semiconductor integrated circuit like a system LSI mounted with a non-volatile memory having an excellent data holding performance, as described above, a DRAM and the like, by employing a single gate process like a single layer polysilicon gate process. Further, it is easy to apply the non-volatile memory element to an LSI in which a non-volatile memory and a logic LSI, or a non-volatile memory and a DRAM are mounted on the same semiconductor substrate because a highly reliable non-volatile memory can be formed without adding any process to a conventional standard CMOS manufacturing process. Therefore, it is possible to provide a system LSI mounted with flash memories without increasing the manufacturing cost.

What is claimed is:

1. A semiconductor device comprising:
    a non-volatile memory element including a first source electrode, a first drain electrode, a floating gate electrode and a control gate electrode, and capable of having different threshold voltages;
    a read transistor element including a second source electrode, a second drain electrode and the floating gate electrode as a gate electrode, and capable of having different threshold voltages according to the threshold voltage of the non-volatile memory element; and
    transmission circuit of a signal generated according to the threshold voltage of the read transistor element.

2. A semiconductor device according to claim 1, wherein the ground voltage of a circuit is applied to the first source electrode and the first drain electrode in a read operation.

3. A semiconductor device according to claim 1, wherein the read transistor element is a depression type MIS transistor and the control gate electrode is set at a non-select level in a read operation.

4. A semiconductor device according to claim 1, wherein the read transistor element is an enhancement type MIS transistor and the control gate electrode is set at a select level in a read operation.

5. A semiconductor device according to claim 1, wherein the non-volatile memory element includes a MIS capacitor element having a capacitor electrode on a first semiconductor region functioning as a control gate electrode via an insulating layer and a MIS transistor including a first source electrode, a first drain electrode and a gate electrode which are formed on a second semiconductor region, the capacitor electrode being connected to the gate electrode and functioning as a floating gate electrode.

6. A semiconductor device according to claim 1, wherein the non-volatile memory element includes;
    a first conductivity type first well region formed on a semiconductor substrate; a second conductivity type second well region formed on the semiconductor substrate;
    a second conductivity type first source electrode region which is formed on the first well region and is to be connected to a first signal line;
    a second conductivity type first drain electrode region which is formed on the first well region and is to be connected to a second signal line;
    a first insulating film formed on the principal surface of the first well region at the position between the first source electrode region and the first drain electrode region;
    a second insulating film formed on the principal surface of the second well region;
    a floating gate electrode region formed on the first and second insulating films; and
    a control gate electrode region which is formed on the second well region and is to be connected to a third signal line.

7. A semiconductor device according to claim 1, wherein the non-volatile memory element is provided in a pair and the read transistor element is provided in a pair, wherein the floating gate electrode of one of the non-volatile memory elements is shared by one of the read transistor elements and the floating gate electrode of the other non-volatile memory element is shared by the other read transistor element, and wherein the pair of read transistor elements are connected in parallel to the transmission means.

8. A semiconductor device according to claim 1, wherein the non-volatile memory element is provided in a pair and the read transistor element is provided in a pair, wherein the floating gate electrode of one of the non-volatile memory elements is shared by one of the read transistor elements and the floating gate electrode of the other non-volatile memory element is shared by the other read transistor element, and wherein the pair of read transistor elements are connected in series to the transmission means.

9. A semiconductor device according to claim 8, further comprising a plurality of unit information cells, each of which is composed of the pair of non-volatile memory elements and the pair of read transistor elements, and an electric program circuit to the non-volatile memory elements of the plurality of unit information cells, wherein the plurality of unit information cells are made the memory circuit of recovery information to a circuit to be recovered.

10. A semiconductor device according to claim 8, further comprising a fuse program circuit for memorizing recovery information according to the melting state of a fuse element as another recovery information memory circuit to the circuit to be recovered.

11. A semiconductor device according to claim 8, wherein the circuit to be recovered is the memory cell array in which a DRAM is built.

12. A semiconductor device according to claim 8, wherein the circuit to be recovered is the memory cell array of a DRAM in which a microcomputer is built.

13. A semiconductor device according to claim 8, wherein the circuit to be recovered is the memory cell array of an SRAM in which a microcomputer is built.

14. A semiconductor device according to claim 13, wherein the electric program circuit has an operation mode of prohibiting writing into the unit information cell, when an ECC circuit is effective.

15. A semiconductor device according to claim 1, further comprising a plurality of unit information cells each of which is composed of the pair of non-volatile memory cells and the pair of read transistor elements, wherein a part of the plurality of unit information cells are made a region for holding an error correction code to the memory information of the remaining unit information cells, an electric program circuit to the non-volatile memory elements of the plurality of unit information cells, and an ECC circuit capable of making an error correction to the read information of the plurality of unit information cells.

* * * * *